(12) United States Patent
Liu et al.

(10) Patent No.: US 8,912,083 B2
(45) Date of Patent: Dec. 16, 2014

(54) SILICON SUBSTRATES WITH DOPED SURFACE CONTACTS FORMED FROM DOPED SILICON INKS AND CORRESPONDING PROCESSES

(75) Inventors: Guojun Liu, San Jose, CA (US); Uma Srinivasan, Mountain View, CA (US); Shivkumar Chiruvolu, San Jose, CA (US)

(73) Assignee: NanoGram Corporation, Milpitas, CA (US)

( * ) Notice: Subject to any disclaimer, the term of this patent is extended or adjusted under 35 U.S.C. 154(b) by 0 days.

(21) Appl. No.: 13/113,287

(22) Filed: May 23, 2011

(65) Prior Publication Data
US 2012/0193769 A1 Aug. 2, 2012

Related U.S. Application Data

(60) Provisional application No. 61/438,064, filed on Jan. 31, 2011.

(51) Int. Cl.
| | |
|---|---|
| H01L 21/22 | (2006.01) |
| H01L 21/38 | (2006.01) |
| H01L 21/02 | (2006.01) |
| H01L 21/225 | (2006.01) |
| H01L 21/228 | (2006.01) |
| B82Y 30/00 | (2011.01) |
| H01L 31/068 | (2012.01) |
| H01L 31/18 | (2006.01) |

(52) U.S. Cl.
CPC ........ *H01L 21/2252* (2013.01); *H01L 21/2225* (2013.01); *H01L 21/228* (2013.01); *B82Y 30/00* (2013.01); *H01L 31/068* (2013.01); *H01L 31/0682* (2013.01); *H01L 31/1804* (2013.01); *Y02E 10/52* (2013.01); *Y02E 10/547* (2013.01)

USPC ........... 438/559; 438/542; 438/558; 438/563; 438/564; 257/655; 257/E21.135; 257/E21.144

(58) Field of Classification Search
USPC ........... 257/655, E21.135, E21.144, E21.155; 438/502, 558, 542, 559, 563, 564, 550
See application file for complete search history.

(56) References Cited

U.S. PATENT DOCUMENTS

| | | | |
|---|---|---|---|
| 4,045,245 | A | 8/1977 | Coleman |
| 4,133,698 | A | 1/1979 | Chiang et al. |

(Continued)

FOREIGN PATENT DOCUMENTS

| | | |
|---|---|---|
| JP | 6206684 | 3/1987 |
| JP | 2001-093849 | 4/2001 |

(Continued)

OTHER PUBLICATIONS

Kluska et al.,"Loss analysis of High Efficiency Back-Contact Back-Junction silicon solar Cells," 23rd European Photovoltaic Solar energy Conference and Exhibition, 1-5 (2008).

(Continued)

*Primary Examiner* — Fernando L Toledo
*Assistant Examiner* — Aaron Gray
(74) *Attorney, Agent, or Firm* — Dardi & Herbert, PLLC; Peter S. Dardi

(57) ABSTRACT

The use of doped silicon nanoparticle inks and other liquid dopant sources can provide suitable dopant sources for driving dopant elements into a crystalline silicon substrate using a thermal process if a suitable cap is provided. Suitable caps include, for example, a capping slab, a cover that may or may not rest on the surface of the substrate and a cover layer. Desirable dopant profiled can be achieved. The doped nanoparticles can be delivered using a silicon ink. The residual silicon ink can be removed after the dopant drive-in or at least partially densified into a silicon material that is incorporated into the product device. The silicon doping is suitable for the introduction of dopants into crystalline silicon for the formation of solar cells.

20 Claims, 30 Drawing Sheets

(56) References Cited

U.S. PATENT DOCUMENTS

| | | | |
|---|---|---|---|
| 4,147,563 A | 4/1979 | Narayan et al. | |
| 4,227,942 A | 10/1980 | Hall | |
| 4,315,097 A | 2/1982 | Solomon | |
| 4,478,879 A | 10/1984 | Baraona et al. | |
| 4,518,349 A * | 5/1985 | Tressler et al. | 432/11 |
| 4,667,060 A | 5/1987 | Spitzer | |
| 4,703,553 A | 11/1987 | Mardesich | |
| 4,783,421 A | 11/1988 | Carlson et al. | |
| 4,927,770 A | 5/1990 | Swanson | |
| 5,011,565 A | 4/1991 | Dube et al. | |
| 5,011,794 A * | 4/1991 | Grim et al. | 438/796 |
| 5,082,791 A | 1/1992 | Micheels et al. | |
| 5,096,505 A | 3/1992 | Fraas et al. | |
| 5,302,198 A | 4/1994 | Allman | |
| 5,330,584 A | 7/1994 | Saga et al. | |
| 5,487,852 A | 1/1996 | Ludden et al. | |
| 5,538,564 A | 7/1996 | Kaschmitter | |
| 5,580,395 A | 12/1996 | Yoshioka et al. | |
| 5,641,362 A | 6/1997 | Meier | |
| 5,801,108 A | 9/1998 | Huang et al. | |
| 5,814,238 A | 9/1998 | Ashby et al. | |
| 5,956,572 A | 9/1999 | Kidoguchi et al. | |
| 5,973,260 A | 10/1999 | Tange et al. | |
| 6,034,321 A | 3/2000 | Jenkins | |
| 6,093,882 A | 7/2000 | Arimoto | |
| 6,180,869 B1 | 1/2001 | Meier et al. | |
| 6,337,283 B1 | 1/2002 | Verlinden et al. | |
| 6,387,726 B1 | 5/2002 | Verlinden et al. | |
| 6,423,568 B1 | 7/2002 | Verlinden et al. | |
| 6,429,037 B1 | 8/2002 | Wenham et al. | |
| 6,455,347 B1 | 9/2002 | Hiraishi et al. | |
| 6,495,468 B2 | 12/2002 | Sandhu et al. | |
| 6,552,259 B1 | 4/2003 | Hosomi et al. | |
| 6,552,414 B1 | 4/2003 | Horzel et al. | |
| 6,674,086 B2 | 1/2004 | Kamada et al. | |
| 6,695,903 B1 | 2/2004 | Kübelbeck et al. | |
| 6,788,866 B2 | 9/2004 | Bryan | |
| 6,825,104 B2 * | 11/2004 | Horzel et al. | 438/547 |
| 6,846,696 B2 | 1/2005 | Adachi et al. | |
| 6,849,334 B2 | 2/2005 | Home et al. | |
| 6,919,530 B2 | 7/2005 | Borgeson et al. | |
| 6,921,893 B1 | 7/2005 | Petschik et al. | |
| 6,927,417 B2 | 8/2005 | Nagashima et al. | |
| 6,982,218 B2 | 1/2006 | Preu et al. | |
| 6,998,288 B1 | 2/2006 | Smith et al. | |
| 7,135,350 B1 | 11/2006 | Smith et al. | |
| 7,196,018 B2 | 3/2007 | Szlufcik et al. | |
| 7,217,883 B2 | 5/2007 | Munzer | |
| 7,270,886 B2 | 9/2007 | Lee et al. | |
| RE39,988 E | 1/2008 | Wickboldt et al. | |
| 7,339,110 B1 | 3/2008 | Mulligan et al. | |
| 7,365,004 B2 | 4/2008 | Adachi et al. | |
| 7,384,680 B2 | 6/2008 | Bi et al. | |
| 7,388,147 B2 | 6/2008 | Mulligan et al. | |
| 7,414,379 B2 | 8/2008 | Oks | |
| 7,435,668 B2 | 10/2008 | Machida et al. | |
| 7,468,485 B1 | 12/2008 | Swanson | |
| 7,473,443 B2 | 1/2009 | Matsuki et al. | |
| 7,491,431 B2 | 2/2009 | Chiruvolu | |
| 7,521,340 B2 | 4/2009 | Lemmi et al. | |
| 7,554,031 B2 | 6/2009 | Swanson et al. | |
| 7,572,740 B2 | 8/2009 | Terry et al. | |
| 7,575,784 B1 | 8/2009 | Bi et al. | |
| 7,615,393 B1 * | 11/2009 | Shah et al. | 438/48 |
| 7,651,768 B2 | 1/2010 | Richardson et al. | |
| 7,704,866 B2 | 4/2010 | Vanheusden et al. | |
| 7,718,707 B2 | 5/2010 | Kelman et al. | |
| 7,776,724 B2 | 8/2010 | Lemmi et al. | |
| 7,851,336 B2 | 12/2010 | Poplavskyy et al. | |
| 7,910,393 B2 | 3/2011 | Kim et al. | |
| 7,923,368 B2 | 4/2011 | Terry et al. | |
| 7,998,359 B2 | 8/2011 | Rogojina et al. | |
| 8,048,814 B2 | 11/2011 | Meisel et al. | |
| 8,139,070 B1 | 3/2012 | Ostiguy et al. | |
| 8,148,176 B2 | 4/2012 | Kelman et al. | |
| 8,163,587 B2 | 4/2012 | Scardera et al. | |
| 2002/0157418 A1 * | 10/2002 | Ganguli et al. | 65/17.2 |
| 2003/0228415 A1 | 12/2003 | Bi et al. | |
| 2004/0063326 A1 | 4/2004 | Szlufcik et al. | |
| 2004/0097062 A1 | 5/2004 | Preu et al. | |
| 2004/0224537 A1 * | 11/2004 | Lee et al. | 438/782 |
| 2004/0242019 A1 | 12/2004 | Klein et al. | |
| 2004/0261840 A1 | 12/2004 | Schmit et al. | |
| 2005/0008880 A1 | 1/2005 | Kunze et al. | |
| 2005/0181566 A1 | 8/2005 | Machida et al. | |
| 2006/0094189 A1 | 5/2006 | Zurcher et al. | |
| 2006/0134347 A1 | 6/2006 | Chiruvolu et al. | |
| 2006/0237719 A1 | 10/2006 | Colfer et al. | |
| 2007/0137699 A1 | 6/2007 | Manivannan et al. | |
| 2007/0151598 A1 | 7/2007 | De Ceuster et al. | |
| 2007/0212510 A1 | 9/2007 | Hieslmair et al. | |
| 2008/0138966 A1 | 6/2008 | Rogojina et al. | |
| 2008/0160265 A1 | 7/2008 | Hieslmair et al. | |
| 2008/0160733 A1 | 7/2008 | Hieslmair et al. | |
| 2008/0173347 A1 | 7/2008 | Korevaar et al. | |
| 2008/0202576 A1 | 8/2008 | Hieslmair | |
| 2008/0202577 A1 | 8/2008 | Hieslmair | |
| 2008/0210301 A1 | 9/2008 | Mulligan et al. | |
| 2008/0216886 A1 | 9/2008 | Iwakura | |
| 2008/0223437 A1 | 9/2008 | De Ceuster | |
| 2008/0251121 A1 | 10/2008 | Stone | |
| 2008/0299297 A1 | 12/2008 | Cousins et al. | |
| 2008/0305619 A1 | 12/2008 | Lemmi et al. | |
| 2009/0014423 A1 | 1/2009 | Li et al. | |
| 2009/0017292 A1 | 1/2009 | Hieslmair et al. | |
| 2009/0025787 A1 | 1/2009 | Gabor | |
| 2009/0151784 A1 | 6/2009 | Luan et al. | |
| 2009/0191348 A1 * | 7/2009 | Hieslmair et al. | 427/398.1 |
| 2009/0239330 A1 * | 9/2009 | Vanheusden et al. | 438/98 |
| 2009/0269487 A1 | 10/2009 | Es-Souni | |
| 2009/0269913 A1 * | 10/2009 | Terry et al. | 438/558 |
| 2010/0035422 A1 * | 2/2010 | Leung et al. | 438/558 |
| 2010/0167510 A1 | 7/2010 | Kelman et al. | |
| 2010/0216299 A1 | 8/2010 | Poplavskyy et al. | |
| 2010/0221903 A1 | 9/2010 | Poplavskyy et al. | |
| 2010/0267194 A1 | 10/2010 | Aleman et al. | |
| 2010/0275990 A1 | 11/2010 | Shimomura et al. | |
| 2010/0294352 A1 | 11/2010 | Srinivasan et al. | |
| 2011/0003464 A1 * | 1/2011 | Scardera et al. | 438/542 |
| 2011/0003465 A1 | 1/2011 | Scardera et al. | |
| 2011/0003466 A1 | 1/2011 | Scardera et al. | |
| 2011/0053352 A1 | 3/2011 | Poplavskyy et al. | |
| 2011/0120530 A1 | 5/2011 | Isaka | |
| 2011/0183504 A1 | 7/2011 | Scardera et al. | |
| 2011/0318905 A1 | 12/2011 | Chiruvolu et al. | |
| 2012/0009721 A1 | 1/2012 | Abbott et al. | |

FOREIGN PATENT DOCUMENTS

| | | |
|---|---|---|
| JP | 2004-221188 | 5/2002 |
| JP | 2005-506705 | 3/2005 |
| JP | 2005-510885 | 4/2005 |
| JP | 2005-340362 | 8/2005 |
| JP | 2005-260040 | 9/2005 |
| JP | 2005-322780 | 11/2005 |
| JP | 2006-173381 | 6/2006 |
| JP | 2006-294802 | 10/2006 |
| JP | 2009-206375 | 9/2009 |
| JP | 2006-173381 | 6/2012 |
| KR | 10-2005-0081174 | 8/2005 |
| WO | WO 83/02200 | 6/1983 |
| WO | WO 02/32588 | 4/2002 |
| WO | 2006/096247 | 9/2006 |
| WO | 2007/004501 | 1/2007 |
| WO | 2007/081510 | 7/2007 |
| WO | 2007/117153 | 10/2007 |
| WO | 2008/039078 | 4/2008 |
| WO | 2008/065918 | 6/2008 |
| WO | 2009/017420 | 2/2009 |
| WO | 2009/025147 | 2/2009 |
| WO | 2009/028974 | 3/2009 |

(56) References Cited

FOREIGN PATENT DOCUMENTS

| WO | 2009/131587 | 10/2009 |
|---|---|---|
| WO | 2010/050936 | 5/2010 |
| WO | 2012/012166 | 1/2012 |

OTHER PUBLICATIONS

Bruton et al., "Prospects for high efficiency silicon solar cells in thin czochralski waffers using industrial processes," Photovoltaics Specialists Conference, 2008. Conference Record of the Twenty-Eighth IEEE.

Cotter et al., "Novel Processes for Simplified Buried Contact Solar Cells", Conference Record of the 28th IEEE Photovoltaics Specialists Conference, Sep. 15-22, 2000, pp. 303-306.

Coutanson et al., "Fabrication of p+/n ultra shallow junctions (USJ) in silicon by excimer laser doping from spin-on glass sources", Mat. Res. Soc. Symp. Proc., 810:C4.13.1-C4.13.6 (2004).

Deutsch et al., "Efficient Si solar cells by laser photochemical doping" Appl. Phys. Lett., 38(3):144-146 (Feb. 1, 1981).

Duerinckx, et al., "Simple and Efficient Screen Printing Process for Multicrystalline Silicon Solar Cells based on Firing through Silicon Nitride", 14th European Photovoltaic Solar Energy Conference, Jun. 30-Jul. 4, 1997, Barcelona, Spain, pp. 792-795.

Feldrapp et al., "Thin-film solar cells from layer transfer using porous silicon with 32.7 mA/cm2 short circuit current density", Progress in Photovoltaics. Mar. 2003, pp. 1-23.

Glunz et al., "Laser-Fired Contact Silicon Solar Cells on p- and n-Substrates", 19th European Photovoltaic Solar Energy Conference, Jun. 7-11, 2004, Paris, France, pp. 408-411.

Huljic̀ et al., "Development of a 21% back-contact monocrystalline silicon solar cell for large-scale production", Proceedings of the 21st EU PVSEC, Dresden 2006, 4 pages.

Kray et al., "Analysis of very thin high-efficiency solar cells". WPEC-3, Osaka, Japan, May 11-18, 2003.

Lasers in Solar Manufacturing, The Cutting-Edge of Green Solar Panel Production (brochure) by Coherent, Inc. (2008) 6 pages.

Preu et al, "A new low-cost approach for passivated rear contact formation in crystalline silicon solar cell technology", 16th European Photoltaic Solar Energy Conference, May 1-5, 2000, Glasgow, United Kingdom, pp. 1181-1184.

Schneiderlochner et al., "Investigations on Laser-fired contacts for passivated rear solar cells", Photovoltaic Specialists Conference, 2002. Conference Record of the Twenty-Ninth IEEE, pp. 300-303 (2002).

Wood et al., "Laser processing for high-efficiency silcon solar cells", Fourteenth IEEE Photovoltaic Specialists Conference 1980 (Jan. 7-10, 1980) (Abstract).

Young et al., "Laser processing for high-efficiency Si solar cells", J. Appl. Phys. 53(2):1178-1189 (Feb. 1982).

Zhao et al. " 21.5% Efficient 47-μm thin-layer silicon cell". Proceedings of the 13th European Photovoltaic Solar Energy Conference (1995).

International Search Report and Written Opinion from corresponding PCT Application No. PCT/US2012/022215 mailed Aug. 24, 2012 (10 pages).

Lammert et al., "The interdigitated back contact solar cell: s silicon solar cell for use in concentrated sunlight", IEEE Transactions on electron devices, vol. ED-24, No. 4, pp. 337-342, 1977.

Lammert et al., "The interdigitated back contact solar cell: a silicon solar cell for use in concentrated sunlight", IEEE Transactions on electron devices, vol. ED-24, No. 4, pp. 337-342, 1977.

Meier et al, "Self-doping contacts to silicon using silver coated with a dopant source [for solar cells]," Photovoltaic Specialists Conference 2000, Conference Record of the Twenty-Eighth IEEE , pp. 69-74, 2000.

\* cited by examiner

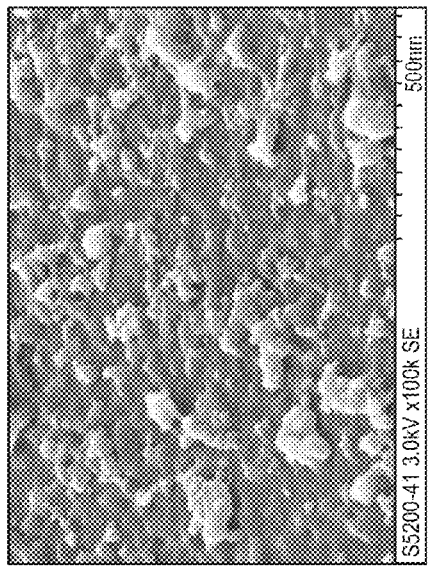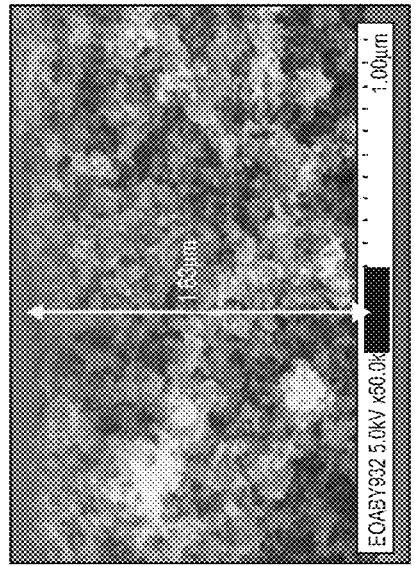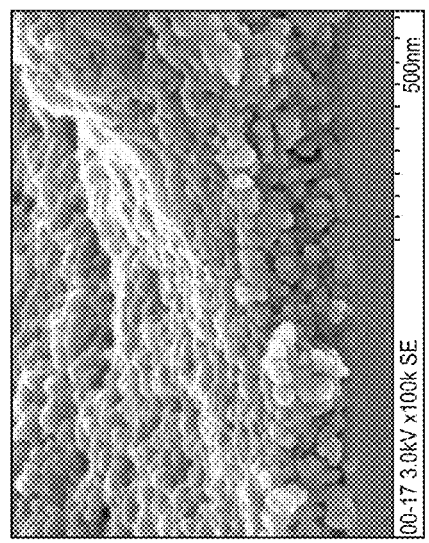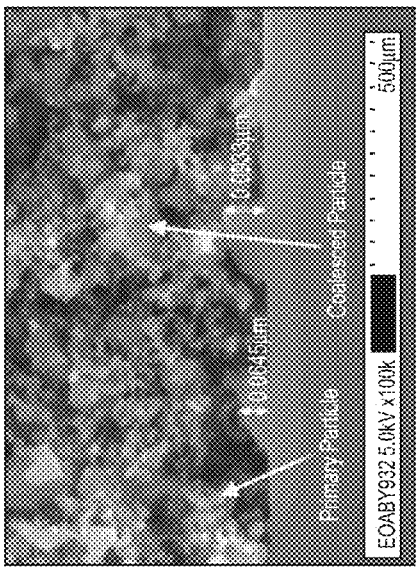
FIG. 41
FIG. 42

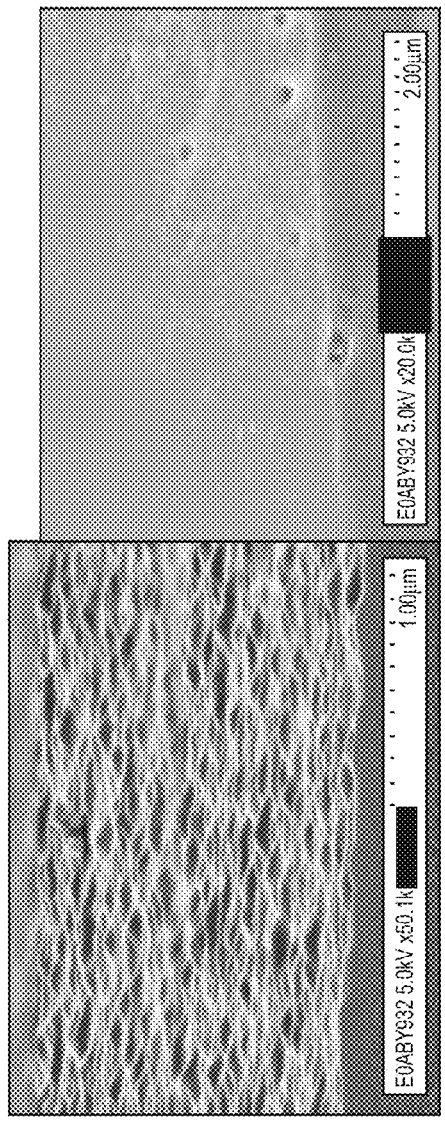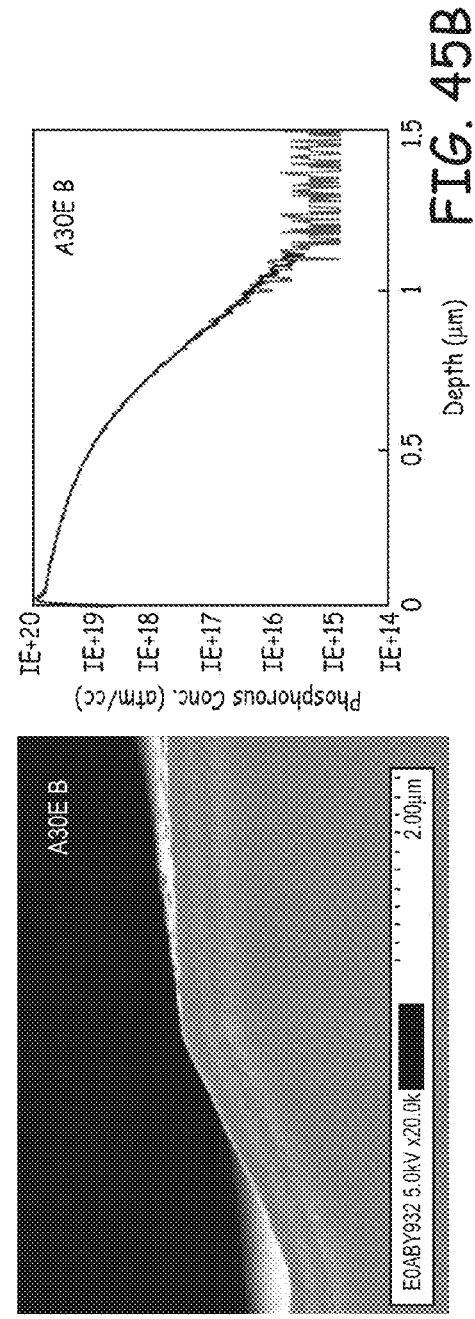
FIG. 45A
FIG. 45B

US 8,912,083 B2

SILICON SUBSTRATES WITH DOPED SURFACE CONTACTS FORMED FROM DOPED SILICON INKS AND CORRESPONDING PROCESSES

CROSS REFERENCE TO RELATED APPLICATIONS

This application claims priority to U.S. provisional patent application Ser. No. 61/438,064 filed on Jan. 31, 2011 to Liu et al., entitled "Silicon Substrates With Doped Surface Contacts Formed From Doped Silicon Inks and Corresponding Processes," incorporated herein by reference.

FIELD OF THE INVENTION

The invention relates to methods for the formation of doped surface area on silicon substrates. The invention further relates to ink composites with doped silicon nanoparticles and/or doped silica nanoparticles. In addition, the invention relates to methods of driving dopant into a silicon substrate using a cap over a silicon nanoparticle or silica nanoparticle deposit or a cover layer over a liquid dopant source. The invention also relates to solar cells with doped contacts formed with silicon inks.

BACKGROUND OF THE INVENTION

Silicon is a commonly used semiconductor material for commercial applications, and a majority of commercial electronic devices and solar cells are based on silicon. Most consumer electronics comprise silicon based circuits, and flat panel displays can comprise large area circuits to drive the display. Several solar cell designs based on silicon can be used, and most commercial solar cells are based on silicon. The formation of functional devices generally involves doping the silicon to control the electrical and conductive properties.

Photovoltaic cells are an important alternative energy source with growing global use. Generally, photovoltaic cells operate through the absorption of light to form electron-hole pairs within a semiconducting material. Oppositely doped regions within the photovoltaic cell provide a junction with the individual doped regions forming contacts for the separate collection of holes and electrons, which results in a voltage differential that can be used to drive a photocurrent. The photocurrent is available to perform useful work in an external circuit.

Solar cells based on crystalline or polycrystalline silicon provide particular design considerations. For solar cells with crystalline or polycrystalline silicon layers, localized doped contacts can be used to assist with the collection of the photocurrent. Current collectors generally are then in electrical contact with the doped contacts to provide for connection of the solar cell to an external circuit. Doped contacts with opposite dopant types can be placed on the front and back of the solar cell. In alternative designs, all of the doped silicon contacts of the solar cell are placed on the back side of the cell to form a back contact solar cell. With a back contact solar cell, the front, light receiving surface can be free of current collectors.

SUMMARY OF THE INVENTION

In a first aspect, the invention pertains to a method for doping a silicon substrate, in which the method comprises depositing a dopant ink comprising a dopant element onto the silicon substrate to form a doped deposit, forming an inorganic capping layer over the doped deposit on the silicon substrate, and heating the silicon substrate to drive dopant atoms into the silicon substrate.

In a further aspect, the invention pertains to a dopant source composition comprising a blend of a solvent, a glass/ceramic precursor composition, and doped particles selected from the group consisting of doped silicon nanoparticles, doped silica nanoparticles or a combination thereof. The dopant source composition can be used in a method to drive dopant into a silicon substrate. In particular, the method can comprise depositing the dopant source composition of to form a doped deposit on the silicon substrate, and heating the silicon substrate to drive the dopant element into the silicon substrate.

In another aspect, the invention pertains to a method for doping a silicon substrate, in which the method comprises heating a silicon substrate having a capped deposit of phosphorous-doped silicon nanoparticles to drive phosphorous dopant into the silicon substrate to an average depth of at least about 0.4 microns at a dopant concentration of at least about a factor of 100 over baseline bulk concentration.

In other aspects, the invention pertains to a method for doping a silicon substrate, the method comprising heating a silicon substrate having a deposit of doped silicon nanoparticles with a substantially non-contact cover, to drive dopant atoms into the silicon substrate.

In additional aspects, the invention pertains to a method for doping a silicon substrate, in which the method comprises heating a silicon substrate having a deposit of doped silicon nanoparticles to drive dopant atoms into the silicon substrate, and using rapid thermal processing to sinter the doped silicon nanoparticles to form a substantially fused coating of doped silicon extending from a surface of the silicon substrate.

Furthermore, the invention pertains to a semiconducting structure comprising a silicon substrate having an average thickness of at least about 5 microns, a doped surface region having a depth of at least about 0.25 microns with a dopant concentration of at least a factor of 100 over bulk concentrations and a coating of substantially fused doped silicon extending from the surface of the silicon substrate.

BRIEF DESCRIPTION OF THE DRAWINGS

FIG. 10 is a schematic side view of an oven with a silicon substrate for performing a heating step to perform a dopant drive-in.

FIG. 40 is a composite of a TEM image and an SAED pattern of a silicon wafer sample processed with 20 nm doped silicon particles in a stacked configuration at 1050° C. for 1 hour, in which the SAED pattern was obtained from a porous sintered particulate layer formed from silicon nanoparticles after dopant drive-in.

FIG. 41 is a composite of SEM images of cross-sections of a silicon wafer sample processed with 7 mm doped silicon particles in a stacked configuration at 1050° C. for 1 hour, in which the SEM images in the left and right panels were taken before and after BOE treatment, respectively.

FIG. 42 is a composite of SEM images of cross-sections of a silicon wafer sample processed with 20 nm doped silicon particles in a stacked configuration at 1050° C. for 1 hour, taken after BOE treatment, in which the SEM images in the left and right panels were taken under different magnifications.

FIG. 45A is a composite of SEM images of the surface of a sample processed with 20 nm doped silicon particles in a stacked configuration at 1050° C. for 1 hour, in which the left and right panels are SEM images of the front and back surfaces of the sample, respectively.

FIG. 45B is a composite displaying a SEM image of a cross section of a sample processed with 20 nm doped silicon particles in a stacked configuration at 1050° C. for 1 hour (left panel) and a plot of the dopant profile of the same sample (right panel).

DETAILED DESCRIPTION OF THE INVENTION

Figure 1:
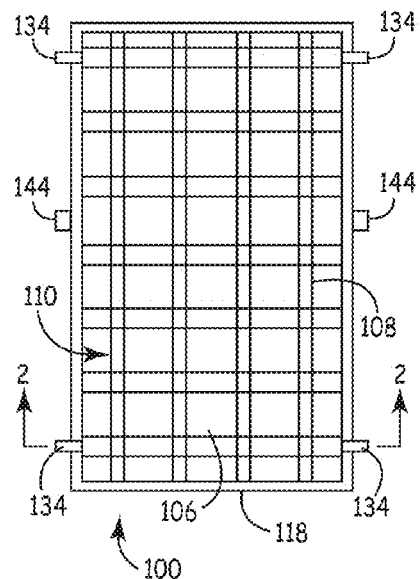
FIG. 1 is a front view of a photovoltaic cell with doped contacts along both the front and rear surfaces in which a current collector along a grid is shown.

Improved processes are described to provide for dopant drive-in into a silicon substrate from a dopant source material, such as a doped silicon ink. It has been discovered that desirable dopant drive-in can be facilitated if dopant elements from the dopant source are restricted from escaping in the atmosphere around the substrate such that atoms of the dopant element can be driven into the underlying silicon substrate at desirable concentrations. Various types of a cap can be used over the dopant source, e.g., doped ink, to effectively provide for the desired level of dopant drive in. For example, the cap can be provided by another wafer placed over the dopant coated wafer, a ceramic coating over the ink and/or a cover that encloses the dopant coating with a limited vapor volume over the coating. In general, a deposited silicon ink can be removed or left in place following the dopant drive in, and other dopant sources would generally be removed with a suitable etch or the like. Similarly, a deposit of silicon nanoparticles from an ink can be substantially fused either before or after dopant drive-in. In some embodiments, silicon nanoparticles or silica nanoparticles can be blended with a glass/ceramic (i.e.; glass and/or ceramic) precursor composition to form a composite ink composition so that the residual ink deposit or an appropriate portion thereof can be removed with a suitable etch after completing the dopant drive-in. If a glass/ceramic precursor composition is incorporated into the ink formulation a distinct cap may or may not be used since a cured glass/ceramic composition in the deposited ink may facilitate the dopant drive-in. The dopant drive-in can be effectively used to form doped contacts for solar cell applications.

Many different solar cell designs have been developed, which generally can incorporate a desired semiconducting material to function as a photoconductor. The semiconductor material can be selected to have appropriate light absorption for appropriate wavelengths, generally visible wavelengths for solar radiation. Silicon is of particular interest for the semiconductor material. Amorphous silicon has a relatively large absorption of visible light, and certain thin film solar cell designs have been based on amorphous or microcrystalline silicon. However, the dopant drive-in described herein is directed to single crystalline or polycrystalline silicon substrates, which we refer to generally as crystalline. As used herein, polycrystalline implies an average crystallite size of at least about 100 micron, and generally significantly larger. Also, the crystalline silicon substrate generally has an average thickness of at least about 5 microns. As described further below, crystalline silicon substrates, for example, can be cut as a wafer from a single crystal ingot, formed as a polycrystalline ribbon or deposited and recrystallized as a thin silicon foil. To reduce costs and associated use of materials, the strong commercial trend has been toward the use of thinner crystalline substrates for the formation of solar cells.

Crystalline silicon-based solar cells generally comprise a lightly doped bulk silicon substrate with highly doped contacts along the surface of the substrate. The highly doped contacts can provide for harvesting of the photocurrent through the formation of a diode junction with corresponding p-type dopant or n-type dopant in different portions of the junction. In particular, the highly doped contacts establish electric fields within the material that respectively attract electrons or holes that generates a current at a corresponding potential when the doped contacts are appropriately connected to an outside circuit. As described herein, doped contacts can be formed using doped silicon nanoparticle inks or other suitable dopant sources that can be applied as a liquid.

Various designs have been developed for placement of the doped contacts. For example, one type of doped contact can be placed along the front surface, which is the light receiving surface, and the doped contact(s) of opposite polarity are placed along the back surface. In other embodiments, the doped contacts are placed in a pattern along the back surface of the solar cell. The areas and depths of the doped contacts can be selected to reduce electron-hole recombination as well as to correspondingly increase conversion efficiencies of the resulting solar cell. Generally, a selected reasonable design for doped contacts can be formed based on the ink processing approaches described herein.

As noted above, silicon inks with doped silicon nanoparticles can provide a suitable liquid dopant source. Silicon inks are dispersions of silicon nano-particles that can be used in a suitable deposition process. In general, any suitable source of quality silicon nanoparticle inks can be used. Highly uniform and highly doped silicon nanoparticles can be formed that are suitable for formation of high quality inks. For example, doped silicon nanoparticles can be formed using laser pyrolysis or with plasma synthesis approaches. The use of a radiofrequency plasma apparatus for the synthesis of silicon nanoparticles is described in published U.S. patent application 2009/0014423A to Li et al., entitled "Concentric Flow-Through Plasma Reactor and Methods Therefore," incorporated herein by reference. Laser pyrolysis has been developed as a desirable source of highly doped silicon particles for the formation of silicon inks. The silicon particles can be synthesized with a nanoscale average particle size, e.g., less than 100 nanometer average particle diameter.

Laser pyrolysis uses an intense light beam to drive a reaction that can be designed to form highly uniform silicon particles with desirable characteristics. The particles are synthesized in a flow that initiates at a reactant nozzle and ends at a collection system. Dopant levels can be adjusted using dopant precursors within the reactant stream. Particle sizes can be adjusted by correspondingly adjusting the synthesis conditions. For the formation of high quality inks, it is generally desirable to synthesize nanoparticles having an average primary particle size of no more than about 50 nm. Laser pyrolysis can be used to form very uniform and pure particles, optionally with a desired dopant level. The uniform nanoparticles can be formed into corresponding high quality inks. The particles can be well dispersed in the inks at relatively high concentrations, and the properties of the inks can be controlled to be suitable for the desired delivery process.

In the laser pyrolysis process, to obtain incorporation of the dopant element into the product particles, the dopant elements can be delivered into the reactant stream as a suitable precursor composition, such as silane as a silicon precursor. The reactant stream can comprise vapor precursor and/or aerosol precursors. Laser pyrolysis can be used to form doped silicon particles with a wide range of selected dopants or combinations of dopants. Specifically, dopant levels of several atomic percent can be achieved. The ability to achieve high dopant levels make the corresponding inks particularly desirable for applications where dopants are transferred to a semiconducting material or for the formation of devices with these high dopant levels. The high dopant levels can be achieved while also having control of average particle sizes, low impurity levels and while achieving dispersible particle with good uniformity. For the doping of semiconductor substrates, desirable dopants include, for example, B, P, Al, Ga, As, Sb and combinations thereof. The general use of laser pyrolysis for the formation of a range of materials is described in published U.S. Pat. No. 7,384,680 to Bi et al., entitled "Nanoparticle Production and Corresponding Structures," incorporated herein by reference. The synthesis of highly doped silicon nanoparticles is described further in copending U.S. provisional patent application Ser. No. 13/070,286 to Chiruvolu et al., entitled "Silicon/Germanium Nanoparticle Inks, Laser Pyrolysis Reactors For the Synthesis of Nanoparticles and Associated Methods," incorporated herein by reference.

In some embodiments, an ink comprising doped silicon oxide, i.e., silica, can provide the dopant source. Thus, a copping layer or a cover can be used with a printed ink of doped silica nanoparticles can be used to provide dopant for driving into a silicon substrate. Laser pyrolysis or other flow based reactive synthesis methods can be used to generate suitable silica nanoparticles. The formation of doped silica inks and the synthesis of doped silica nanoparticles using laser pyrolysis is described further in published U.S. patent application 2008/0160733 to Hieslmair et al., entitled "Silicon/Germanium Oxide Particle Inks, Inkjet Printing, and Processes for Doping Semiconductor Substrates," incorporated herein by reference.

As described herein, high quality dispersions of silicon nanoparticles, or in some embodiments, silica nanoparticles, provides the ability for effective depositing of the nanoparticles for their use in formation of desired structures. As described further below, selected coating or printing techniques can be used for the deposition of the doped nanoparticles. Printing techniques can be particularly desirable for the efficient patterning of the ink and resulting doped area of silicon if the nanoparticles are doped. Due to the enhanced ability to control the properties of the inks, the doped nanoparticles can be printed rapidly and with relatively high resolution, for example, using inkjet printing, screen printing or other desired approaches. Using the printing process, doped nanoparticles with different dopants can be selectively placed at different locations along the substrate surface. Similarly, the placement of doped nanoparticles along a substrate can provide a dopant source that can provide a dopant that can be driven into the adjacent substrate. Thus, desired patterns of doped contacts can be formed for solar cell components.

With respect to doped silicon inks, silicon nanoparticles may or may not be surface modified for the formation of an ink. Surface modification refers to chemical bonding of a composition to the surface of particles. While surface modification of the silicon particles may facilitate dispersion in some solvents, the ability to process the silicon nanoparticles without surface modification of the particle with an organic composition simplifies the processing and can result in reduced contamination of ultimate devices formed from the silicon inks. High concentration and good quality inks have been formed from silicon nanoparticles without surface modification. The particles can be transferred between solvents for production of desired ink formulations.

The dopant inks generally can be deposited using coating approaches that cover the surface of a substrate or printing approaches that pattern the ink along the surface. Suitable coating techniques include, for example, spin coating, spray coating, knife-edge coating, extrusion, or the like. For some solar cell applications based on crystalline or polycrystalline silicon, it is desirable to pattern the silicon inks to form localized doped contacts and corresponding printing techniques can be applied to pattern the inks. In alternative or additional embodiments, suitable printing techniques include, for example, inkjet printing, screen printing, or other suitable printing process. The inks can be formulated for deposition by a selected deposition approach based on solvent selection, concentrations, additives and/or other compositions or processing parameters.

As noted above, the silicon substrate is generally crystalline or polycrystalline. It may be desirable to have light doping of the base photoactive silicon layer to reduce series resistance. In general, any source of the silicon substrate can be used. To reduce cost and use of resources, in some embodiments, the silicon substrate can be selected to be relatively thin, e.g. no more than about 250 microns average thickness, although the dopant drive-in process described herein can be effective also for thicker silicon substrates. Suitable substrates include, for example, wafers cut from single crystalline silicon ingots. Polycrystalline silicon can be formed as silicon ribbons pulled from a silicon melt. In general, the ribbons are grown from a structure pulled from the silicon melt. In further embodiments, silicon foils can be formed through reactive deposition onto a release layer such that the foils can then be released for further processing.

Elemental silicon foils, with or without dopants, can be formed through reactive deposition onto a release layer. The silicon foil can be separated from the release layer for incorporation into a desired device. In particular, scanning reactive deposition approaches have been developed for deposition onto an inorganic release layer. The foils can be deposited, for example, using light reactive deposition (LRD™) or with chemical vapor deposition (CVD), e.g., sub-atmospheric pressure CVD or atmospheric pressure CVD. Reactive deposition approaches can effectively deposit inorganic materials at a significant rate. LRD™ involves the generation of a reactant flow from a nozzle directed through an intense light beam, such as a laser beam, which drives the reaction to form a product composition that is deposited onto a substrate that intersects the flow. The light beam is directed to avoid striking the substrate, and the substrate is generally moved relative the flow to scan the coating deposition across the substrate and an appropriately shaped nozzle oriented appropriately relative to the light beam can scan the coating composition to coat an entire substrate in a single linear pass of the substrate past the nozzle. LRD™ reactive deposition onto a release layer is described generally in U.S. Pat. No. 6,788,866 to Bryan, entitled "Layer Material and Planar Optical Devices," incorporated herein by reference as well as in published U.S. patent application 2007/0212510A to Hieslmair et al., entitled "Thin Silicon or Germanium Sheets and Photovoltaics Formed From Thin Sheets," incorporated herein by reference. In principle, silicon foils can be formed with selected sizes up to large sizes. The as-deposited silicon can be subjected to zone melt recrystallization to improve the crystallinity and increase the crystallite size. CVD deposition onto a porous release layer is described further in published U.S. patent application 2009/0017292 to Hieslmair et al., entitled "Reactive Flow Deposition and Synthesis of Inorganic Foils," incorporated herein by reference.

The ultimate solar cell structure generally further comprises a passivation layer, which is generally an inorganic dielectric material, along the front and back surface of the silicon substrate to reduce surface recombination that can reduce cell efficiency. Respective current collectors make an electrical connection with the doped contacts to provide for the connection of the cells with an external circuit. The portion of the current collectors generally extends past the passivation layer to reach a particular doped contact. A current collector or a plurality of current collectors along the back surface of the solar cell can be formed from a reflective metal so that the current collector reflects any light that passes through the cell so that at least a portion of the reflected light can be absorbed by the semiconductor. On the other hand, the current collector along the front surface can block light from reaching the semiconductor material, so generally a current collector along the front surface of the solar cell is patterned to block only a small portion of the light.

In some embodiments, a particular surface of the solar cell can have a plurality of doped contacts of a particular dopant type to provide for current collection. The doped contacts of a particular type can be electrically connected to a common current collector between the doped contacts of the same polarity. The current collectors can be formed, for example, from elemental metal or alloys thereof, and the current collector generally extends through a passivation layer to make contact with a particular doped contact. The doped contacts can be laid out on the surface such that a continuous current collector can connect the contacts. If an entire surface of a silicon substrate is processed to have a highly doped surface region, the current collector may still extend through a passivation layer at specific points to provide for current collection.

It has been found that a thermal drive in of the dopant elements into the underlying silicon substrate can be accomplished with dopant elements from a doped silicon ink. At least a portion of the silicon from the inks can be fused into a densified elemental silicon material along the surface of the silicon substrate. Residual silicon nanoparticles can be removed from silicon substrate using an appropriate technique, such as etching. If a doped silica ink or other liquid dopant source is used, the residual portion of the dopant source is generally removed after completing the dopant drive-in using a suitable etch, such as a buffered oxide etch.

In general, a thermal process can be performed in a furnace. In some embodiments, the dopant drive-in can be performed in an inert atmosphere, which is substantially free of oxygen that can oxidize the silicon substrate. Although in some embodiments, some oxygen can be delivered to oxidize silicon nanoparticles to facilitate etching to remove the residual silicon nanoparticles. Due to the high surface area of the nanoparticles, the nanoparticles would undergo more extensive oxidation than the substrate surface. In some embodiments, the atmosphere in the furnace is flowed, which can further remove any dopant atoms within the vapor. When heated to appropriate temperatures to perform the dopant drive-in, it is found that desired levels of dopant drive-in into the silicon substrate are not observed with doped silicon inks that are not capped. While not wanting to be limited by theory, evidence suggests that a cap inhibits loss of dopant vapor from the vicinity of the silicon substrate. Results presented in the examples indicate that a desired degree of dopant drive-in can be achieved with an appropriate cap. In additional or alternative embodiments, a glass/ceramic precursor composition can be incorporated into the silicon nanoparticle ink as an intrinsic agent to form a doped composite ink composition, and a separate cap may or may not be used with the doped composite ink composition.

Suitable caps generally restrict the interface of the doped silicon ink or other dopant source with the ambient atmosphere. Thus, for example, another silicon wafer can be stacked on top of the inked surface of a silicon wafer or other silicon substrate to be doped. Added weight can be placed on top of the capping wafer to improve the capping function. Thus, a gas tight seal is not needed to achieve the desired dopant drive-in as long as a out-gassing of dopant elements into the ambient atmosphere is reasonably restricted. Results presented in the examples below demonstrate that this form of capping can be effective to result in desired levels of dopant drive-in into the underlying silicon substrate. The capping wafer may or may not have a dopant ink itself. Since the capping silicon wafer does not have to have a dopant ink itself, wafers or slabs of other suitable high temperature materials, such as a quartz plate, can be substituted for the capping wafer and similar results can be expected. The capping structure can be selected to avoid the introduction of contaminants to the silicon substrate under the heating conditions for performing the thermal dopant drive-in.

The results in the examples also demonstrate that a cover that limits the vapor volume over the dopant ink can be similarly effective to limit loss of dopant in the vapor phase that stabilizes the drive-in of the dopant. As shown in the examples, a wafer with a hole cut into it is placed over a silicon wafer with a dopant ink, and a quartz slab is placed over the top silicon wafer to form a cover. Dopant is effectively driven into the lower silicon substrate at the location of the hole. The quartz slab acts as a cover so that the effectiveness of a cover is established. Thus, a cover that substantially does not rest on the wafer surface can be similarly used in which the cover provides a limited vapor volume above the wafer so that the dopant element does not significantly leave the vicinity of the wafer surface. In other words, the cover can be substantially supported by a surrounding surface such that the structure covers the ink covered surface. A cover can be made from a suitable material, such as a ceramic material to withstand the temperatures used for the dopant drive-in. Without wanting to be limited by theory, the atmosphere trapped within the cover evidently can reach a certain partial pressure in the dopant element, at which point no additional dopant is lost from the ink, and the resulting conditions allow for the dopant drive-in into the silicon substrate.

In further embodiments, a ceramic and/or glass overlayer can function as a capping layer. For example, a spin-on glass can be applied over the doped silicon ink on the silicon substrate. The spin-on glass can be cured to form a stable inorganic cover. The inorganic cover layer can effectively inhibit dopant vaporization to provide for dopant drive-in into the silicon substrate at desired levels. The effectiveness of a spin-on glass overlayer is shown in the Examples below. Other suitable ceramic or glass materials, such as oxides, nitrides, carbides, and combinations thereof, can be used, which can be selected so that contaminants are not introduced into the silicon substrate. The overlayer may be etched to remove the overlayer after the dopant drive-in or the overlayer can be left in place as a passivation layer.

Alternatively or additionally, a glass/ceramic precursor composition can be incorporated into the doped silicon nanoparticle ink. The glass/ceramic precursor composition, e.g., a spin-on glass composition, may or may not itself comprise a dopant element, which may generally be the same dopant element in the silicon nanoparticles in the composite. The relative amounts of the components can be selected to achieve desired processing properties. The viscosity of the composite ink can be selected in part through solvent selection and concentrations to be consistent with a selected deposition approach. After deposition, the composite ink can be heated appropriately to cure the glass/ceramic precursor composition. The composite ink may exhibit better dopant drive-in without a separate cap due to the presence of the inorganic glass and/or ceramic composition following curing, but a separate cap can be used to further support the dopant drive-in process.

Following dopant drive-in, the residual composite ink can be removed using an oxide etch or other suitable etch. In particular, the cured glass/ceramic precursor composition forms an inorganic material, such as a silicon oxide. In the cured composite ink, the inorganic glass/ceramic material from the precursor composition forms a matrix for silicon particles. If the inorganic matrix is removed in an etching step, any residual nanoparticles, e.g., silicon particles, generally lack cohesion and adhesion so that the nanoparticles would be substantially removed during the etching process. Thus, the use of the composite can facilitate the removal of residual ink without the use of a separate etch directed, for example, to the silicon particles.

After completing the dopant drive-in with doped silicon nanoparticles, it is observed that some of the silicon nanoparticles coalesce into an apparent continuous silicon layer along the surface of the silicon substrate although the dopant drive-in temperatures are generally above the melting temperature. However, the doped silicon particles of the ink are not fully fused into a continuous layer. The degree of the particle fusing generally depends on the specific conditions used for the dopant drive-in. The fused silicon particles can be incorporated into the ultimate structure. Also, some silicon nanoparticles exhibit sintering that result in observed larger average particle sizes after the dopant drive-in. The remaining silicon nanoparticles seem to also exhibit surface oxidation that is observed to be removed with a silicon oxide etching step, even when a substantially oxygen free flow is provided through the oven where the heat treatment is performed. The silicon oxide material as well as the remaining silicon nanoparticles can be removed with a suitable etching agent or agents.

In some embodiments, the structure is further processed to sinter at least some remaining silicon particles to form a densified deposit of doped silicon. In general, sintering of a nanoparticle silicon ink can be performed before or after the dopant drive-in. The objective to sinter the particles is to provide for reasonable electrical conductivity through the densified ink so that the current collector can be associated with silicon material from the densified silicon nanoparticles extending from the silicon substrate surface. If the particles are densified into an island of silicon extending from the silicon surface, etching to remove the particulates of silicon particles of the ink can be reduced or eliminated. In some embodiments, the densification of the silicon particles can be performed with heat lamps or the like that can be directed at the surface without heating through the substrate. Also, the small crystalline particles can have somewhat greater absorption of light relative to the crystalline or polycrystalline substrate, which further facilitates the densification of the silicon particles while not heating the silicon substrate extensively.

The doping with each dopant type, n-type and p-type, can be performed sequentially or simultaneously. In general, the use of a single dopant drive-in step can be desirable from an energy savings perspective since then the silicon structure would only be heated once. If the dopants of each type are on opposite surfaces of the silicon substrate, the appropriate ink can be deposited/printed on the respective surfaces and covered for the dopant drive in process. An appropriate cap can stabilize the particular ink in the orientation for the drive-in process. If the dopants of different types are along the same surface of the silicon substrate, the dopant inks can be patterned in a selected pattern. The patterned surface can be covered with an appropriate cap to facilitate the dopant drive-in. A glass/ceramic capping layer, such as a glass, can be effective to reduce migration of doping elements as a result of the dopant drive-in process.

After the dopant drive-in is complete and the silicon ink is densified and/or etched, additional processing can be performed to complete the device. If a passivation layer has not already been deposited, a passivation layer can be deposited, and suitable current collectors can be placed to make contact with the respective doped contacts. The solar cells can be assembled into a module with suitable encapsulant and a transparent front protective layer. The processes described herein can provide an effective and efficient approach for the introduction of dopants for the formation of doped contacts.

Solar Cell Structures

The solar cells of particular interest comprise a crystalline silicon light absorbing layer. Doped contacts extend into the surface of the silicon substrate to provide for collection of a photocurrent and may extend at least somewhat outward from the surface. The doped contacts can be along both the front and back surfaces of the solar cell or only along the back surface of the solar cell. The formation of the doped contacts using doped silicon inks or other liquid dopant sources and dopant drive-in methods described herein can be adapted for the desired placement of the doped contacts. Inorganic dielectric materials generally are placed along the surfaces of the silicon substrate over the doped contacts as a passivation layer to reduce recombination events that can result in a decrease of efficiency of the solar cell operation. Electrically conductive current collectors are appropriately placed to provide for connection of the solar cell at the doped contacts to an external circuit. Portions of the current collector generally penetrate the respective dielectric layer to make an electrical connection to the doped silicon contact. A transparent front protective layer generally is used to protect the front, light receiving surface. The remaining portion of the solar cell can be encapsulated in a polymer or the like to protect the solar cell from environmental assaults with appropriate allowance for connecting the cell to an external circuit through connection of an electrically conductive leads to the respective opposite polarity current collectors.

The silicon crystalline light absorbing layer can be formed from any reasonable source. The doped contacts for the solar cell can be formed using the liquid dopant sources described herein through deposition onto one or both surfaces of the silicon substrate followed by an appropriate dopant drive in. It can be desirable to use thin silicon substrates for forming the absorbing layer to reduce use of material. A reduction in the use of material is desirable also from a cost perspective.

Suitable crystalline silicon substrates can comprise, for example, a silicon wafer cut from an ingot of single crystal silicon, a silicon ribbon, or a silicon foil. Doped and non-doped crystalline silicon wafers are commercially available generally having a diameter of about 50 mm to about 300 mm. For example, commercial wafers can be obtained, for example, from Silicon Valley Microelectronics Incorporated (CA, U.S.A.). Wafers can be etched to reduce their thickness to a desired value, although the etching process does not result in a material savings since the loss of silicon in the etching process essentially wastes the crystalline silicon.

Similarly, crystalline silicon ribbons can be formed by pulling a pair of filaments through a crucible containing molten silicon optionally comprising a dopant. As the filaments pass through the melt, a thin film of silicon forms between the filaments and quickly solidifies as it cools. With respect to average crystallite size, the pull rate and thermoelastic stress acting on a crystal during growth can affect the average crystallite size within the silicon ribbon. Furthermore, filament geometry can be selected to reduce thermoelastic stress during crystal growth. Polycrystalline silicon ribbons comprising crystallite sizes of up to 25 mm×25 mm have been produced with the appropriate selection of processing parameters. With respect to dimensions, silicon ribbons can have a thickness of about 60 μm to about 1 mm and a width of about 1 cm to about 30 cm. The length of silicon ribbon can be up to, at least, 15 m. The formation of silicon ribbons with a width of up to 50 mm and with a thickness from about 120 μm to about 1 mm is described in published U.S. patent application 2009/0025787 A to Gabor ("the '787 patent"), entitled "Wafer/Ribbon Crystal Method and Apparatus," incorporated herein by reference. U.S. Pat. No. 7,651,768 to Richardson et al., entitled "Reduced Wetting String for Ribbon Crystal," incorporated herein by reference, describes the formation and use of strings with increased wetting angles to promote larger crystallite formation.

Crystalline silicon foils can be formed by reactive deposition processes involving a release layer. A release layer is a layer with low mechanical integrity or a layer susceptible to selective removal. Thus, an overlayer can be separated from an underlying substrate through the fracture or removal of the release layer. In particular, a release layer can be effectively formed using light reactive deposition. Light reactive deposition involves a chemical reaction within a flow having suitable precursor reactants in which the reaction is driven by an intense light beam. In operation, light from an intense source intersects the reaction stream and drives a reaction therein. The product particles can then deposit onto a releasable layer supported by a support structure. The release layer generally is characterized by a high porosity and a relatively low density relative to the corresponding fully densified material. The silicon foil layer can be formed through silicon deposition using chemical vapor deposition (CVD) or light reactive deposition onto the release layer. The as-deposited silicon layer can be recrystallized, for example, using zone melt recrystallization, to increase the crystal size in the resulting silicon foil, which can be performed prior to separation of the silicon layer from the release layer. The separation of the silicon overlayer at the release layer results in a silicon foil, which may or may not be always supported on one surface or another. The silicon foils can be made large, and appropriate crystallite sizes have been obtained. A method for forming silicon foils using light reactive deposition is discussed in U.S. published patent application publication 2007/0212510A1 to Hieslmair et al., entitled "Thin Silicon or Germanium Sheets and Photovoltaics Formed From Thin Sheets," incorporated herein by reference. The formation of silicon foils using CVD onto a release layer is described in U.S. published patent application 2009/0017292A1 to Hieslmair et al., entitled "Reactive Flow Deposition and Synthesis of Inorganic Foils," incorporated herein by reference.

Figure 2:
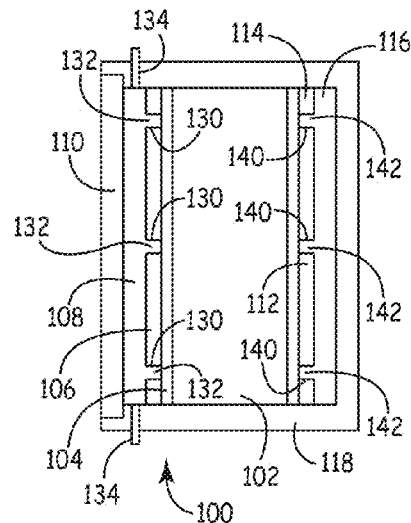
FIG. 2 is a sectional side view of the photovoltaic cell of FIG. 1 taken along line 2-2.

An embodiment of a photovoltaic cell with both front and rear contacts is shown schematically in FIGS. 1 and 2. Referring to FIGS. 1 and 2, photovoltaic cell 100 comprises silicon substrate 102, a front patterned doped contact 104, a front passivation layer 106, front current collector 108, front protective layer 110, back doped contact 112, back passivation layer 114, back current collector 116 and polymer encapsulant 118. In some embodiments, the silicon substrate comprises a dopant element at a relatively low dopant level, such as an n-type dopant, to increase the electrical conductivity of the silicon substrate, i.e., core silicon light absorbing layer. In general, the silicon substrate can have an average dopant concentration of about $1.0 \times 10^{14}$ to about $1.0 \times 10^{16}$ atoms per cubic centimeter (cc) of boron, phosphorous or other similar dopant. A person or ordinary skill in the art will recognize that additional ranges of light dopant levels within the explicit ranges above are contemplated and are within the present disclosure.

Front doped contact 104 and back doped contact 112 are generally highly doped region penetrating into the silicon substrate and may or may not comprise doped silicon extending from the substrate. Front doped contact 104 and back doped contact 112 can each comprise a selected dopant. Front doped contact 104 and back doped contact 112 can comprise independently a plurality of disconnected locations along the respective surface of the silicon substrate. In some embodiments, front doped contact 104 or back doped contact 112 can extend essentially over the entire surface of the silicon substrate. In some embodiments, it is desirable for the front doped contact to comprise an n-type dopant and for the back doped contact to comprise a p-type dopant, such that minority carriers or electrons formed by the absorption of light migrate to the front surface while oppositely charged carriers or holes migrate to the back surface. The migration of the electrons and holes results in the collecting of useful current that can be directed to an outside circuit. Suitable n-type dopants include, for example, P, Sb and/or As, and suitable p-type dopants include, for example, B, Al, Ga and/or In. Generally, the average dopant levels within the doped contacts can be from about $1.0 \times 10^{18}$ to about $5 \times 10^{20}$, in further embodiments $2.5 \times 10^{18}$ to about $1.0 \times 10^{20}$ and in other embodiments form $5.0 \times 10^{18}$ to about $5.0 \times 10^{19}$ atoms per cubic centimeter (cc). A person of ordinary skill in the art will recognize that additional ranges of average dopant levels within these explicit ranges are contemplated and are within the present disclosure. However, the dopant concentration in the doped contact has a profile with respect to the depth that more specifically characterizes the doped contact, as described further below. The dopant profile generally can be a function of the approach used to drive the dopant into the substrate from the air.

Front passivation layer 106 can comprise an inorganic dielectric material. Suitable inorganic materials to form passivation layers include, for example, stoichiometric and non-stoichiometric silicon oxides, silicon nitrides, and silicon oxynitrides, silicon carbides, silicon carbonitrides, dielectric metal oxides, such as aluminum oxide, dielectric metal nitrides, such as aluminum nitride, metal oxynitrides, combinations thereof or mixtures thereof, with or without hydrogen additions or other transparent dielectric materials. In some embodiments, passivation layers can comprise, for example, $SiN_xO_y$, $x \leq 4/3$ and $y \leq 2$, silicon oxide ($SiO_2$), silicon nitride ($Si_3N_4$), silicon rich oxide ($SiO_x$, $x < 2$), or silicon rich nitride ($SiN_x$, $x < 4/3$). Holes 130 through front passivation layer 106 provide for electrical contact between front current collector 108 and front doped contact 104.

The passivation layers generally can have a thickness generally from about 10 nanometers (nm) to 800 nm and in further embodiments from 30 nm to 600 nm and in further embodiments from 50 nm to 500 nm. A person of ordinary skill in the art will recognize that additional ranges of thicknesses within the explicit ranges above are contemplated and are within the present disclosure. The passivation layers can protect the semiconductor material from environmental degradation, reduce surface recombination of holes and electrons, and/or provide structural design features, as well as provide anti-reflecting properties for front surfaces. The passivation layer generally is also substantially chemically inert so that the cell is more resistant to any environmental contaminants. The surface can have some non-planarity to help scatter light through the silicon to achieve a greater absorption of the light.

Front current collector 108 can comprise a patterned grid of electrical conductor that provides for transmission of light past the current collector through the gaps in the electrically conductive material. Front current collector 108 comprises extensions 132 that extend through holes 130 to establish electrical conductivity between front current collector 108 and front doped contact 104. Front current collector 108 can connect a plurality of separate locations of front doped contact 104. Also, front current collector 108 generally can comprise one or more electrically conductive tabs 134 that are designed to provide electrical connections with current collector 108. If encapsulant 118 covers individual cells, tabs 134 generally are configured to extend through encapsulant 118, and if encapsulant 118 is used to enclose a plurality of cells within a module, tabs 134 can be used to connect adjacent cells, for example, in a series or in a parallel connection or to connect to an external circuit. A grid configuration of current collector 108 is depicted in FIG. 1, although other grid patterns can be used as desired.

The front current collector comprises a grid of electrically conductive material, such as elemental metal or metal alloys. In general, the dimensions of the electrically conductive grid are balanced to provide a desired level of contact with the front doped layer while avoiding an undesirable amount of light blockage. Electrically conductive material of the current collector can block light from reaching the semiconductor material at the locations of the material since the electrically conductive material generally absorbs and/or reflects visible light. The pattern of the electrically conductive grid can be selected for convenient processing.

Front transparent layer 110 can comprise a transparent polymer sheet, a glass sheet, a combination thereof or the like. Suitable polymers include, for example, polycarbonates. Polymer layers can be laminated to the base cell structure. If the front transparent layer also comprises glass, an adhesive, such as silicone adhesives or EVA adhesives (ethylene vinyl acetate polymers/copolymers), can be used to secure the glass to a transparent polymer sheet or directly to the current collector surface.

Back passivation layer 114 can essentially mirror front passivation layer 106, although holes 140 through back passivation layer 114 may or may not have the same configuration and sizes as holes 130 through front passivation layer 106, although the ranges of suitable hole parameters can be equivalent for holes 140 and holes 130. Back passivation layer 114 can comprise equivalent compositions as front passivation layer 106. Similarly, back passivation layer 114 can have thickness over equivalent ranges as for front passivation layer 106.

Back current collector 116 generally can be selected to reflect visible light. Light reflected from back current collector 116 passes back through silicon substrate 102 where the light can be absorbed by the semiconductor for the generation of additional photocurrent. Back current collector 116 can comprise electrically conductive metal, such as aluminum, although any suitable electrically conductive material can be used. Back current collector 116 can comprise electrically conductive tabs 144 or the like that extend to provide for electrical connection with the current collector. If encapsulant 118 covers individual cells, tabs 144 generally are configured to extend through encapsulant 118, and if encapsulant 118 is used to enclose a plurality of cells within a module, tabs 144 can be used to connect adjacent cells or to make a connection to an external circuit.

Figure 3:
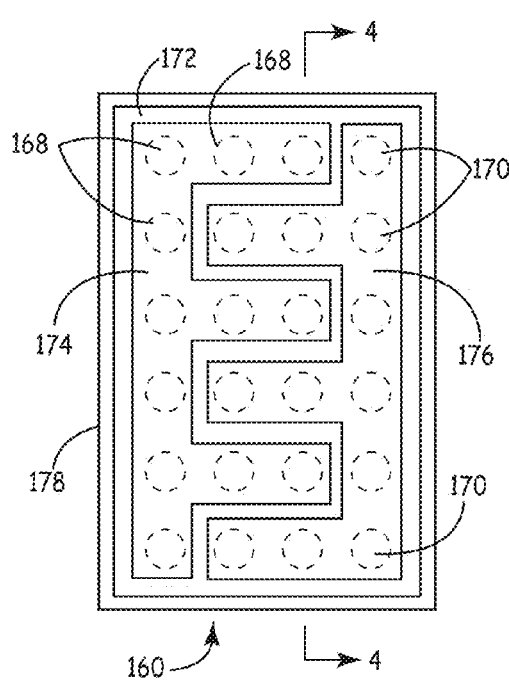
FIG. 3 is a back view of a photovoltaic cell with back contacts of opposite polarity without any back sealing material blocking the view of the cell.
Figure 4:
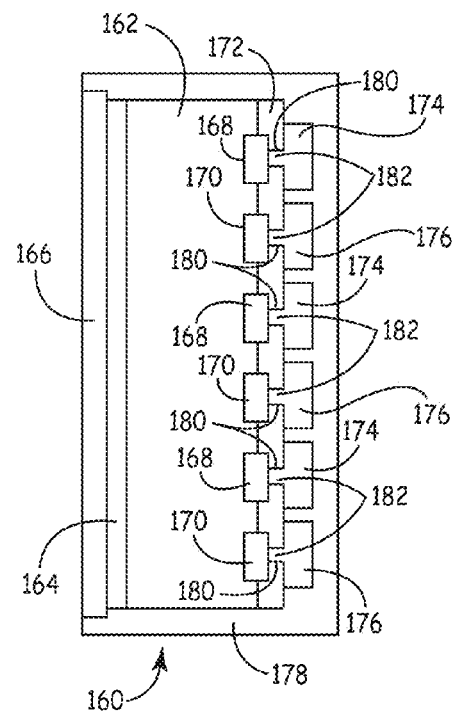
FIG. 4 is a sectional side view of the photovoltaic cell of FIG. 3 taken along line 4-4.

A representative embodiment of a back contact photovoltaic cell is shown in FIGS. 3 and 4. Referring to FIGS. 3 and 4, back contact photovoltaic cell 160 comprises silicon substrate 162, front passivation layer 164, front transparent protective layer 166, back p-doped contacts 168, back n-doped contacts 170, back passivation layer 172, first back current collector 174, second back current collector 176 and encapsulant 178. Silicon substrate 162 can generally have equivalent characteristics of silicon substrate 102 discussed above. The front surface of the solar cell can also have a highly doped layer with an n-type dopant to provide a front surface field that can improve the efficiency of the cell. The effectiveness of a front surface field is described further in an article to Kluska et al., entitled "Loss Analysis of High Efficiency Back-Contact Back-Junction Silicon Sola Cells," 23rd European Photovoltaic Solar Energy Conference and Exhibition, Sep. 1-5, 2008, Valencia, Spain. Front passivation layer 164 can comprise suitable inorganic dielectric materials and dimensions discussed above in the context of dielectric layers 106 and 114. However, in the back contact embodiments, front passivation layer 164 generally does not have holes to provide access to underlying semiconducting material. Also, transparent front protective layer can similarly comprise a polymer, a glass, combinations thereof or the like. Encapsulant 178 can enclose an individual cell or a plurality of cells in a module with appropriate electrical interconnections, as discussed above for encapsulant 118.

The back side of photovoltaic cell 160 has a patterned structure to provide for separate locations for the opposite poles of the cell. Various patterns and structures are known in the art for forming back contacts, and any reasonable back contact structure generally can be used. The processes for patterning the back contacts are discussed below in the context of silicon inks.

Referring to FIGS. 3 and 4, doped contacts 168, 170 are arranged in a pattern that provides for connection to appropriate current collectors. For back contacts, it is desirable to have a distribution of domains of each dopant type across the surface of the semiconductor so that photocurrent can be efficiently collected. However, the domains of each dopant type should be patterned to provide for placement of a current collector interfaced appropriately with the respective dopant type. Thus, there is a balance of factors in the placement of the doped domains. Back passivation layer 172 generally comprises holes 180 to provide for contact between the respective current collector and the corresponding doped contact. Doped contacts 168, 170 generally extend into the back surface of silicon substrate 162 and may both extend into silicon substrate 162 as well as extend outward from the back surface of silicon substrate 162.

Current collectors 174, 176 are correspondingly patterned to provide electrodes of opposite polarity for the cell. Thus, first current collector 174 makes contact with p-doped contacts 168 through extensions 182 that pass through holes 180. Similarly, second current collector 176 makes contact with n-doped contacts 170 through corresponding holes 180. Current collectors 174, 176 can be formed from a suitable electrically conductive material, such as elemental metal or alloy. Metal current collectors can also function as reflectors to reflect light that passes through the semiconductor material to strike the current collector. Thus, to reflect more light, it can be desirable for current collectors 174, 176 to cover a large fraction of the surface as long as the current collectors of opposite polarity are spaced sufficiently from each other to avoid shorting the cell.

For assembly of cells into a module, it is generally desired to connect a plurality of cell in a series connection to increase the voltage output, although parallel connections can also be included in addition or as an alternative to increase current. For a set of series connected photovoltaic cells, the voltages are additive, and the current output is limited to the lowest value of current generation for the series of cells. To increase energy production for a set of photovoltaic cells, it is desirable for cells connected in series to have similar values of current generation. It has been found that dynamic measurements of the semiconductor properties on the silicon core of a silicon based photovoltaic cell can be used for dynamic selection of cell size. Thus, the specific length can be selected within a particular range based on real time measurements of the semiconducting properties, such as minority carrier lifetimes, such that cell current generation can be more evenly matched. Optical measurements can be made to obtain estimates of minority carrier lifetimes. Optical measurements for dynamic solar cell design are described further in published U.S. patent application 2008/0202577 to Hieslmair, entitled "Dynamic Design of Solar Cell Structures, Photovoltaic Modules and Corresponding Processes," incorporated herein by reference.

Silicon Inks and Other Liquid Dopant Sources

In some embodiments, inks of silicon nanoparticles can be deposited for the delivery of a dopant for the formation of doped contacts and other doped semiconductor structures. In some embodiments, other liquid dopant sources can be used, such as doped silica inks, and these other liquid dopant sources are described further below. The formulation of the silicon inks can be selected to provide for appropriate depositing, e.g., printing of the inks, as well as for the desired processing of the deposited silicon nanoparticles to form the desired structures from the deposits formed from the inks. Silicon inks of particular interest herein are formed from dispersions comprising a dispersing liquid and silicon nanoparticles dispersed within the liquid along with optional additives. Generally, silicon nanoparticles, e.g., doped silicon nanoparticles, generally are collected as a powder, which are then dispersed as a step in forming the ink. The dispersion can be stable with respect to avoidance of settling over a reasonable period of time, generally at least an hour, without further mixing. The properties of the dispersion can then be adjusted to form a suitable ink, i.e. the dispersion is suitable for printing. More particularly, the properties of the ink can be adjusted for the particular printing method. For example, the viscosity of the ink can be adjusted for the particular use, such as inkjet printing or screen printing, and particle concentrations and additives provide some additional parameters to adjust the viscosity and other properties. The availability to form stable dispersions with small secondary particle sizes provides the ability to form certain inks that are not otherwise available.

Silicon nanoparticles can be synthesized, for example, using laser pyrolysis, although other synthesis methods can be used if the satisfactory particle properties are obtained. It may be desirable for the silicon particles to be uniform with respect to particle size and other properties. Specifically, it may desirable for the particles to have a uniform primary particle size, and processing may be significantly dependent on the average primary particle size. In some embodiments, it may be desirable for the primary particles to be substantially unfused. Physical particles refer to particles accounting for any hard fusing that may be present. Processing of the particles can depend on both the primary particle size and the physical particle size. So some fusing of the primary particles can be acceptable to obtain a smaller average primary particle size. In general, if the degree of fusing is controlled within acceptable parameters and the primary particles are uniform with a desired small average diameter, the particles generally can be dispersed to yield a smaller and relatively uniform secondary particle size in the dispersion.

Primary particle size can be determined by examination of transmission electron micrographs ("TEM") of the as-synthesized silicon nanoparticle powders. For silicon inks of interest herein, the inks can be desirably formed from a collection of silicon nanoparticles with an average primary particle diameter of no more than about 100 nm, in further embodiments from about 1 nm to about 75 nm, and in other embodiments from about 2 nm to about 50 nm. A person of ordinary skill in the art will recognize that additional ranges of average primary particle diameter within the explicit ranges above are contemplated and are within the present disclosure. The primary particles can have very high uniformity with respect to having a narrow peak of the particle size distribution and lacking a tail in the particle size distribution. In general, TEM micrographs can also be used to evaluate physical particle sizes. Secondary particle size refers to measurements of particle size within a dispersion and is discussed in the context of dispersions below.

In general, it is desirable to form a good dispersion of particles from dry, as-synthesized powder, prior to subsequent processing steps employed to achieve desirable ink properties. Better dispersions are more stable and/or have a smaller secondary particle size indicating less agglomeration. The particles do not need to be stably dispersed initially if the particles are subsequently transferred to another liquid in which the particles form a good dispersion. Better dispersions generally can comprise a solvent that is relatively more compatible with the particles based on the particles' surface chemistry and interparticle interactions. It can therefore be desirable to modify the surface chemistry of the particles to form better dispersions. Furthermore, it can also be desirable use surfactants to form better dispersions. Surfactants are discussed as additional compositions, below. However, while surface modification of particles and the use of surfactants can result in better dispersions, desirable inks can be formed without surface modification and without surfactants at high particle concentrations and with good deliverability. Furthermore, the ability to form desired inks without surface modification can be useful of the formation of desired devices with a lower level of contamination. Notwithstanding the composition of the initial dispersion, shear, stirring, sonication or other appropriate mixing conditions can be applied to facilitate the formation of the dispersion.

As used herein, stable dispersions have no settling without continuing mixing after one hour. With respect to stability, in some embodiments, the dispersions exhibit no settling of particles without additional mixing after one day and in further embodiments after one week, and in additional embodiments after one month. In general, dispersions with well dispersed particles can be formed at concentrations of at least up to 30 weight percent inorganic particles. Generally, for some embodiments it is desirable to have dispersions with a particle concentration of at least about 0.05 weight percent, in other embodiments at least about 0.25 weight percent, in additional embodiments from about 0.5 weight percent to about 25 weight percent and in further embodiments from about 1 weight percent to about 20 weight percent. A person of ordinary skill in the art will recognize that additional ranges of stability times and concentrations within the explicit ranges above are contemplated and are within the present disclosure.

With respect to secondary particle size, size refers to measurements of particle size within a dispersion. In general, the secondary particles size can be expressed as a cumulant mean, or Z-average particle size as measured with dynamic light scattering (DLS). The Z-average particle size is based on a scattering intensity weighted distribution as a function of particle size. Evaluation of this distribution is prescribed in ISO International Standard 13321, Methods for Determination of Particle Size Distribution Part 8: Photon Correlation Spectroscopy, 1996, incorporated herein by reference.

In some embodiments, the Z-average particle size is no more than about 1 micron, in further embodiments no more than about 250 nm, in additional embodiments no more than about 100 nm, in other embodiments no more than about 75 nm and in some embodiments from about nm to about 50 nm. With respect to the particle size distribution, in some embodiment, essentially all of the secondary particles can have a size no more than 5 times the Z-average secondary particle size, in further embodiments no more than about 4 times the Z-average particle size and in other embodiments no more than about 3 times the Z-average particle size. Furthermore, the DLS particle size distribution can have in some embodiments a full width at half-height of no more than about 50 percent of the Z-average particle size. Also, the secondary particles can have a distribution in sizes such that at least about 95 percent of the particles have a diameter greater than about 40 percent of the Z-average particle size and less than about 250 percent of the Z-average particle size. In further embodiments, the secondary particles can have a distribution of particle sizes such that at least about 95 percent of the particles have a particle size greater than about 60 percent of the Z-average particle size and less than about 200 percent of the Z-average particle size. A person of ordinary skill in the art will recognize that additional ranges of particle sizes and distributions within the explicit ranges above are contemplated and are within the present disclosure.

Furthermore, the formation of a good dispersion with a small secondary particle size can be facilitated through the matching of the surface chemistry of the particles with the properties of the dispersing liquid. The surface by its nature represents a termination of the underlying solid state structure of the particle and can comprise truncation of the silicon lattice. The termination of particular particles influences the surface chemistry of the particles. In particular, it is easier to disperse the particles to form smaller secondary particle sizes if the dispersing liquid and the particle surfaces are chemically compatible (e.g. the formation of dispersions with polar solvents is facilitated if the particles have polar groups on the particle surface), although other parameters such as density, particle surface charge, solvent molecular structure and the like also directly influence dispersability. In some embodiments, the liquid may be selected to be appropriate for the particular use of the dispersion, such as for a printing process. The surface properties of the particles can correspondingly be adjusted for the dispersions.

The surface chemistry of particles can be influenced during synthesis of the particles and/or following collection of the particles. For example, silicon synthesized using silanes generally is partially hydrogenated, i.e., the silicon includes some small amount of hydrogen in the material. It is generally unclear if this hydrogen or a portion of the hydrogen is at the surface as Si—H bonds. With respect to surface modification during synthesis, the nature of the reactants, reaction conditions, and by-products influences the surface chemistry of the particles collected as a powder during flow reactions. In some embodiments, the silicon particles can become surface oxidized, for example through exposure to air. For these embodiments, the surface can have bridging oxygen atoms in Si—O—Si structures or Si—O—H groups if hydrogen is available during the oxidation process.

With respect to surface modification after particle collection, desirable properties can be obtained through the use of surface modification agents that chemically bond to the particle surface. The surface chemistry of the particles influences the selection of desirable surface modification agents. For example, alkoxysilanes can bond with silicon oxides at the surface of silicon particles to form Si—O—Si bonds to form a stable surface coating that can improve the dispersability and other surface properties of the surface modified particles. Furthermore, it can also be desirable to functionalize the surface of the particles prior to using a surface modification agent to improve or facilitate bonding between the particle and the surface modification agent. Suitable surface modification agents and the use thereof are described in published U.S. patent application 2008/0160265 to Hieslmair et al., entitled "Silicon/Germanium Particle Inks, Doped Particles, Printing, and Processes for Semiconductor Applications," incorporated herein by reference. While surface modified particles can be designed for use with particular solvents, desirable inks can be formed without surface modification at high particle concentrations and with good deliverability. The ability to form desired inks without surface modification can be useful for the formation of desired devices with a lower level of contamination.

Based on a particular deposition approach and use for a silicon ink, there may be fairly specific target properties of the inks as well as the corresponding liquids used in formulating the inks. Tailoring dispersion properties for a particular application or processing step can comprise changing solvent, using solvent blends, and/or evaporating solvent. With respect to changing solvents, the particles can be processed in a first solvent that facilitates processing and subsequently transferred to a second solvent with more desirable ink properties. With respect to solvent blends, a low boiling temperature solvent component can evaporate quickly after printing to stabilize the printed ink prior to further processing and curing. A higher temperature solvent component can be used to adjust the viscosity to limit spreading after printing. With respect to solvent evaporation, the particle concentration of the dispersion can be increased by evaporating solvent without destabilizing the dispersion. Methods for changing solvent, using solvent blends, and evaporating solvents are discussed in U.S. provisional patent application Ser. No. 13/070,286 to Chiruvolu et al., entitled "Silicon/Germanium Nanoparticle Inks, Laser Pyrolysis Reactors for the Synthesis of Nanoparticles and Associated Methods," incorporated herein by reference.

Furthermore, dispersions can include additional compositions besides the silicon particles and the dispersing liquid or liquid blend to modify the properties of the dispersion to facilitate the particular application. For example, property modifiers can be added to the dispersion to facilitate the deposition process. Surfactants can be effectively added to the dispersion to influence the properties of the dispersion.

In general, cationic, anionic, zwitter-ionic and nonionic surfactants can be helpful in particular applications. In some applications, the surfactant further stabilizes the particle dispersions. For these applications, the selection of the surfactant can be influenced by the particular dispersing liquid as well as the properties of the particle surfaces. In general, surfactants are known in the art. Furthermore, the surfactants can be selected to influence the wetting or beading of the dispersion/ink onto the substrate surface following deposition of the dispersion. In some applications, it may be desirable for the dispersion to wet the surface, while in other applications it may be desirable for the dispersion to bead on the surface. The surface tension on the particular surface is influenced by the surfactant. Also, blends of surfactants can be helpful to combine the desired features of different surfactants, such as improve the dispersion stability and obtaining desired wetting properties following deposition. In some embodiments, the dispersions can have surfactant concentrations from about 0.01 to about 5 weight percent, and in further embodiments from about 0.02 to about 3 weight percent.

Viscosity modifiers can be added to alter the viscosity of the dispersions. Suitable viscosity modifiers include, for example soluble polymers, such as polyacrylic acid, polyvinyl pyrrolidone and polyvinyl alcohol. Other potential additives include, for example, pH adjusting agents, antioxidants, UV absorbers, antiseptic agents and the like. These additional additives are generally present in amounts of no more than about 5 weight percent. A person of ordinary skill in the art will recognize that additional ranges of surfactant and additive concentrations within the explicit ranges herein are contemplated and are within the present disclosure.

It can be desirable to remove components of the dispersion prior to formation of the ultimate ink. For example, it can be desirable to remove organic components to the ink prior to or during certain processing steps such that the product materials are effectively free from carbon. In general, organic liquids can be evaporated to remove them from the deposited material. However, surfactants, surface modifying agents and other property modifiers may not be removable through evaporation, although they can be removed through heating at moderate temperature in an oxygen atmosphere to combust the organic materials.

The dispersions/inks can be formed using the application of appropriate mixing conditions. For example, mixers/blenders that apply shear can be used and/or sonication can be used to mix the dispersions. Furthermore, it can be desirable to increase the particle concentration of a dispersion/ink relative to an initial concentration used to form a good dispersion such as through evaporation of solvent. Similarly, solvent blends can be formed. A lower boiling solvent component can be removed preferentially through evaporation. Solvent blends can be particularly useful for the formation of ink compositions since the blends can have liquid that contribute desirable properties to the ink. A low boiling temperature solvent component can evaporate relatively quickly after printing to stabilize the printed ink prior to further processing and curing. A higher temperature solvent component can be used to adjust the viscosity to limit spreading after printing. Thus, for many printing applications, solvent blends are desirable.

With respect to inks desirable for inkjet printing, the viscosity is particularly relevant, although other printing and coating processes may have desired viscosity ranges. The viscosity of a dispersion/ink is dependent on the silicon particle concentration as well as the other additives, such as viscosity modifier. Thus, there are several parameters that provide for adjustment of the viscosity. For some embodiments, the viscosity can be from 0.1 mPa·s to about 100 mPa·s and in further embodiments from about 0.5 mPa·s to about 25 mPa·s. For some embodiments, the dispersions/inks can have a surface tension from about 2.0 to about 6.0 N/m$^2$ and in further embodiments from about 2.2 to about 5.0 N/m$^2$ and in additional embodiments form about 2.5 to about 4.5 N/m$^2$. A person of ordinary skill in the art will recognize that additional ranges of viscosity and surface tension within the explicit ranges above are contemplated and are within the present disclosure.

With respect to inks desirable for screen printing, the formulations are prepared as a paste that can be delivered through the screen. The screens generally are reused repeatedly. The solvent systems for the paste should be selected to both provide desired printing properties and to be compatible with the screens so that the screens are not damaged by the paste. The use of a solvent blend provides for the rapid evaporation of a low boiling temperature solvent while using a higher boiling solvent to control the viscosity. The high boiling solvent generally can be removed more slowly without excessive blurring of the printed image. After removal of the higher boiling temperature solvent, the printed silicon particles can be cured, or further processed into the desired device. Suitable lower boiling point solvents include, for example, isopropyl alcohol, propylene glycol or combinations thereof. Suitable higher boiling point solvents include, for examples, N-methyl pyrrolidone, dimethylformamide, terpineols, such as α-terpineol, Carbitol, butyl Cellosolve, or combinations thereof. The screen printing paste can further include a surfactant and/or a viscosity modifier.

In general, the screen printable ink or paste are very viscous and can be desired to have a viscosity from about 10 Pa·s to about 300 Pa·s, and in further embodiments from about 50 Pa·s to about 250 Pa·s. The screen printable inks can have a silicon particle concentration from about 5 weight percent to about 25 weight percent silicon particles. Also, the screen printable inks can have from 0 to about 10 weight percent lower boiling solvent, in further embodiments from about 0.5 to about 8 and in other embodiments from about 1 to about 7 weight percent lower boiling solvent. The description of screen printable pastes for the formation of electrical components is described further in U.S. Pat. No. 5,801,108 to Huang et al., entitled "Low Temperature Curable Dielectric Paste," incorporated herein by reference, although the dielectric paste comprises additives that are not suitable for the semiconductor pastes/inks described herein.

The formation of doped silicon inks for various deposition approaches is described further in copending U.S. provisional patent application Ser. No. 13/070,286 to Chiruvolu et al., entitled "Silicon/Germanium Nanoparticle Inks, Laser Pyrolysis for the Synthesis of Nanoparticles and Associated Methods," incorporated herein by reference.

In some embodiments, inks comprising doped silica nanoparticles can be used. Uniform silica nanoparticles can be synthesized, for example, with laser pyrolysis. The formation of a silica ink depends on the ability to form good dispersions of the silica nanoparticles. The formation of doped silica nanoparticle inks from corresponding good dispersions is described further in published U.S. patent application 2008/0160733 to Hieslmair et al., entitled "Silicon/Germanium Oxide Particle Inks, Inkjet Printing, and Processes for Doping Semiconductor Substrates," incorporated herein by reference. The doped silica inks can be adapted for the deposition and dopant drive-in applications described herein.

In general, other dopant containing liquids can be used for some embodiments, such as embodiments based on a capping layer. For example, phosphorous or boron containing liquids can be deposited. In particular, suitable inks can comprise, for example, trioctyl phosphate, phosphoric acid in ethylene glycol and/or propylene glycol or boric acid in ethylene glycol and/or propylene glycol. Concentrations can be adjusted to achieve desired ink properties.

Composites with Glass/Ceramic Precursors

Glass/ceramic precursors, such as a spin-on glass or a sol-gel, can be formulated into composites with a doped silicon ink or a doped silica ink as a material that supplies a desired dopant element as well as forming a self capping material. As described herein, glass/ceramic precursors can be used as an inorganic capping material to facilitate the dopant drive-in process, possibly through the reduction of vaporization of the dopant element. The composite of the silicon ink or silica ink with the glass/ceramic precursor can be used to form a suitable deposit to support the dopant drive-in with a single deposition step. In general, the glass/ceramic precursor can be heated to an appropriate temperature to drive the transformation of the precursor composition substantially into the corresponding glass or ceramic material. The composite can be formed through the combination of the precursor composition and the doped ink composition comprising doped silicon nanoparticles, doped silica nanoparticles or a combination thereof.

Suitable glass/ceramic precursor compositions include, for example, spin-on glasses and sol-gel compositions. Spin-on glasses are silicon-based purely inorganic compositions or organic/inorganic compositions that react to form silica glass, generally through a decomposition reaction upon heating. Spin-on glasses may or may not also include dopants. Various doped spin-on glass compositions are commercially available. For example, doped spin-on-glasses are available from Desert Silicon (AZ, USA). Spin-on-glass compositions can comprise polysilazane polymers in a suitable organic solvent, such as an ether or an aromatic solvent, and the polysilazane polymer can be cured in an oxygen atmosphere to form silicon oxide. Polysliazane compositions for spin-on glasses are described in U.S. Pat. No. 7,270,886 to Lee et al., entitled "Spin-On Glass Compositions and Method of Forming Silicon Oxide Layer Semiconductor Manufacturing Process Using the Same," incorporated herein by reference. Spin-on glass formulations with polyorganosiloxanes are described in U.S. Pat. No. 5,302,198 to Allman, entitled "Coating Solution for Forming Glassy Layers," incorporated herein by reference. The '198 Allman patent describes the introduction of boron or phosphorous dopants at levels of about 5 to 30 weight percent.

Suitable sol-gel compositions and similar liquid precursor compositions are known in the art. For example, sol-gel compositions for the formation of silica glass materials are described in published U.S. patent application 2002/0157418 to Ganguli et al., entitled "Process for Reducing or Eliminating Bubble Defects in Sol-Gel Silica Glass," incorporated herein by reference. The formation of a ceramic titanium oxide material from a sol-gel is described in published U.S. patent application 2009/0269487 to Es-Souni, entitled "Process for Producing a Sol-Gel Absorber Coating for Solar Heating," incorporated herein by reference.

The selection of the doped ink properties can be adjusted accordingly such that the ultimate composite has desired properties. Similarly, the glass/ceramic precursor properties, such as solvent composition and concentration can also be adjusted prior to combination with the silicon ink to achieve a desired composite. In general, the composite comprises the glass/ceramic precursor solids, i.e., allowing for solvent removal, in an amount from about 2.5 weight percent to about 40 weight percent, in further embodiments from about 5 to about 37 weight percent and in other embodiments from about 10 to about 35 weight percent. Also, the composite generally comprises from about 0.5 weight percent to about 30 weight percent silicon and/or silica nanoparticles, in further embodiments from about 1 weight percent to about 25 weight percent particles and in other embodiments from about 2 weight percent to about 20 weight percent silicon and/or silica nanoparticles. As with other dopant inks, the glass/ceramic precursor-doped particle composite can comprise suitable property modifiers. In general, suitable solvents, e.g., solvent blends, can be selected that are appropriate to form a well blended composite formulation. A person of ordinary skill in the art will recognize that additional ranges of composite compositions within the explicit ranges above are contemplated and are within the present disclosure.

To form the composite, a reasonable dispersion is formed with the doped silicon and/or silica nanoparticles, and a glass/ceramic precursor (precursor) composition can be gradually added to the silicon particle dispersion or the silicon particle dispersion can be gradually added to the precursor composition. The blending of the precursor composition with the doped nanoparticle dispersion is generally performed under good mixing conditions. It is desirable to form a composite with good distribution of the doped nanoparticles through the composite formulation. In some embodiments, the composite can be formed prior to use and stored for a reasonable period of time. In additional or alternative embodiments, the composite can be formed shortly prior to use.

Deposition of the Dopant Inks

The doped particle dispersions/inks can be deposited using a selected approach, such as a coating process or a printing process. The deposition approach can be selected to achieve a desired deposit of the doped ink on a substrate. In particular, coating techniques can be desirable for coating a substrate with a dispersion/ink, and printing techniques can be desirable in particular for depositing a dispersion/ink in a pattern on a substrate. Following deposition, the deposited material can be further processed. For example, the dopant from a deposited doped nanoparticle ink can be driven into a silicon substrate. Selected doped composites can be deposited with at least some of these deposition approaches, such as coating approaches and/or screen printing.

Suitable coating approaches for the application of the doped nanoparticle inks include, for example, spin coatings, dip coating, spray coating, knife-edge coating, extrusion or the like. In general, any suitable coating thickness can be applied, although in embodiments of particular interest, the average coating thickness can range from about 10 nm to about 10 microns, in further embodiments from about 50 nm to about 5 microns and in other embodiments from about 100 nm to about 2 microns. A person of ordinary skill in the art will recognize that additional ranges of thicknesses within the particular ranges above are contemplated and are within the present disclosure.

Similarly, various printing techniques can be used to print the doped nanoparticle ink into a pattern on a substrate. Patterning generally comprises depositing an ink at particular locations on the surface of substrate. The selection of a pattern can be made with respect to the particular application. For some applications, a pattern can comprise a single continuous region of ink on the substrate surface, while for other applications a pattern can comprise a plurality of isolated regions of an ink on the substrate surface such that each ink region does not contact any other ink region. For some applications, it can be desirable to form a plurality of patterns, each pattern comprising a different ink composition, which may comprise different dopants. Patterning can be particularly desirable for applications in which the deposited ink is used as a dopant source. In such applications, an ink comprising doped nanoparticles or other liquid dopant is first patterned onto a substrate surface. Subsequently, at least some of the dopant is diffused, e.g. by thermal processing, from the particles into the surface of the substrate, thereby creating a dopant pattern within the substrate ("doped region") having substantially the same pattern as the deposited ink. A plurality of doped regions can be created by repeating this procedure. At each iteration, a doped ink, comprising a different dopant, can be patterned on to the substrate surface prior to dopant diffusion. Additionally or alternatively, a plurality of doped regions can be created by first forming a plurality of patterns on the substrate surface, each pattern formed from a doped silicon ink comprising a different dopant. Subsequently, dopant can be simultaneously diffused from each doped ink location into the substrate. Suitable printing techniques include, for example, screen printing, inkjet printing, lithographic printing, gravure printing and the like.

While various coating and printing approaches are suitable, inkjet printing offers desirable features for some applications with respect to speed, resolution and versatility with respect to real time selection of deposition patterning while maintaining speed and resolution. Practical deposition using inkjet printing with inorganic particles requires dispersion properties that involve both the techniques to form high quality silicon and/or silica nanoparticle along with the improved ability to form high quality dispersions from these particles. Thus, the particles produced using laser pyrolysis combined with the improved surface modification approaches and dispersion techniques provides for the formation of inks that are amenable to inkjet deposition.

Similarly, screen printing can offer desirable features for printing silicon and/or silica inks for some applications. In particular, screen printing may already be tooled for a particular use. Thus, the substitution of the doped nanoparticle inks for other materials in a production line may be performed with reduced capital expenses. Also, the pastes for screen printing may have a greater doped nanoparticle concentration relative to concentrations suitable for other deposition approaches. In particular, the silicon particles and processes described herein are suitable for forming good quality pastes for screen printing. The successful inkjet printing and screen printing of highly doped silicon inks is described in copending provisional application Ser. No. 13/070,286 to Chiruvolu et al., entitled "Silicon/Germanium Nanoparticle Inks, Laser Pyrolysis for the Synthesis of Nanoparticles and Associated Methods," incorporated herein by reference.

In general, following deposition, the liquid evaporates to leave the doped nanoparticles and any other non-volatile components of the inks remaining. In general, the deposition can be performed on any suitable substrate, but for the performance of dopant drive-in as described herein for the formation of crystalline silicon solar cells, the substrate comprises a surface of crystalline silicon. Once the solvent and optional additives are removed, the silicon particles can then be further processed for dopant drive-in.

Dopant Drive In

A successful dopant drive-in has been found to be enabled by the appropriate capping of a deposit of a dopant ink, such as a doped silicon ink. The dopant drive-in of particular interest involves a silicon substrate and doped silicon and/or silica nanoparticles as a dopant source, which can be deposited, for example, using a doped nanoparticle ink. The dopant drive-in can result in a highly doped surface region on the silicon substrate. Suitable caps on the crystalline silicon surface over the deposit of dopant source material include, for example, slabs placed over the surface, a cover that contacts a portion of the surface, a cover that does not touch the surface, or an inorganic coating over the surface. The caps evidently inhibit the vaporization of dopant atoms during the heating to perform dopant drive-in. In particular, an inorganic cap layer can reduce or eliminate loss of dopant element from the deposit formed from a silicon ink through the physical restriction imposed by the capping layer. The entrapment of the dopant element near the site of the dopant drive-in does not have to be based on a complete sealing of the area, but it should be sufficient that the driving force for the dopant drive-in results in a desired degree of dopant drive-in into the silicon substrate at the location of the deposit of dopant source material. The dopant drive-in can be performed using a heating step, and a desired level of dopant drive-in can be achieved from a deposit of doped silicon ink or other dopant source material with a suitable cap.

Figure 5:
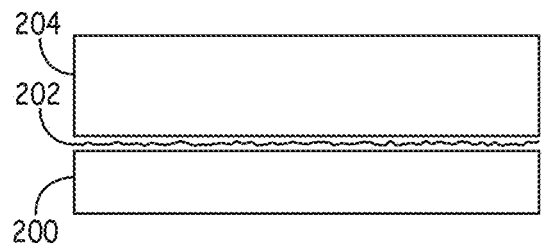
FIG. 5 is a sectional side view of a silicon substrate with a silicon ink deposit and a capping slab.

Various cap designs can be used to stabilize the dopant drive-in, and the suitability of the caps are verified in the Examples below. Referring to FIG. 5, substrate 200 with a deposit of dopant source material, e.g., doped silicon nanoparticles, 202 is capped with a slab 204 that is resting on the surface of substrate 200 along deposit 202. As shown in the Examples, the use of a slab, specifically a silicon wafer or a silicon wafer with a quartz plate, placed over the silicon wafer is effective to facilitate the dopant drive-in. The slab should be selected to be stable at the temperature of the dopant drive-in and to be free of elements that can migrate to the silicon as a contaminant. Suitable materials are discussed further below.

Figure 6:
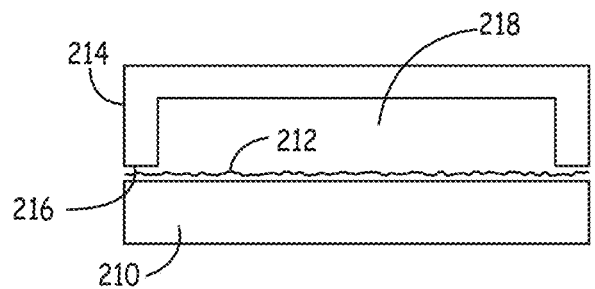
FIG. 6 is a sectional side view of a silicon substrate with a silicon ink deposit and a cover that rests on an edge along the substrate surface.
Figure 7:
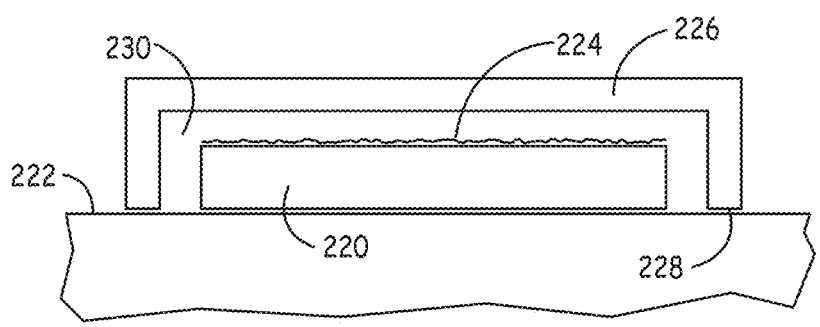
FIG. 7 is a sectional side view of a silicon substrate with a silicon ink deposit and a cover that does not contact the silicon substrate.
Figure 8:
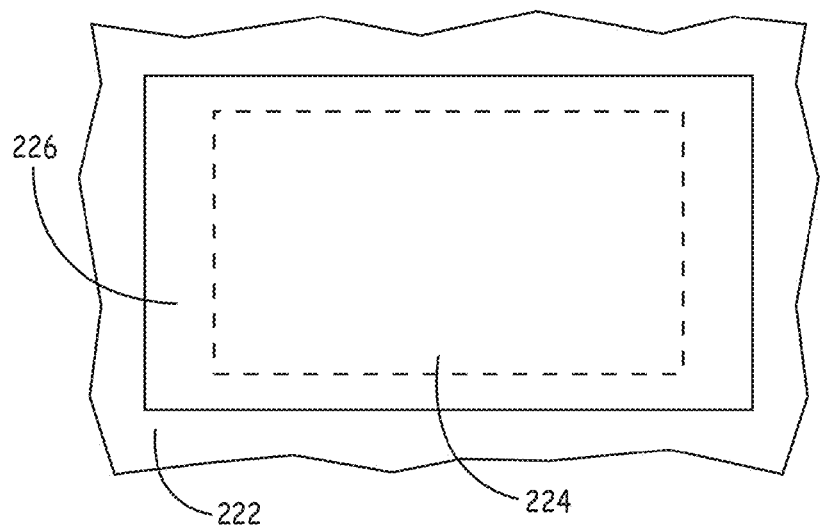
FIG. 8 is a top view of the covered silicon substrate of FIG. 7 in which the sectional view of FIG. 7 is indicated along line 7-7.

As shown in FIG. 6, substrate 210 with a deposit 212 of dopant source material is capped with a cover 214 that rests along edge 216 on deposit 212. The particular shape of cover 214 generally is not expected to be significant as long as cover 214 covers deposit 212 and a volume 218 under cover 214 is effectively isolated from the ambient atmosphere and is not excessively large. The edge extends around to enclose the volume, although a tight seal may not be formed and generally is not significant with respect to obtaining desired dopant drive-in as long as a reasonable seal is formed. Another embodiment of a cover is shown in FIG. 7. Substrate 220 rests on support surface 222 and has a deposit 224 of dopant source material along the top surface. Cover 226 has an edge 228 that rests on support surface 222 and does not contact substrate 220 or deposit 224. Cover 226 has a potential advantage of not disturbing deposit 224 and avoiding the placement of weight onto substrate 220. As with cover 214 with edge 216, edge 228 extends to enclose a volume 230. A top view of cover 226 is shown in FIG. 8.

As noted above, a suitable material for a capping slab or cover generally comprises a material that is stable at the temperatures of the dopant drive-in and is substantially free of elements that could migrate and contaminate the substrate. Suitable materials include, for example, silicon, amorphous silicon oxide, e.g., silica based glass, quartz, silicon nitride, silicon carbide, aluminum oxide, or other ceramic materials. A slab or cover can be designed with appropriate mechanical integrity suitable for commercial use and reuse. A cover or slab can be appropriately cleaned, e.g., by etching, between uses if appropriate.

Figure 9:
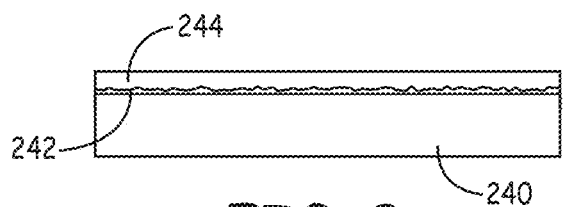
FIG. 9 is a sectional side view of a silicon substrate with a silicon ink deposit and a cover layer.

The embodiments in FIGS. 5-8 rely on a cap provided by the physical placement of a structure to provide some isolation of the doped silicon ink from the ambient atmosphere. Thus, there generally is no binding of the cap, e.g., cover, with the substrate or doped deposit. In additional or alternative embodiments, a coating layer or capping layer can be deposited to cap the doped deposit of dopant source material, e.g., doped silicon nanoparticles. Referring to FIG. 9, substrate 240 has a deposit 242 of dopant source material along its surface and a capping layer 244 to provide a cap over deposit 242. A spin-on glass or other suitable material can be used to form capping layer 244. In particular, other suitable materials include, for example, sol-gel materials and other glass/ceramic precursor material discussed above in the context of the composite compositions. A coating can provide an advantage of isolating individual locations of patterned doped deposits from each other to reduce dopant migration from locations of the particular deposit.

The material for a capping layer, i.e., coating, can be selected such that the capping layer remains intact at the temperature of the dopant drive-in. For example, a spin-on glass can be used as a suitable inorganic capping material. While the capping layer can be kept in the structure for incorporation into an actual device, for example, as a dielectric layer, in some embodiments the capping layer is removed after the dopant drive-in step, for example, using a suitable etch.

The capping layer can be formed over an entire surface, or the material of the capping layer can be patterned, e.g., based on the patterning of deposits formed with one or more doped inks. Suitable coating and patterning approaches are described with respect to the silicon inks, and these processes can be adapted for the capping layers formed with glass/ceramic precursor materials, although photolithography methods, such as known methods used in the semiconductor field, can be alternatively used to deposit and/or pattern the capping layer for a broader range of materials. If an entire surface is covered with the capping layer, doped deposits can be well covered by the capping layer without aligning respective patterns of doped inks and capping material.

In general, the capping layer can be made sufficiently thick to satisfy the capping function, although it can be desirable to use less capping material while maintaining the capping function to reduce waste of material. An appropriate thickness for a capping layer generally can depend on the composition of the capping layer. For some inorganic materials of interest, the capping layer can have a thickness from about 100 nm to about 50 microns, in further embodiments from about 250 nm to about 20 microns, and in other embodiments from about 500 nm to about 10 microns. A person of ordinary skill in the art will recognize that additional ranges of capping layer thickness within the explicit ranges above are contemplated and are within the present disclosure.

In general, inorganic ceramic compositions may be suitable to use as a capping material if they are selected to have a melting temperature reasonably above the dopant drive-in temperature. However, glass/ceramic precursor materials, e.g., spin-on glasses or sol-gel compositions, can be convenient based on the availability of efficient application methods, such as spin coating, spray coating or the like. Spin-on glasses and other glass/ceramic precursor materials are described further above. Since the dopant drive-in process can introduce dopants into the capping material, it can be desirable to remove the capping material rather than to maintain the capping material as a passivation layer, although the capping layer can be maintained as a passivation layer or a portion thereof in some embodiments. The cured glass/ceramic precursor materials can generally be removed after the dopant drive-in using a suitable etch. An initial heating step or steps can be performed, e.g., at a lower temperature than the dopant drive-in to cure the glass/ceramic precursor material.

Specifically, an initial heating step can be performed to remove solvent from the glass/ceramic precursor material deposit. This heating step can be performed at a temperature, for example, from about 100° C. to about 400° C. and for a time from about 1 minute to about 1 hour, although longer times can be used if desired. Then, the glass/ceramic precursor material can be cured to form a corresponding glass and/or ceramic material, such as silica. The curing step can be performed according to appropriate specifications for a particular precursor material. In general, the cure of the precursor into a silica glass or other glass/ceramic material can be performed at a temperature from about 300° C. to about 800° C. and in further embodiments from about 400° C. to about 700° C. The curing can be performed for a time from about 1 minute to about 5 hours, and in further embodiments from about 5 minutes to about 3 hours. It may not be significant for the glass/ceramic precursor to be fully cured, although it can be fully cured. A person of ordinary skill in the art will recognize that additional ranges of processing times and temperatures related to the SOG processing within the explicit ranges above are contemplated and are within the present disclosure.

Figure 10:
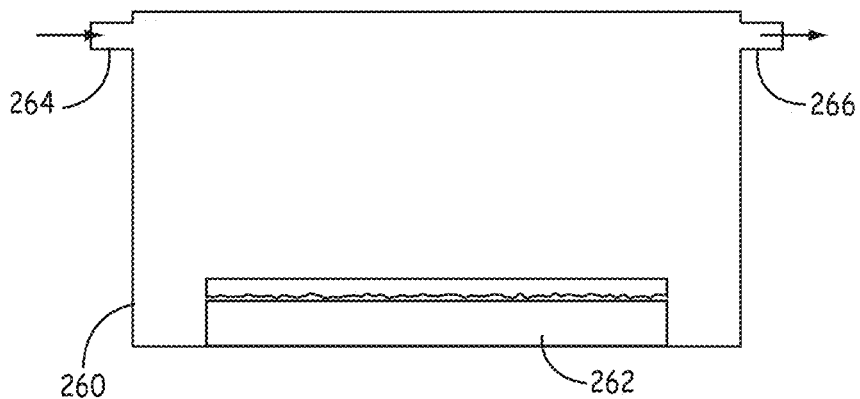

The dopant drive-in can be performed in an oven or the like to heat the substrate with the deposit of dopant source material to drive the dopant elements into the substrate surface. A selected cap generally is provided to facilitate the process. A schematic view of an oven to perform the drive-in process is shown in FIG. 10. Oven 260 holds substrate 262 that has a suitable doped deposit and a cap. Oven 260 can comprise an inlet 264 and an outlet 266 or the like to provide for control of the atmosphere in the oven, the pressure and/or for maintaining a continuous flow through at least a portion of process. For example, an oxygen containing atmosphere can be provided to facilitate curing of a glass/ceramic precursor material, while a substantially oxygen free atmosphere may be used during the dopant drive-in step. In some embodiments, oxygen can be introduced to oxidize silicon particles during and/or after a dopant drive-in step. Various embodiments of capped substrates are described in detail above, and generally a selected substrate and cap can be used for substrate 262.

The dopant drive-in generally can be performed at a temperature from about 700° C. to about 1400° C., in further embodiments from about 725° C. to about 1200° C., and in other embodiments from about 750° C. to about 1100° C. The dopant drive-in can be performed for about 5 minutes to about 6 hours, in further embodiments for about 10 minutes to about 3 hours and in additional embodiments for about 15 minutes to about 2 hours. A person of ordinary skill in the art will recognize that additional ranges of dopant processing temperatures and times within the explicit ranges above are contemplated and are within the present disclosure. The dopant profile within the substrate surface may depend to some degree on the dopant drive-in parameters and the selection of the processing parameters may be influenced by the target dopant profile after the dopant drive-in.

For appropriate embodiments, some of the doped silicon inks densify along the surface into doped silicon deposits. In general, the densified silicon material from the nanoparticles may not be epitaxial, but the material can be effectively fully densified. Remaining undensified silicon inks, generally highly porous, can be located over the densified deposited silicon. Any undensified silicon material after the dopant drive-in can be removed or densified. It may be desirable to perform a silicon oxide etch after the dopant drive-in. Silicon oxide etch can be performed with a buffered hydrogen fluoride solution or other appropriate solution. Similarly, a plasma etch or other dry etching process can be similarly used. An appropriate etch for silicon oxide or other material can be used to remove relatively quickly a cured glass/ceramic material as well as, in some embodiments, any oxidation of the particles and silicon surface. A buffered oxide etch, can be performed for a few minutes to several hours, although a person of ordinary skill in the art will appreciate that all subranges within this range of times are contemplated.

In some embodiments, if porous silicon remains after the silicon oxide etch, the silicon can be etched. Suitable silicon etchants are known in the art, such as KOH and tetramethylammonium hydroxide. Due to the high surface area, the undensified silicon remaining on the surface is more rapidly etched than the silicon surface so that the remaining undensified silicon particles can be effectively removed even if partially fused without removing an excessive amount of the silicon substrate. The silicon etch can be performed for a time from about 5 minutes to about 5 hours, although a person of ordinary skill in the art will appreciate that all subranges within this range of times are contemplated.

Figure 11:
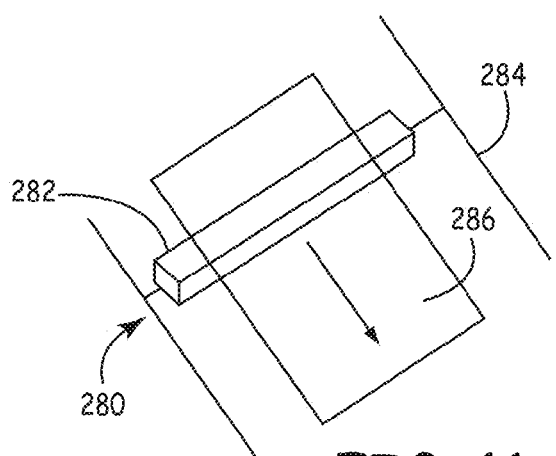
FIG. 11 is a schematic view of a rapid thermal processing apparatus with a heat lamp.

Similarly, undensified silicon remaining from silicon nanoparticles can be effectively and rapidly densified with a rapid thermal process. The densified silicon can provide a good contact point for connection to a current collector so that the structure following densification of the silicon nanoparticles can be incorporated into the ultimate structure without further processing. For example, the densification of the remnants of the silicon nanoparticles can be accomplished with a heat lamp, such as a xenon heat lamp. The radiation from the heat lamp can be scanned relatively rapidly across the substrate surface to densify the silicon. The intensity and irradiation times can be selected to densify the silicon deposits without significantly affecting the silicon substrate. A schematic diagram of a processing apparatus is shown in FIG. 11, although other designs can be used as desired. Processing apparatus 280 comprises a heat lamp 282 that is designed to irradiate a stripe, and a conveyor 284 that moves either heat lamp 282 and/or substrate 286 to achieve their relative motion.

With a silicon nanoparticle dopant source material, after completion of any etching and/or densification steps, the structure after the dopant drive-in generally comprises some densified silicon nanoparticles, as well as possibly a relatively thin region with a blend of initial substrate silicon mixed with densified silicon nanoparticles along the surface with a relatively higher dopant concentration. Below this densified silicon nanoparticle region, a profile of dopant extends into the silicon substrate surface that generally gradually decreases at a larger depth to a bulk or background dopant level, although for thin enough substrates the dopant concentration may just decay to a particular value. Thus, at the surface there is an initial dopant concentration associated with densified ink and/or a layer with silicon nanoparticles mixed with silicon originating from the silicon substrate. Except for surface effects resulting from the silicon nanoparticle material, the dopant profile for the silicon substrate after dopant drive-n with other dopant source material can be similar.

To characterize the remaining portion of the dopant profile, we use two parameters, the dopant concentration at a depth of 100 nm and the depth at a dopant concentration of $1 \times 10^{19}$ dopant atoms per cubic centimeter (atoms/cm$^3$). The dopant profile can be measured using Secondary Ion Mass Spectrometry (SIMS) to evaluate the elemental composition along with sputtering or other etching to sample different depths from the surface. The 100 nm dopant concentration can from about $2 \times 10^{19}$ atoms/cm$^3$ to about $5 \times 10^{21}$ atoms/cm$^3$, in further embodiment from about $5 \times 10^{19}$ atoms/cm$^3$ to about $2.5 \times 10^{21}$ atoms/cm$^3$, and in other embodiments from about $7.5 \times 10^{19}$ atoms/cm$^3$ to about $1 \times 10^{21}$ atoms/cm$^3$. With respect to depth, the dopant profile can have a depth at a dopant concentration of $1 \times 10^{19}$ from about 0.5 microns to about 2.5 microns, in further embodiments from about 0.6 microns to about 2 microns and in other embodiments from about 0.7 microns to about 1.8 microns. A person of ordinary skill in the art will recognize that additional ranges of dopant profile parameters within the explicit ranges above are contemplated and are within the present disclosure.

Following dopant drive-in, the resulting silicon sheet can be characterized with a sheet resistance. The sheet resistance can be measured with a 4-point probe. Measurements with the 4-point probe can then be scaled according to the geometric parameters to obtain the sheet resistance. Based on the doping using doped silicon nanoparticles and the dopant drive-in process as described herein, sheet resistances can be obtained of no more than about 120Ω/□, in further embodiments from about 100Ω/□ to about 1Ω/□, in additional embodiments from about 60Ω/□ to about 5Ω/□, and in other embodiments from about 50Ω/□ to about 10Ω/□. A person of ordinary skill in the art will recognize that additional ranges of sheet resistance within the explicit ranges above are contemplated and are within the present disclosure.

After performing the dopant drive-in and any densification and/or etching steps, the silicon substrate with the particular dopant profile can be assembled into a solar cell. Representative solar cell structures are described above. The characteristics of the dopant profiles described herein and achieved in the examples are suitable for the formation of efficient solar cells.

EXAMPLES

The following examples demonstrate the ability to provide desirable levels of dopant drive-in from highly doped silicon nanoparticles into a silicon substrate. The doped silicon nanoparticles are deposited in the form of an ink/dispersion of the silicon particles.

Example 1

Formation of Ink Coated Silicon Wafers

This example describes the formation of doped silicon ink coated silicon wafer. The following examples describe the dopant drive-in from these inks into the wafer surface. Doped silicon inks were formed from dispersions comprising silicon nanoparticles. Crystalline silicon particles were formed with high levels of doping using laser pyrolysis as described in Example 2 of copending U.S. provisional patent application Ser. No. 13/070,286 to Chiruvolu et al., entitled "Silicon/Germanium Nanoparticle Inks, Laser Pyrolysis Reactors for the Synthesis of Nanoparticles and Associated Methods," incorporated herein by reference. In particular, n++ doped and p++ doped silicon nanoparticles were formed with an average primary particle diameter of about 7 nm or about 20 nm. The particle had 2-4 atomic percent dopant. The particles were then blended with an appropriate amount of a low molecular weight alcohol, such as isopropanol, to form a dispersion. The resulting mixture was then sonicated and centrifuged to form a stable dispersion that as used as an ink for spin coating. The ink thus formed had a silicon particle concentration of about 3-7 weight percent ("wt %").

Silicon nanoparticle coated wafers (ink coated wafers) were prepared by forming an annealed ink layer on the surface of substrate. The substrates comprised a lightly doped, n-type or p-type single crystal silicon wafers. Wafers were obtained from three different suppliers and had a bulk dopant concentration on the order of $4 \times 10^{15}$ atoms/cm$^3$. For dopant drive in experiments as described in these examples, the general silicon substrate characteristics are not believed to be of particular importance. As measured using four point probe ("4PP"), the substrates had a resistance of about 30Ω to about 40Ω, corresponding to a sheet resistance of about 130 Ω/sq to about 170 Ω/sq, respectively. In particular, the resistance of each substrate was measured using a home assembled 4PP station where the distance between two adjacent probes was 1 mm. Four point probe measurements are used to obtain surface resistance readings, in which the raw measurements are proportional to the surface resistance based on a scaling parameter related to the geometry.

Prior to forming an ink layer, the surface of a substrate was cleaned by placing it in a buffered oxide etch ("BOE") solution for about 0.5 min. to about 1 min. The BOE solution comprised 34.86% ammonium fluoride and 6.6% hydrofluoric acid in water. An appropriate amount of ink was applied to a surface of the substrate using spin-coating in a glove-box environment substantially free from contaminant sources at 1000 rpm-1500 rpm for about 10 seconds to about 15 seconds. The ink coated substrate was then dried by heating it at about 85° C. for about 5 minutes on a hotplate to remove the solvent from the ink. The dried ink layer had an average thickness of about 0.5 μm, unless otherwise noted. The thickness of the dried ink layer was measured using a profilometer (α-Step™ 300, KLA Tencore). In order to obtain thickness measurements, a given spin recipe was used to form a dried ink layer on a polished substrate. A stylus in contact with the dried ink layer was then scanned horizontally over a distance of about 0.5 mm to about 1 mm on the dried ink layer and the vertical displacement of the stylus was recorded.

For dopant drive-in described in some examples below, ink coated wafers further comprised a barrier layer comprising a spin-on glass. To form an ink coated wafer with a barrier layer, an ink coated wafer was placed in a furnace and heated under a nitrogen atmosphere at 600° C. for 30 minutes to anneal the dried ink layer. Subsequently, a commercially available spin-on glass (A15 product, Filmtronics, Inc.) was applied to the annealed ink-coated substrate by spin-coating at 1000 rpm-1500 rpm to form a barrier layer. The annealed ink-coated substrate with the barrier layer was then transferred to a furnace and heated under a nitrogen atmosphere at 450° C. for 30 minutes to cure the barrier layer. Barrier layers were formed after curing with an average thickness of about 0.2 μm unless otherwise noted. The thickness of the barrier layer was measured using a profilometer. In order to obtain thickness measurements, a given spin recipe was used to form a cured barrier layer on a polished substrate. A stylus in contact with the cured barrier layer was then scanned horizontally over a distance of about 0.5 mm to about 1 mm on the cured barrier layer and the vertical displacement of the stylus was recorded. Measurements based on SEM images of ink coated wafers with barrier layers confirmed that the average thickness of barrier layers formed on top of dried ink layers were substantially similar to profilometer results obtained on polished substrates.

Example 2

Effect of Process Parameters on Thermal Diffusion

This example demonstrates the effect of wafer configuration and process temperature on thermal dopant drive-in from nanoparticle inks. In particular, a cap can be provided with another wafer over the surface or a cover formed with a wafer having a central section removed and a quartz slab over the structure.

Substrate Characteristics

This example demonstrates substrate performance characteristics without dopant drive-in. In particular, this example demonstrates the doping characteristics and sheet resistances of the substrates. Substrate performance is established as a baseline to isolate the effects of thermal dopant drive-in from silicon inks.

Figure 12A:
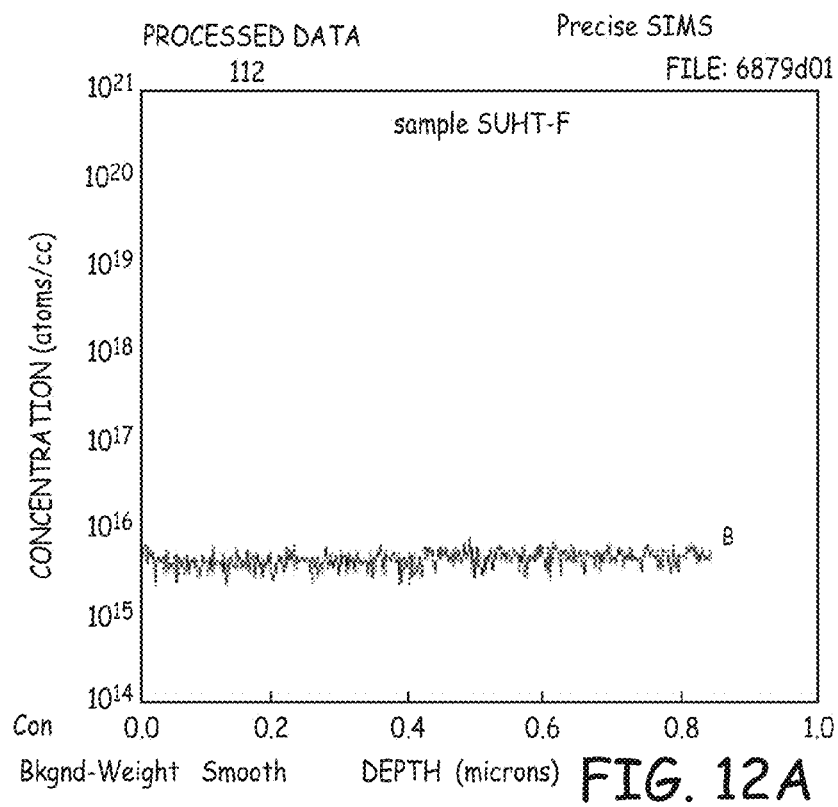
FIG. 12A is plot of a dopant profile as a function of depths below a substrate surface for an etched p-doped silicon wafer.
Figure 12B:
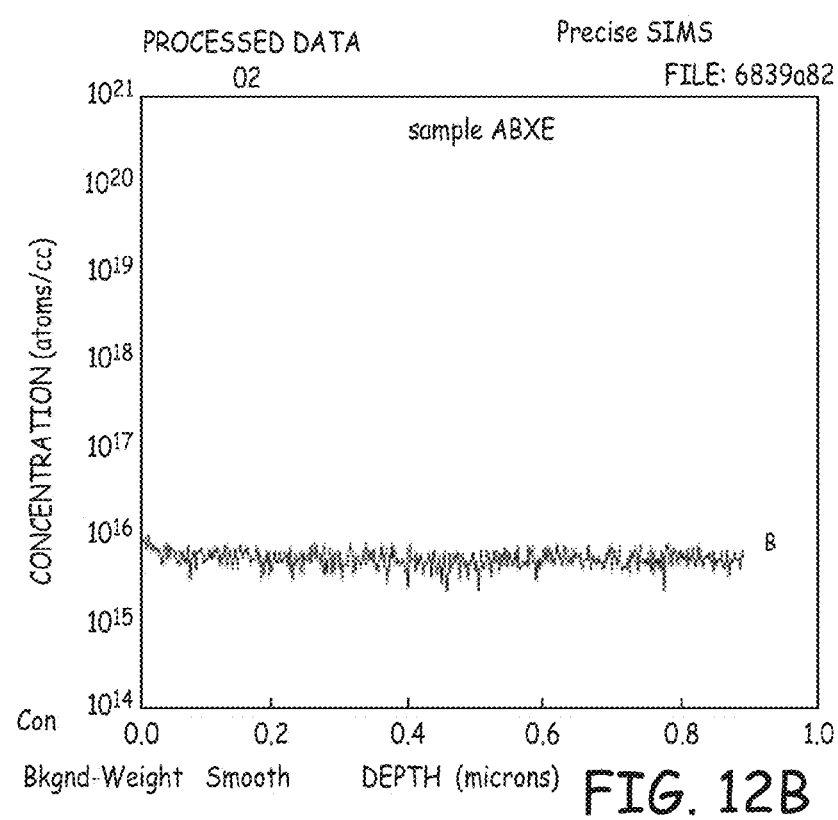
FIG. 12B is plot of a dopant profile for a p-doped silicon wafer that was etched and furnace treated.
Figure 13A:
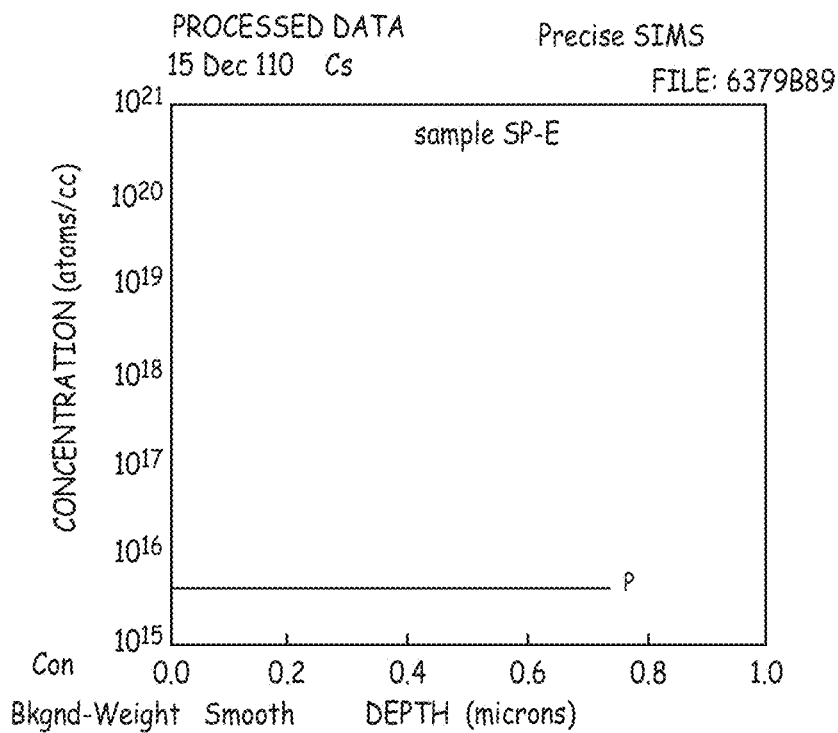
FIG. 13A is plot of a dopant profile for an etched n-doped silicon wafer.
Figure 13B:
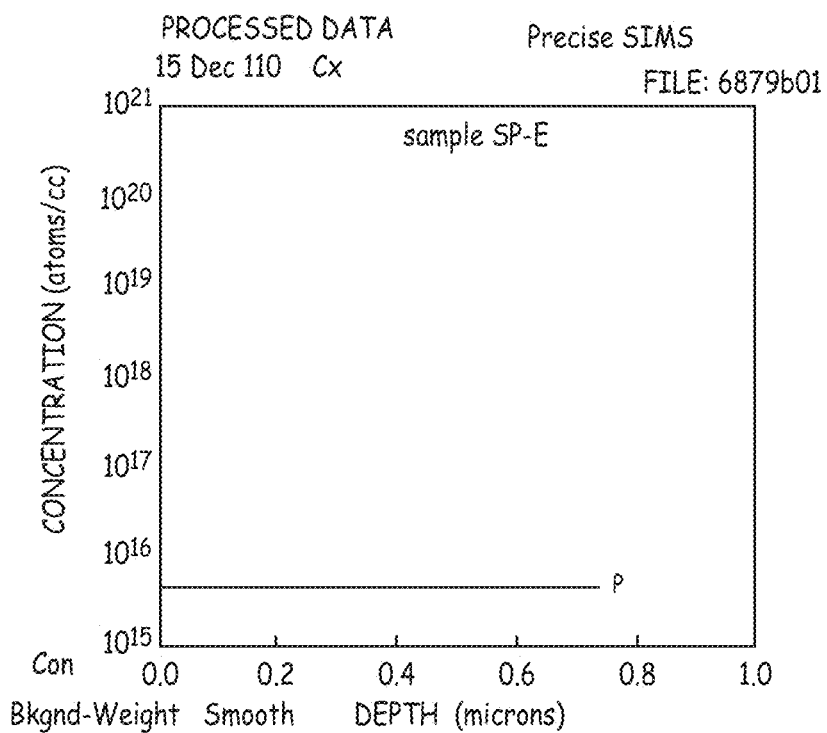
FIG. 13B is plot of a dopant profile for an n-doped silicon wafer that was etched and furnace treated.

To demonstrate substrate performance, two sample sets were formed. A first sample set comprised 2 substantially identical n-type silicon wafers as described in Example 1 (samples 1A and 1B). A second sample set comprised 2 substantially identical p-type silicon wafers as described in Example 1 (Samples 2A and 2B). Samples 1A and 1B were placed in a 25% potassium hydroxide solution at 80° C. for 15 minutes ("SDE") to remove saw damage that occurred during sample preparation. Samples 1A and 2A were placed in a BOE solution for 1 hour. Samples 1B and 2B were placed in a furnace at 1050° C. for 1 hour and subsequently placed in a BOE solution for 1 hour. The resistance of both surfaces of each sample was then measured at a plurality of locations using a four-point probe ("4PP"). Subsequently, the dopant profile (dopant concentration versus distance from the sample surface) of each sample was obtained by secondary-ion mass spectrometry ("SIMS") in which etching was used to access different depths within the substrate. Dopant concentrations and sample parameters are shown in TABLE I. Dopant concentration for samples labeled 2A and 2B in TABLE I are below the instrument detection limit of $3.0 \times 10^{15}$ atoms/cm$^3$. FIGS. 12A and 12B are dopant profiles for samples 1A and 1B, respectively. FIGS. 13A and 13B are dopant profiles for samples 2A and 2B, respectively. FIGS. 12A and 13A show baseline dopant profiles. FIGS. 12B and 13B show negligible residual doping from furnace treatment.

TABLE I

| Sample Set/ID | Substrate Type | Process Parameters | Dopant Concentration atoms/cm$^3$ |
|---|---|---|---|
| 1A | p-type | SDE + BOE | $4.6 \times 10^{15}$ |
| 1B | p-type | SDE + Furnace + BOE | $4.6 \times 10^{15}$ |
| 2A | n-type | BOE | $\leq 3.0 \times 10^{15}$ |
| 2B | n-type | Furnace + BOE | $\leq 3.0 \times 10^{15}$ |

TABLE II displays the results of the 4PP measurements and establishes a baseline resistance for each sample.

TABLE II

| | Sample Set/ID | | | |
|---|---|---|---|---|
| | 1A | 1B | 2A | 2B |
| 4PP Resistance of First Surface ($\Omega$) | 77 | 258 | 28 | 380 |
| | 78 | 206 | 29 | 83 |
| | 80 | 190 | 28 | 319 |
| | 85 | 161 | 26 | 64 |
| | 74 | 229 | 27 | 135 |
| 4PP Resistance of Second Surface ($\Omega$) | 79 | 80 | 28 | 30 |
| | 87 | 182 | 29 | 32 |
| | 75 | 86 | 28 | 20 |
| | 77 | 79 | 29 | 28 |
| | 79 | 109 | 27 | 32 |
| Avg. ($\Omega$) | 79 | 158 | 28 | 112 |
| STDEV | 4 | 37 | 1.14 | 144 |

Effect of Wafer Configuration

To demonstrate the effect of wafer configuration, 4 samples were prepared. Each sample comprised an ink coated wafer. Ink coated wafers were formed as described in Example 1. The silicon ink comprised silicon nanoparticles with an average primary particle diameter of about 20 nm and a dopant concentration of $1.5 \times 10^{21}$ atoms/cm$^3$. The dried ink layer had an average thickness of about 0.5 µm. The substrates comprised an n-type silicon wafer. The first sample further comprised a cover wafer free from any ink. The cover wafers comprised an n-type silicon wafer substantially identical to the ink coated wafer substrate except that the cover wafer did not have the ink coating. For samples 2-4, a mask was used in which the mask was cut from a wafer. The mask was cut with an approximate square shape and a square opening of about 1.5 cm$^2$ in the center region of the wafer.

Figure 14:
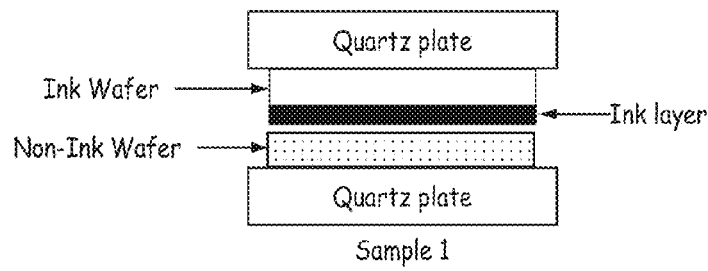
FIG. 14 is a schematic side sectional view of a wafer configuration comprising a bottom cover wafer and a top ink wafer coated wafer.
Figure 15:
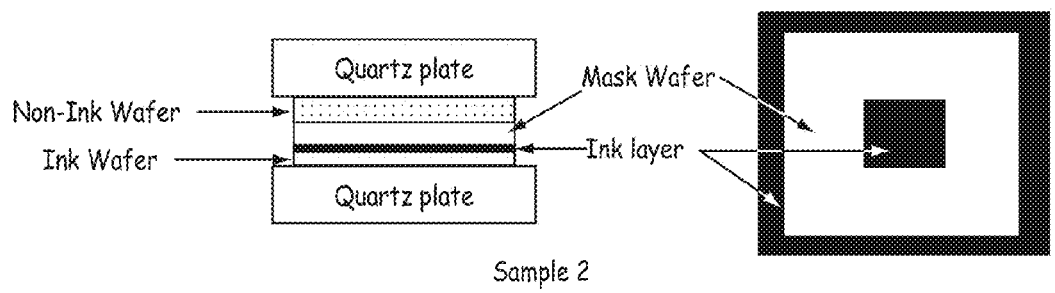
FIG. 15 is a composite of schematic views of a wafer configuration comprising a bottom ink coated wafer, a middle mask, and a top cover wafer; in which the left panel is a schematic side sectional view of the configuration and the right panel is a schematic top view showing the ink coated wafer and the mask wafer.
Figure 16:
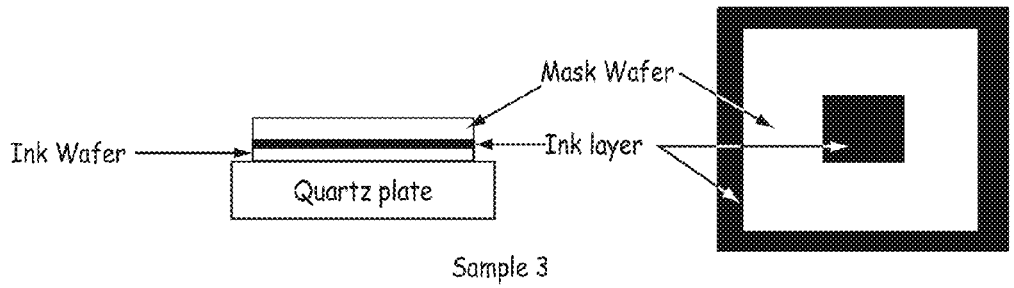
FIG. 16 is a composite of schematic views of a wafer configuration comprising a bottom ink coated wafer and a top mask, in which the left panel is a schematic side sectional view of the configuration and the right panel is a schematic top view showing the ink coated wafer and the mask wafer.
Figure 17:
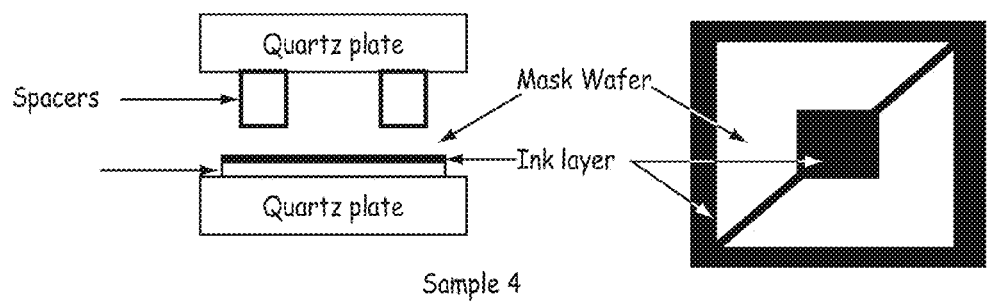
FIG. 17 is a composite of schematic views of a wafer configuration comprising a bottom ink coated wafer, a middle mask, a top cover wafer, and spacers, in which the left panel is a schematic side sectional view of the configuration and the right panel is a schematic top view showing the ink coated wafer and the mask wafer.
Figure 18:
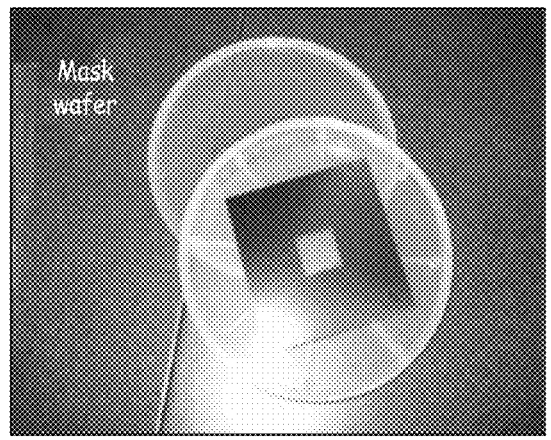
FIG. 18 is a photographic image of a representative mask.

Sample 1 was prepared by first placing a cover wafer on a first quartz plate. An ink coated wafer was then placed ink side down onto the cover wafer, and a second quartz plate was placed upon the ink coated wafer. Sample 2 was prepared by placing an ink coated wafer ink side up on a first quartz plate. A mask was then placed on the dried ink layer of the ink coated wafer and positioned such that mask left the peripheral and central regions of the ink coated wafer exposed. A cover wafer was then placed on the mask, again in such a way as to leave the peripheral and central regions of the cover wafer exposed, and a second quartz plate was placed on the cover wafer. The regions of the cover wafer and ink coated wafer that contacted the mask are referred to as "covered regions." A third sample was similar to the second sample, however, the third sample did not comprise a second quartz plate or a cover wafer. A fourth sample was similar to the second sample, however, the fourth sample further comprised quartz spacers disposed between the mask and the second quartz plate, and the mask was cut along a diagonal of the square mask to form openings along the diagonal. FIG. 14 is a schematic representation of a cross section of sample 1. FIGS. 15-17 are composites of schematic representations of samples 2-4, respectively. The left panels of FIGS. 15-17 are schematic representations of a cross-section of samples 2-4, respectively. The right panels of FIGS. 15-17 are photographs of a top view of a portion of the ink coated wafers of samples 2-4, respectively, showing the mask. FIG. 18 is a photographic image of a representative mask of samples 2 and 3.

To facilitate thermal dopant drive-in, each sample was placed in a furnace and heated at a temperature 1050° C. for 1 hour under a nitrogen atmosphere. Subsequent to heating, each sample was placed in a BOE solution for 1 hour. The 4PP resistance of each wafer was then measured at a plurality of locations on the surface of each wafer.

For all of these samples, significant dopant drive in was obtained for capped regions of the ink coated wafer. With respect to sample 1, the dopant concentration of the cover wafer and the ink covered wafer were substantially similar. TABLE III displays results of multiple 4PP measurements made on the cover wafer and ink coated wafer of sample 1 both before and after BOE treatment. TABLE III reveals that prior to BOE treatment, the ink coated wafer and the cover wafer had an average 4PP resistance measurements of about 10.87$\Omega$ and 11.30$\Omega$, respectively. TABLE III also reveals that after the BOE treatment, the ink coated wafer and the cover wafer had an average 4PP resistance of about 11.99$\Omega$ and 13.92$\Omega$, respectively, substantially similar to the corresponding 4PP resistances measured prior to BOE treatment.

TABLE III

| | | Sample 1 | | |
|---|---|---|---|---|
| Sample Process Info | | Before BOE | | 1 hr BOE |
| 4PP Resistance (ohms) | Ink coated wafer | 10.31 | Ink coated wafer | 11.05 |
| | | 11.59 | | 12.14 |
| | | 10.65 | | 12.56 |
| | | 10.42 | | 11.67 |
| | | 11.36 | | 12.54 |
| | Avg. | 10.87 | Avg. | 11.99 |
| | STDEV. | 0.58 | STDEV. | 0.64 |
| | Cover Wafer | 10.36 | Cover Wafer | 13.19 |
| | | 12.82 | | 13.90 |
| | | 11.12 | | 15.59 |
| | | 11.00 | | 13.07 |
| | | 11.20 | | 13.83 |
| | Avg. | 11.30 | Avg. | 13.92 |
| | STDEV. | 0.91 | STDEV. | 1.00 |
| Total Avg. | | 11.08 | | 12.95 |
| STDEV. | | 0.58 | | 0.64 |

Figure 19A:
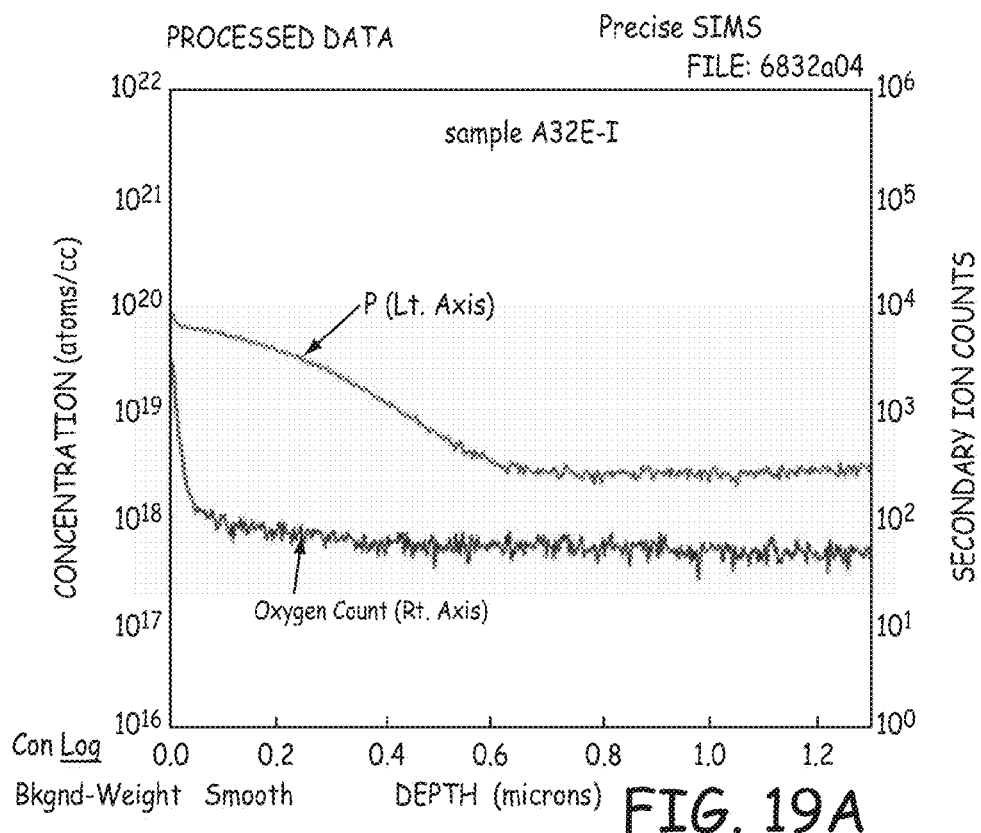
FIG. 19A is graph containing a plot of the dopant profile and a plot of oxygen count versus wafer depth for the ink coated wafer depicted in FIG. 14.
Figure 19B:
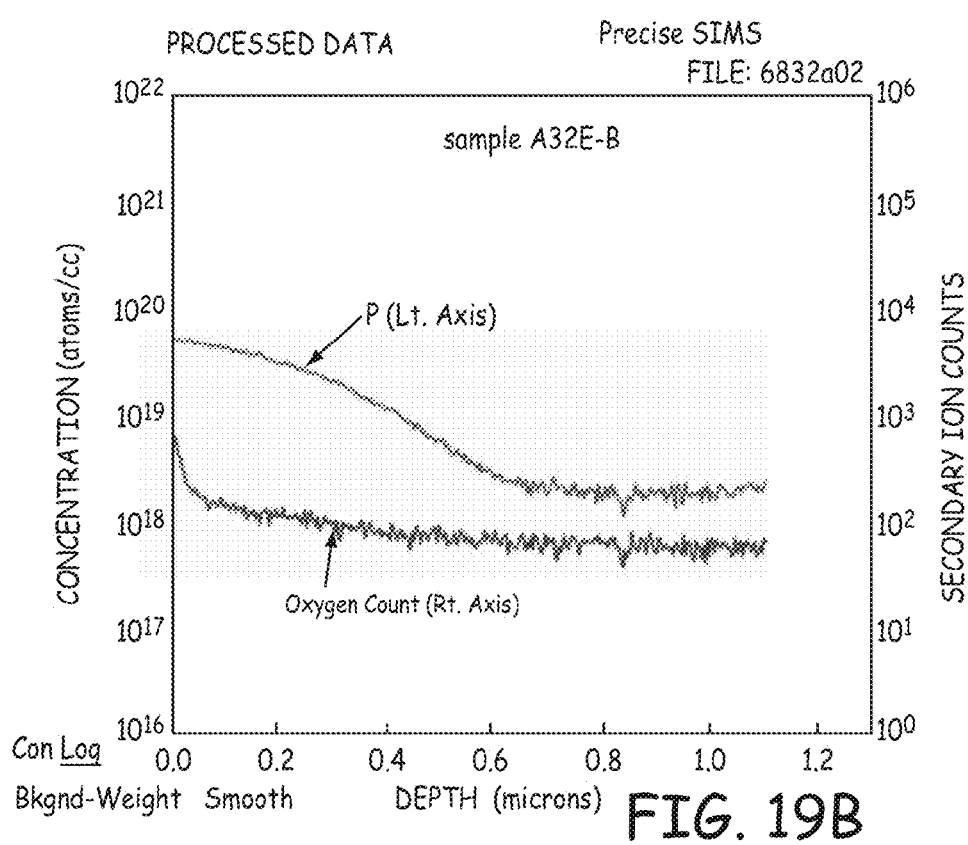
FIG. 19B is a graph containing a plot of the dopant profile and a plot of oxygen count versus wafer depth for the mask depicted in FIG. 14.

Also, with respect to sample 1, the dopant profiles of the cover wafer and the ink coated wafer after BOE treatment were seen to be substantially similar. FIG. 19A is a graph with a plot of the dopant profile and a plot of oxygen count versus wafer depth for the ink coated wafer. FIG. 19B is analogous to FIG. 19A and displays results for the cover wafer. P concentration and oxygen count were measured using secondary ion mass spectrometry ("SIMS") with appropriate etching, and measurements were taken from the surface of each wafer that was closest to the dried ink layer during thermal dopant drive-in. Comparison of FIG. 19A and FIG. 19B reveals substantially similar dopant profiles after the dopant drive-in for the ink coated wafer and the cover wafer. The P concentration near the surface of the ink coated wafer and the cover wafer was about $8 \times 10^{19}$ atoms/cm$^3$ and about $6 \times 10^{19}$ atoms/ cm³, respectively. Additionally, the dopant profile for both wafers were enhanced relative to the background dopant concentration indicating that dopant from the ink was driven into both wafers during dopant drive-in and confirming the results obtained based upon 4PP measurements. The dopant concentrations reach a plateau at about 0.6 microns below the surface. The presence of oxygen in the wafers, shown in FIGS. 19A and 19B, suggests that some oxidation takes place during thermal dopant drive-in.

Figure 20:
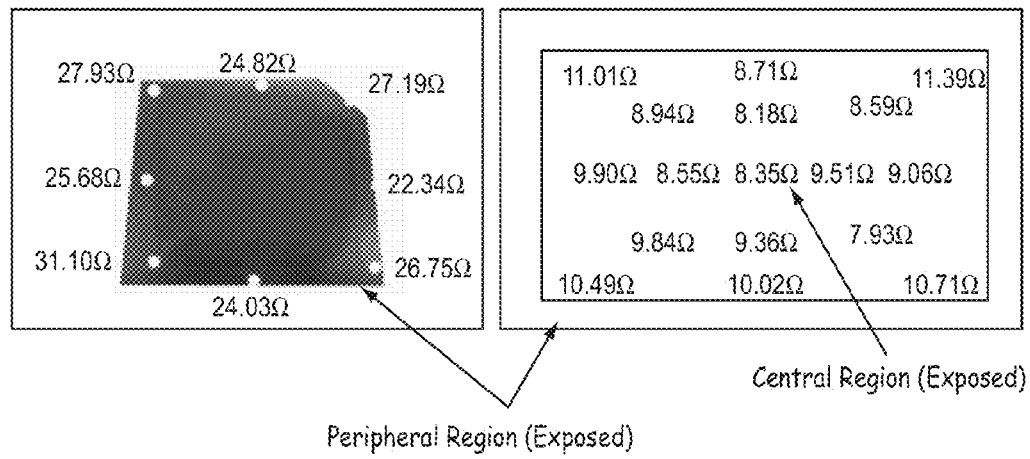
FIG. 20 is a composite of representations of the ink coated wafer depicted in FIG. 15, in which the left panel is a photographic image of the wafer and the right panel is a schematic view of the wafer.

With respect to sample 2, the ink covered wafer had substantially equivalent dopant concentrations in the covered and central regions and a significantly lower dopant concentration in the peripheral region, which was not capped. This observation is consistent with the result that significant dopant drive-in is not observed without a cap. The left panel of FIG. 20 is a photographic image of the surface of the ink coated wafer of Sample 2 and displays the results of 4PP measurements taken from the peripheral region of the ink coated wafer. The right panel of FIG. 20 is a schematic representation of the surface of the ink coated wafer and displays the results of 4PP measurements taken from the covered and center regions of the ink coated wafer. The left panel of FIG. 20 reveals that the average 4PP resistance of the peripheral region of the ink coated wafer was about 26.23Ω while the average 4PP resistance of the covered and central regions was about 8.99Ω and 8.35Ω, respectively.

Figure 21:
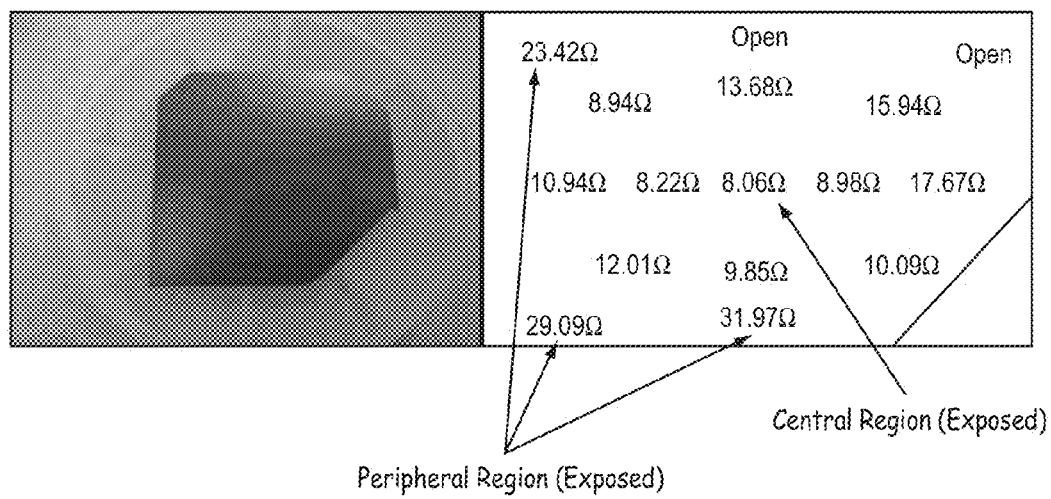
FIG. 21 is a composite of representations of the cover wafer depicted in FIG. 15, in which the left panel is a photographic image of the wafer and the right panel is a schematic view of the wafer.

Furthermore, with respect to sample 2, 4PP measurements revealed that dopant concentrations in the peripheral and central regions of the cover wafer were substantially similar to the dopant concentrations in the corresponding regions of the ink coated wafer, while the resistance measurements of the covered region of the cover wafer were intermediate. The left panel of FIG. 21 is a photographic image of the surface of the cover wafer. The right panel of FIG. 21 is a schematic representation of the cover wafer and displays results of 4PP measurements taken on the surface of the cover wafer. Comparison of FIGS. 20 and 21 reveals that average 4PP resistance of the peripheral region of the ink and cover wafer of sample 2 was 26.23Ω and 28.16Ω, respectively. Unexpectedly, comparison of FIGS. 20 and 21 also show that the average 4PP resistance in the central region of the ink and cover wafer of sample 2 was 8.35Ω and 8.06Ω, respectively, indicating that substantially equivalent amounts of dopant were driven into exposed regions of both wafers. On the other hand, with respect to sample 2, the average 4PP resistance in the covered region of the cover wafers was intermediate between the average 4PP resistance in the mask wafer and in the covered region of the ink coated wafer.

Figure 22:
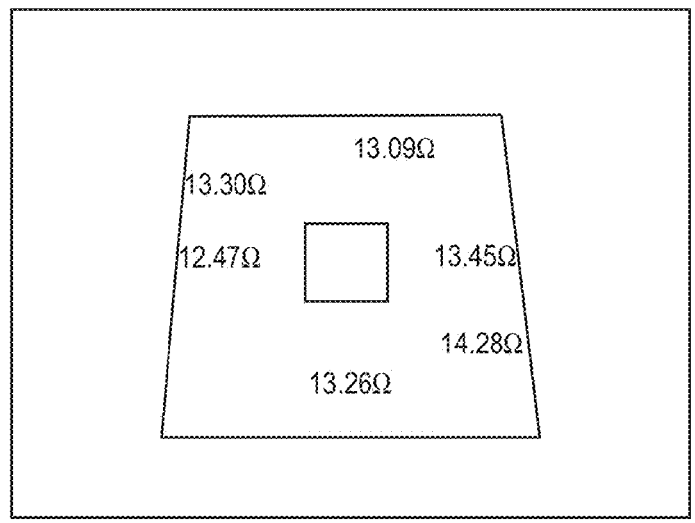
FIG. 22 is a photographic image of the mask depicted in FIG. 15.

FIG. 22 is a photographic image of the upper surface of the mask wafer of sample 2 and displays the results of 4PP measurements taken on the surface of the mask wafer. Comparison of FIGS. 20-21 shows that the average 4PP resistance in the covered region of the cover wafer was about 9.50Ω, somewhat less than the average 4PP resistance of the mask (13.31Ω) and somewhat larger than the average 4PP resistance in the covered region of the ink coated wafer (8.99Ω).

Figure 23:
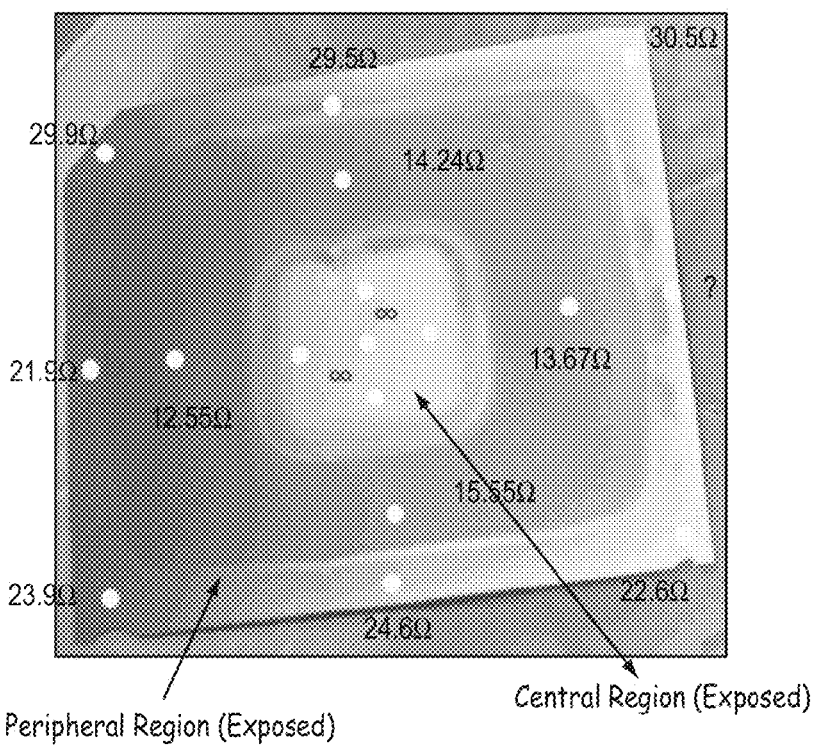
FIG. 23 is a photographic image of the ink coated wafer depicted in FIG. 16.
Figure 24:
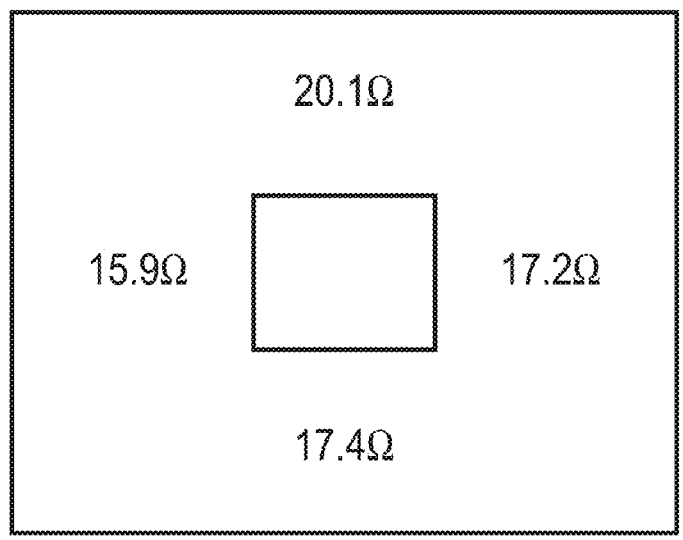
FIG. 24 is a schematic representation of the mask depicted in FIG. 16.

With respect to sample 3, the relative dopant concentrations in the ink coated wafer and mask were analogous to the relative dopant concentrations of the ink coated wafer and mask of sample 2. FIG. 23 is a photographic image of the top surface of the ink coated wafer of sample 3 and displays the results of 4PP measurements made on the surface of the wafer. FIG. 24 is a schematic representation of the mask wafer of sample 3 and displays the results of 4PP measurements made on the bottom surface of the wafer. Similar to what was seen for sample 2, comparison of FIGS. 23 and 24 reveal that the average 4PP resistance in the covered region of the ink coated wafer (14.00Ω) was lower than both the average 4PP resistance of the mask (17.62Ω) and the peripheral region of the ink coated wafer (26.13Ω). On the other hand, comparison of FIGS. 20 and 22 with FIGS. 23 and 24, respectively, reveals that the average 4PP resistances of the mask wafer and in the covered region of the ink coated wafer of sample 2 were lower than the average 4PP resistances in the corresponding wafers of sample 3, indicating improved thermal dopant drive-in when wafers were stacked as in sample 2. The 4PP resistance in the central region of the ink coated wafer of sample 3 was too high to measure, due to oxidation of the dried ink layer in the exposed region during thermal dopant drive-in due to leakage of the ambient atmosphere into the central region of the mask.

Figure 25:
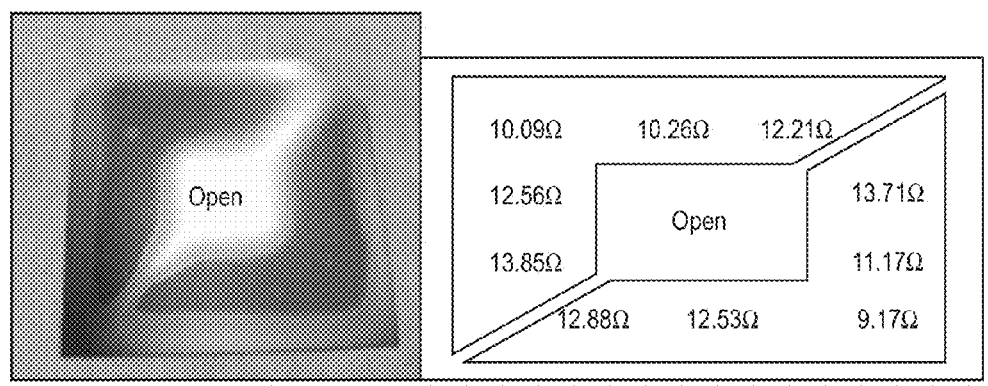
FIG. 25 is a composite of representations of the ink coated wafer depicted in FIG. 17, in which the left panel is a photographic image of the wafer and the right panel is a schematic view of the wafer.
Figure 26:
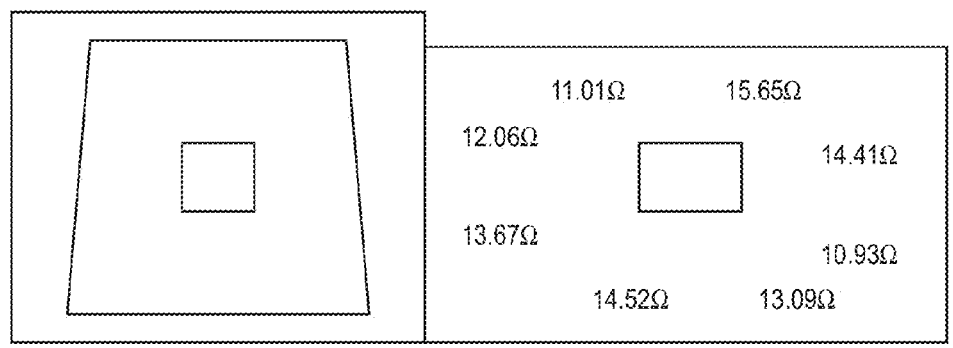
FIG. 26 is a composite of representations of the mask wafer depicted in FIG. 17, in which the left panel is a photographic image of the mask and the right panel is a schematic view of the mask.

With respect to sample 4, the relative dopant concentrations in the ink and mask wafer were also analogous to the relative dopant concentrations of the ink coated wafer and mask of sample 2. FIGS. 25 and 26 are composites of depictions of the ink coated wafer and mask, respectively, of sample 4. The left panels of FIGS. 25 and 26 show photographic images of the ink coated wafer and mask, respectively. The right panels of FIGS. 25 and 26 show schematic representations of the ink coated wafer and mask, respectively, and display the results of 4PP measurements taken on the surface of the wafers. Similar to what was seen for sample 2, comparison of FIGS. 25 and 26 show that the average 4PP resistance of the covered region of the ink coated wafer (11.84Ω) was lower than the average 4PP resistance of the mask (13.17Ω). Additionally, comparison of FIGS. 20, 23, and 25 reveals that the average 4PP resistance in the covered region of the ink coated wafer of sample 4 was less than that of sample 3, but more than that of sample 2, which suggests that the cut through the mask may have reduced the dopant drive-in effectiveness. Similarly, comparison of FIGS. 22, 24, and 26 reveals that the average 4PP resistance of the mask of sample 4 was less than the resistance of the mask of sample 3, but more than the resistance of the mask of sample 2. These results suggest improved thermal dopant drive-in when wafers were stacked as in sample 4, relative to the stacking configuration of sample 3. Furthermore, these results also suggest improved thermal dopant drive-in when wafers were stacked as in sample 2, relative to stacking configuration of sample 4. Due to oxidation of the dried ink layer during thermal dopant drive-in, the 4PP resistance was too high to measure in the "open" region of the ink coated wafer of sample 4 (see FIG. 25, left panel)

Effect of Temperature

To demonstrate the effect of temperature on thermal dopant drive-in, an additional 4 substantially identical samples were prepared. Each sample comprised an ink coated wafer, a cover wafer without ink, and a mask. Ink coated wafers were formed as described in Example 1. With respect to sample 1, the ink comprised p++ doped silicon nanoparticles with an average primary particle diameter of about 7 nm and the substrate comprised a p-type silicon wafer. With respect to samples 2-4, the ink comprised n++ doped silicon nanoparticles with an average primary particle diameter of about 20 nm and the substrate comprised an n-type silicon wafer. Cover wafers comprised a p-type silicon wafer substantially identical to the ink coated wafer without the ink coating. Masks comprised a square cut wafer with an opening in the center region as described above in the context of samples 1-4.

Figure 27:
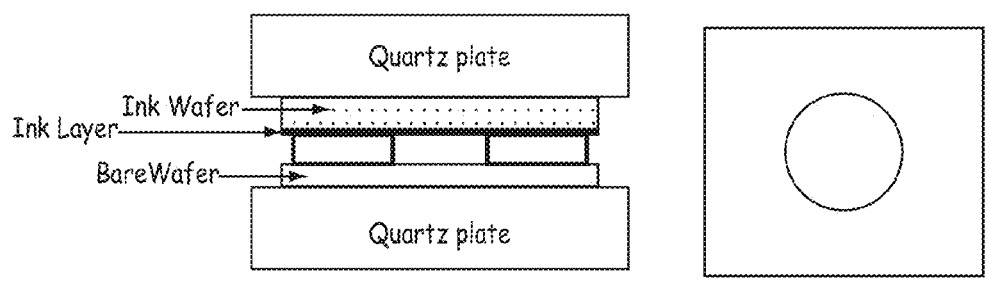
FIG. 27 is a composite of schematic views of a wafer configuration comprising a bottom cover, a middle mask, and a top ink coated wafer, in which the left panel is a schematic side sectional view of the configuration and the right panel is a schematic top view of the mask.

Each sample was prepared by placing a cover wafer on a first quartz plate. A mask was then placed on the top surface of the cover wafer. An ink coated wafer was then placed on the mask with the dried ink layer of the ink coated wafer contacting the mask, and a second quartz plate was then place on the ink coated wafer. The regions of the cover wafer and ink coated wafer that contacted the mask are referred to as "covered regions." The regions of the cover wafer and ink coated wafer which did not contact the mask due to the mask's central opening are referred to as "central regions." FIG. 27 displays a schematic representation of a representative sample for these embodiments. The left panel of FIG. 27 is a schematic representation of a cross section of a representative sample. The right panel of FIG. 27 is a schematic representation of a top-view of a representative mask.

To facilitate thermal dopant drive-in from the doped silicon nanoparticles deposited with the ink, each sample was heated in a furnace under a flowing nitrogen atmosphere. All samples were initially heated at 150° C. for 30 min. Samples 1-4 were subsequently heated for 1 hour at 1050° C., 900° C., 600° C., and 400° C., respectively. The resistance of each wafer was then measured using a 4PP at a plurality of locations on the surface of each wafer. With respect to the cover wafers and masks, resistances were measured on the surface of each wafer that was closest to the ink coated wafer during thermal dopant drive-in.

Figure 28:
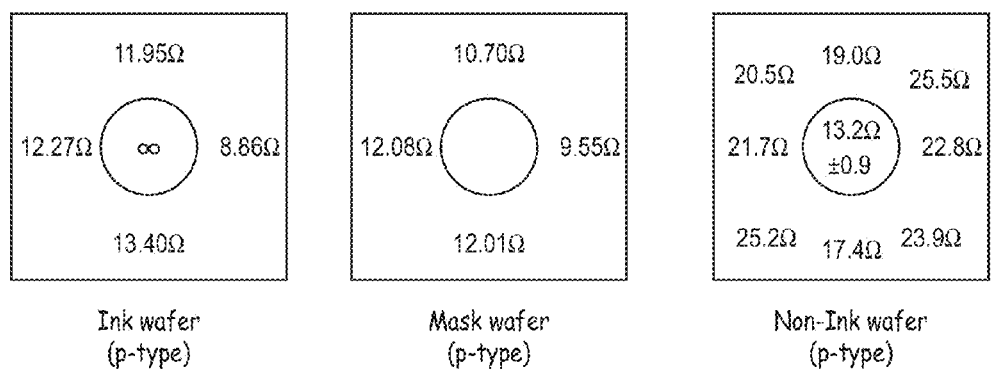
FIG. 28 is a composite of schematic views of the wafers and mask depicted in FIG. 27, in which the left panel is a schematic view of the ink coated wafer, the middle panel is a schematic view of the mask, and the right panel is a schematic view of the cover wafer.

With respect to the cover wafer of sample 1, there was a higher dopant concentration in the central region of the wafer relative to the covered region. FIG. 28 contains schematic representations of a top-view of a portion of the ink coated wafer, the mask and a portion of the cover wafer of sample 1 and displays the results of 4PP measurements taken on the wafer surfaces. With respect to the cover wafer, the average 4PP resistance in the covered region was about 22.0Ω while the 4PP resistance in the central region was about 13.2Ω, as shown in FIG. 28. FIG. 28 also shows that relative to the average 4PP resistance in the covered region of the ink coated wafer (11.62Ω), the 4PP resistance in the central region of the cover wafer was slightly larger and the 4PP resistance in the covered region of the cover wafer was significantly larger. FIG. 28 further shows that the average 4PP resistance of the mask was about 11.09Ω, which was larger than that in the covered region of the ink coated wafer but less than that of the cover wafer. High 4PP resistances in the central region of the ink coated wafer were due to oxidation of the dried ink layer during thermal dopant drive-in.

With respect to all samples tested in this subsection, the amount of dopant diffused into each wafer had a non-monotonic furnace temperature dependence. With respect to the covered region of the ink coated wafers, FIG. 28 and TABLE IV reveal that the average 4PP resistance of samples 1-4 (highest to lowest furnace temperature) were 11.62Ω, 58Ω, 168Ω, and 67Ω, respectively. With respect to the center region of the cover wafers, FIG. 28 and TABLE IV reveals that the average 4PP resistance of samples 1-4 were 13.2Ω, 61Ω, 174Ω, and 65Ω, respectively, similar to the 4PP resistances in the covered regions of the corresponding ink coated wafers. As seen in FIG. 28 and TABLE IV, the average 4PP resistances in the covered region of the cover wafer of samples 1-4 were 22Ω, 132Ω, 177Ω, and 75Ω, respectively.

TABLE IV

| | 2 Cover Wafer Covered | 2 Cover Wafer Central | 2 Ink Coated Wafer (Covered) | 3 Cover Wafer Covered | 3 Cover Wafer Central | 3 Ink Coated Wafer (Covered Region) | 4 Cover Wafer Covered | 4 Cover Wafer Central | 4 Ink Coated Wafer (Covered) |
|---|---|---|---|---|---|---|---|---|---|
| 4PP Resistance (Ohm) | 134 | 60 | 61 | 174 | 175 | 178 | 81 | 65 | 69 |
| | 129 | 62 | 58 | 171 | 170 | 152 | 78 | 66 | 63 |
| | 128 | 60 | 55 | 173 | 171 | 171 | 71 | 65 | 64 |
| | 147 | 62 | 59 | 175 | 176 | 176 | 77 | 68 | 69 |
| | 125 | 60 | 60 | 161 | 180 | 165 | 76 | 62 | 70 |
| | 138 | | | 198 | | | 79 | | |
| | 125 | | | 182 | | | 69 | | |
| | 131 | | | 184 | | | 67 | | |
| Average | 132 | 61 | 58 | 177 | 174 | 168 | 75 | 65 | 67 |
| σ | 7 | 1 | 2 | 11 | 4 | 10 | 5 | 2 | 3 |

Example 3

Stacked Wafers

This example demonstrates the effects of variations in process and sample parameters for thermal dopant drive-in with a stacked wafer configuration.

To demonstrate the effects of variations in process and sample parameters on thermal dopant drive-in with stacked wafers, several sample sets were prepared. Each sample set comprised two substantially identical samples and each sample comprised an ink coated wafer prepared as described above.

Figure 29:
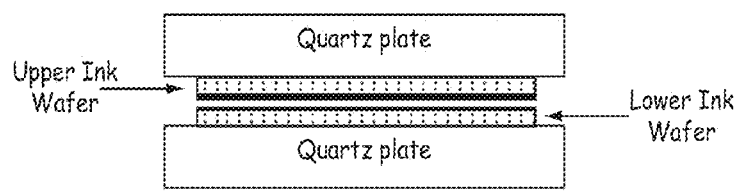
FIG. 29 is a schematic representation of a cross-section of a stacked wafer configuration.

To facilitate thermal dopant drive-in, each sample set was furnace heated in a stacked configuration to evaluate effectiveness of the dopant drive-in. In particular, a stacked configuration was formed by first placing a first ink coated wafer on a first quartz plate with the dried ink layer of the first ink coated wafer facing up away from the first quartz plate. A second ink coated wafer was then placed on the first ink coated wafer such that the dried ink layers of both ink coated wafers were contacting. A second quartz plate was then placed on the second ink coated wafer to complete the stacked configuration. FIG. 29 is a schematic representation of a cross section of a stacked configuration of a sample set as use to obtain the results presented in this Example. Details of each specific prepared sample are given in the sub-examples below.

Surface Characterization

To demonstrate the effect of thermal dopant drive-in on the dried ink layer, 6 sample sets were prepared as described above in this example. The samples were prepared from ink comprising n++ doped silicon nanoparticles with an average primary particle diameter of about 7 nm or about 20 nm. The dried ink layer of each sample had an average thickness of about 0.5 μm, about 1 μm, or about 1.5 μm. The substrate of each sample comprised an n-type silicon wafer. The samples from sets 1-5 were heated in a stacked configuration for about 0.5 hours, 1 hour, or 12 hours at 900° C. or 1050° C. The samples from set 6 were heated in a single wafer configuration, the dried ink layer of each sample placed face down on a quartz plate. Samples from set 6 were heated for 1 hour at 1050° C. Subsequent to heating, SEM images of each sample were obtained. Each sample was then placed in the BOE solution for 1 hour and SEM images of each sample were again obtained. TABLE V displays sample and process parameters for each sample set.

TABLE V

| Sample Set | Average Primary Particle diameter (nm) | Target Thickness (μm) | Furnace Temperature (° C.) | Furnace Time (Hours) |
|---|---|---|---|---|
| 1 | 7 | 0.5 | 1050 | 12 |
| 2 | 7 | 0.5 | 1050 | 1 |
| 3 | 20 | 1.5 | 1050 | 1 |
| 4 | 7 | 1.0 | 900 | 0.5 |
| 5 | 7 | 1.0 | 900 | 1 |
| 6 | 20 | 0.5 | 1050 | 1 |

Figure 30:
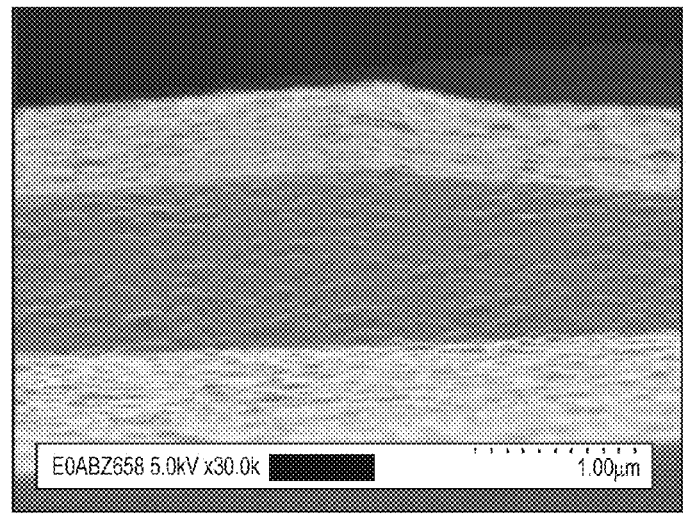
FIG. 30 is a composite of SEM images of a silicon wafer processed with 7 nm doped silicon particles in a stacked configuration at 1050° C. for 12 hours, in which the left and right panels are SEM images of the front and back surfaces of the sample, respectively.
Figure 31:
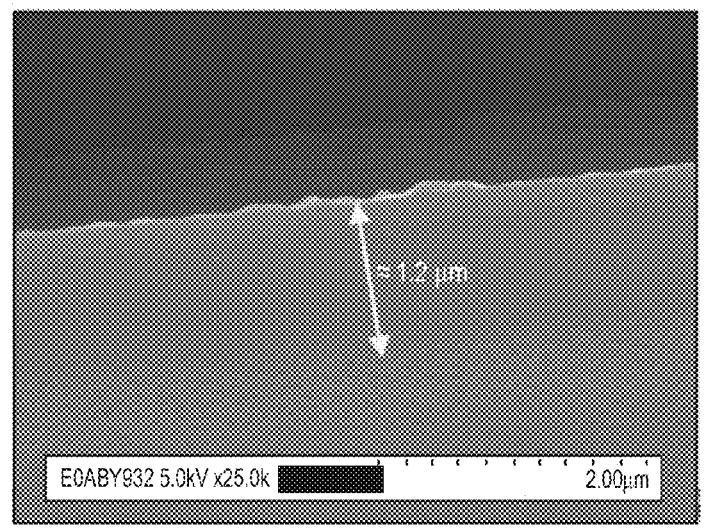
FIG. 31 is a SEM image of a cross section of a silicon wafer processed with 7 nm doped silicon particles in a stacked configuration at 1050° C. for 12 hours, in which the SEM image was taken after stain-etching.
Figure 32:
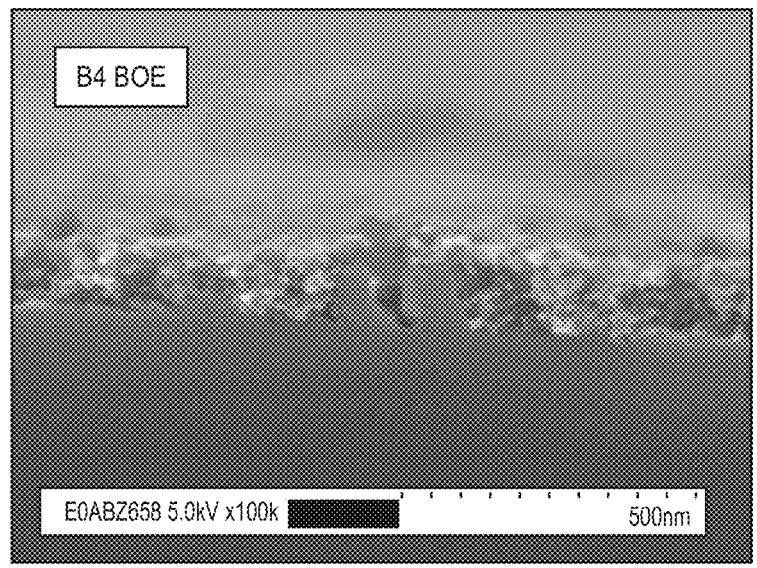
FIG. 32 is an SEM image of a cross section of a silicon wafer sample processed with 7 nm doped silicon particles in a stacked configuration at 1050° C. for 12 hour, in which the SEM image was taken prior to BOE treatment.
Figure 33:
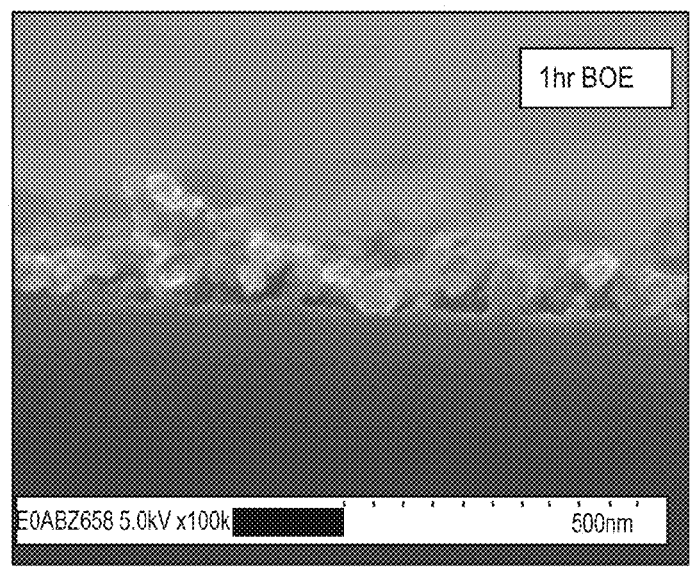
FIG. 33 is an SEM image of a cross section of a silicon wafer sample processed with 7 nm doped silicon particles in a stacked configuration at 1050° C. for 12 hours, in which the SEM image was taken after BOE treatment.

Following thermal dopant drive-in at 1050° C., the sample surface comprised a particulate layer upon a nanostructured surface layer comprising recrystallized silicon ink that evidently was formed from coalescence of a portion of the silicon nanoparticles. FIGS. 30 and 31 are SEM images of samples from set 1 (processed with 7 nm silicon nanoparticles at 1050° C. for 12 hours) taken after BOE treatment. FIG. 30 is an SEM image showing the surface of the sample and a partial cross-section of the sample. FIG. 31 is a SEM cross-section of a sample from set 1 obtained after BOE treatment and stain etching. Stain etching selectively removes silicon in highly doped regions of the substrate and provides a visual boundary between regions of the substrate where dopant concentration is greater than or equal to about $1 \times 10^{19}$ atoms/cm$^3$ and regions of the substrate with a dopant concentration less than $1 \times 10^{19}$ atoms/cm$^3$. FIGS. 30 and 31 reveal that the sample had a nanostructured surface layer consistent with recrystallized or coalesced silicon particles. Furthermore, FIG. 31 reveals dopant penetration within about 1.2 μm from the surface of the sample but does not show a visible boundary between the dried ink layer and the substrate. A more detailed inspection of the ink coated wafer surface reveals top particulate layer comprising coalesced silicon nanoparticles. FIGS. 32 and 33 are SEM images of the surface of a sample from set 1 taken prior to and after BOE treatment, respectively. FIG. 32 reveals that the sample comprised a particulate layer, comprising a silicon nanoparticle/oxide composite, and a recrystallized, i.e., coalesced, ink layer. After BOE treatment, the oxide was removed, revealing the structure of the underlying silicon nanoparticles that had coalesced to form agglomerates, as seen in FIG. 33.

Figure 34:
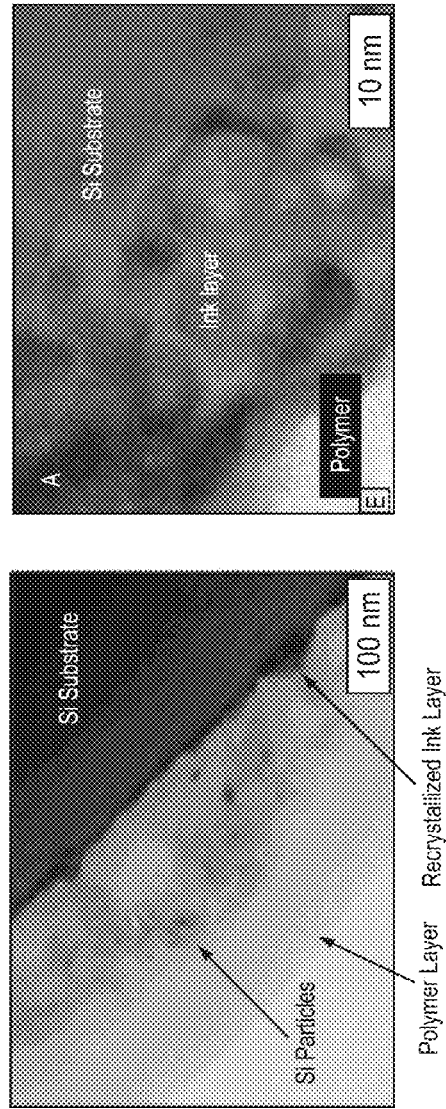
FIG. 34 is a composite of TEM images of a cross-section of a silicon wafer sample processed with 20 nm doped silicon particles and in a stacked configuration at 1050° C. for 1 hour, in which the images in the left and right panels were obtained at different magnifications.
Figure 35:
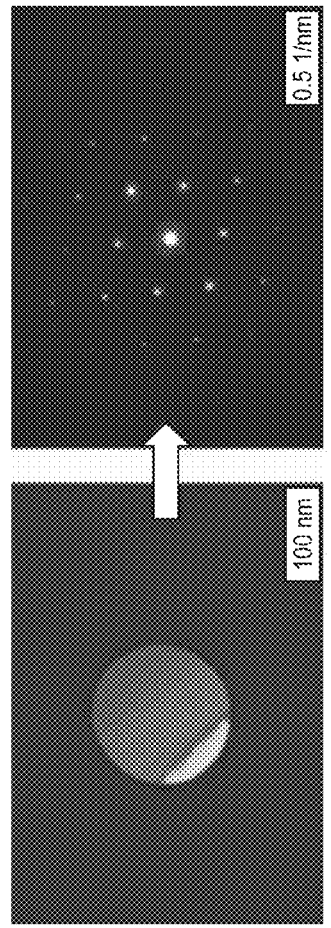
FIG. 35 is a composite of a TEM image (left panel) and a SAED pattern (right panel) of a silicon wafer sample processed with 20 nm doped silicon particles in a stacked configuration at 1050° C. for 1 hour, in which the SAED pattern was obtained from a recrystallized ink layer.

The portion of the recrystallized ink layer near the substrate was analyzed to evaluate its structure. FIG. 34 is a composite of high resolution transmission electron microscopy (TEM) images of a cross-section of sample from set 6. With respect to FIG. 34, the TEM images in the left and right panels were obtained at different magnifications. The left panel of FIG. 34 shows a polymer layer with embedded silicon particles, a recrystallized ink layer, and the silicon wafer substrate. A polymer layer was coated onto the samples in order to stabilize the samples during TEM imaging. The embedded silicon particles comprised coalesced silicon particles from the particulate layer diffused into the polymer layer during the polymer coating process. The right panel of FIG. 34 shows a substantially continuous layer of recrystallized ink and the silicon substrate. Selected Area Electron Diffraction ("SAED") studies of the sample from set 6 indicate that the portion of the recrystallized ink layer near the substrate comprised single crystalline silicon, as shown in FIG. 35. The left panel of FIG. 35 is a masked reproduction of the TEM image displayed in left panel of FIG. 35. The right panel of FIG. 35 is the SAED pattern obtained in the region of the sample that is visible in the left panel. The right panel of FIG. 35 shows that the portion of the recrystallized ink layer near the substrate was essentially single crystal silicon.

Figure 36:
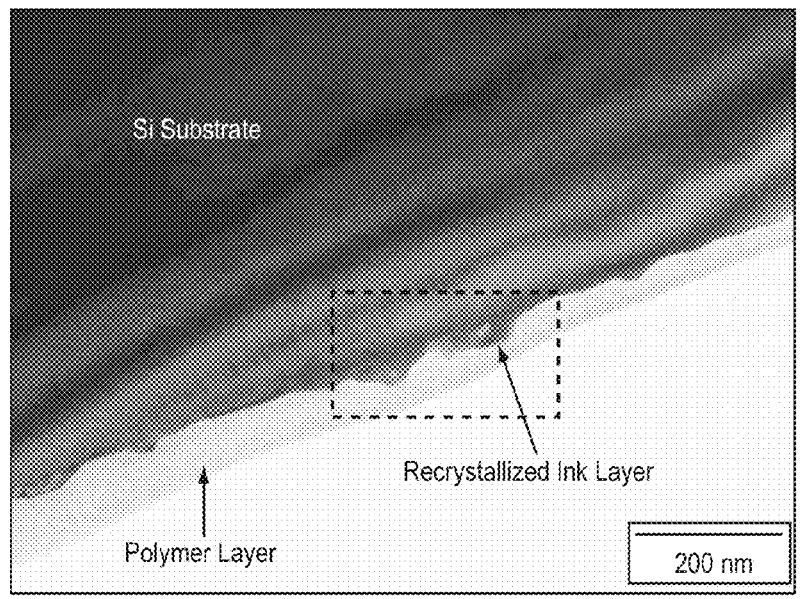
FIG. 36 is a TEM image of a cross section of a silicon wafer sample processed with 7 nm doped silicon particles in a single wafer configuration at 1050° C. for 1 hour, in which the TEM image was obtained at a first magnification.
Figure 37:
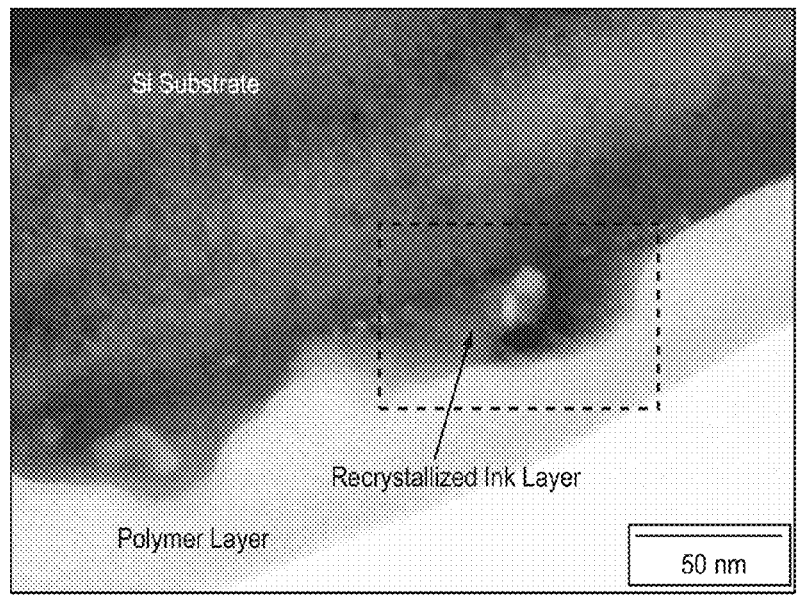
FIG. 37 is a TEM image of a cross section of a silicon wafer sample processed with 7 nm doped silicon particles in a single wafer configuration at 1050° C. for 1 hour, in which the TEM image was obtained at a second magnification.
Figure 38:
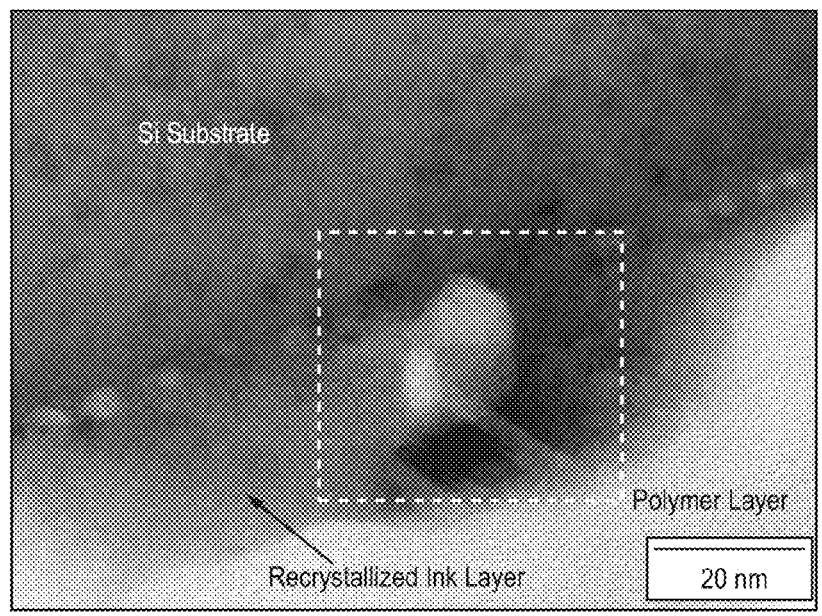
FIG. 38 is a TEM image of a cross section of a silicon wafer sample processed with 7 nm doped silicon particles in a single wafer configuration at 1050° C. for 1 hour, in which the TEM image was obtained at a third magnification.
Figure 39:
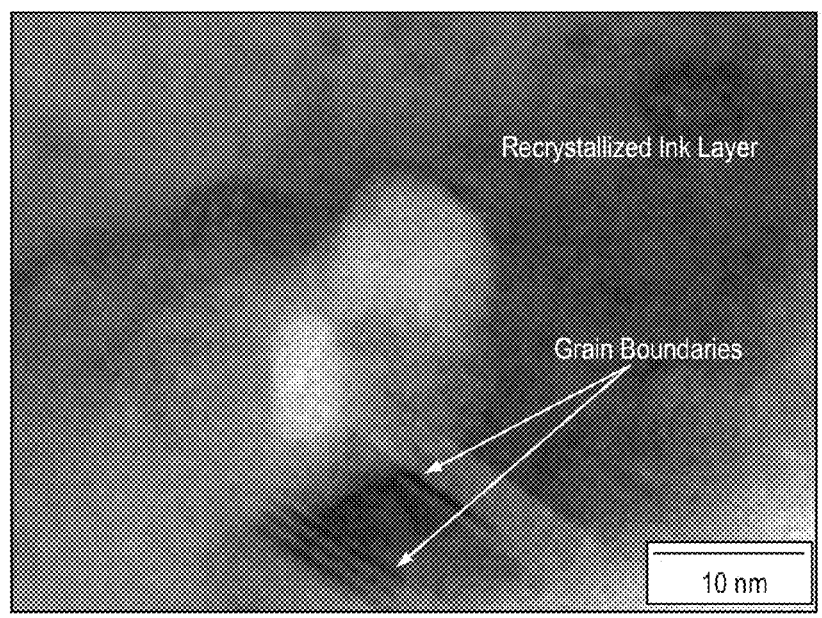
FIG. 39 is a TEM image of a cross section of a silicon wafer sample processed with 7 nm doped silicon particles in a single wafer configuration at 1050° C. for 1 hour, in which the TEM image was obtained at a fourth magnification.

On the other hand, grain boundaries were observed in the portion of the fused and coalesced silicon nanoparticles disposed away from the substrate. FIGS. 36-39 are TEM images of a cross section of a sample from set 2 and each TEM image was obtained with a different magnification. Black spots the TEM images were from contamination during sample preparation. Furthermore, shown in FIGS. 36-38 is a rectangular region denoted by a broken line. The rectangular region corresponds to the viewport of the subsequent image. For example, the TEM image displayed in FIG. 37 corresponds to the rectangular region denoted in FIG. 36. In particular, FIGS. 37 and 38 show grain boundaries in the portion of the recrystallized ink layer disposed away from the substrate, indicating that the layer was polycrystalline in this region.

Figure 40:
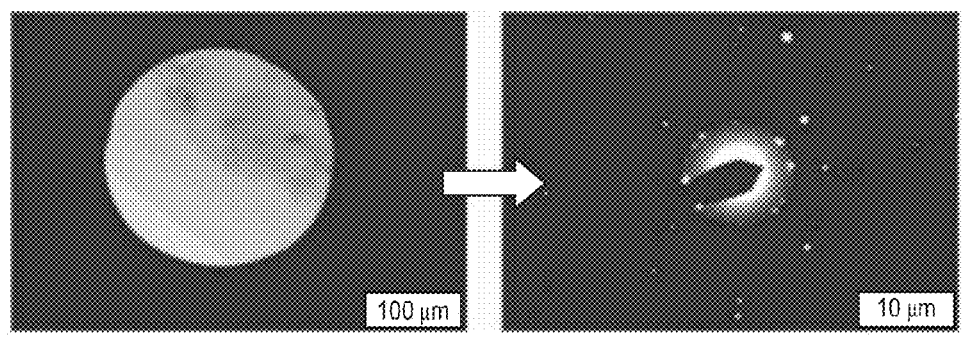

Furthermore, SAED studies of the silicon material away from the substrate surface produced results consistent with a polycrystalline material. The left panel of FIG. 40 is a masked reproduction of the TEM image displayed in the left panel of FIG. 34. The right panel of FIG. 40 is a SAED pattern obtained in the region of the sample (sample from set 6) that is visible in the left panel. The right panel of FIG. 40 shows that while the individual coalesced particles may be crystalline, there was no long range order crystalline structure in the particulate layer.

The average primary particle diameter of the doped silicon nanoparticles in the ink affected the structure of the resulting particulate or porous layer after the dopant drive-in. FIG. 41 is a composite of SEM images of cross-sections of a sample from set 2 wafers processed with 7 nm silicon nanoparticles at 1050° C. for 1 hour. The left and right panels of FIG. 41 are SEM images taken before and after BOE treatment, respectively. The left panel of FIG. 41 shows a fused particulate layer on the sample. Removal of oxides by BOE treatment revealed that the sample comprised a sparse particulate layer and an underlying nanostructured recrystallized layer of silicon, as shown in the right panel of FIG. 41. The particulate layer comprised fused silicon particles having an average size of about 50 nm. FIG. 42 is a composite of SEM images of cross-sections of a sample from set 3 wafers with 20 nm silicon nanoparticles processed at 1050° C. for 1 hour taken before BOE treatment. The SEM images in the left and right panels were taken under different magnification. Similarly to what was seen for the sample from set 2, the left panel of FIG. 42 shows a particulate layer, comprising fused silicon nanoparticles, and a recrystallized layer of coalesced silicon nanoparticles. However, comparison of right panels of FIGS. 41 and 42 reveals that the particulate layer of the sample from set 3 had a larger distribution of silicon particle diameters. In particular, the particulate layer of the sample from set 3 comprised particles with sizes comparable to the primary particles as well as sintered or coalesced particles with a size of about 100 nm.

Figure 43:
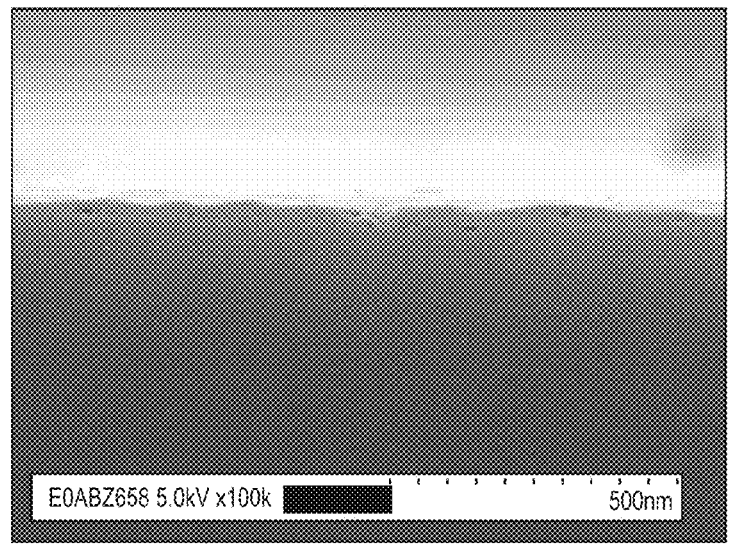
FIG. 43 is an SEM image of a cross section of a silicon wafer sample processed with 7 nm doped silicon particles processed in a stacked configuration at 900° C. for 0.5 hours.
Figure 44:
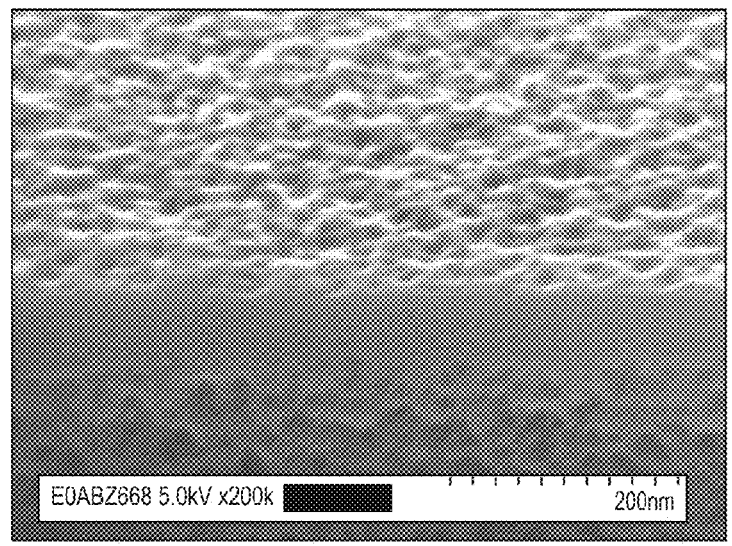
FIG. 44 is a SEM image of a cross section of a silicon wafer sample processed with 7 nm doped silicon particles processed in a stacked configuration at 900° C. for 1 hour.

Samples prepared at lower furnace temperatures did not have a visible particulate layer. FIGS. 43 and 44 are SEM images of a cross section of samples taken from set 4 with 7 nm silicon particle processed at 900° C. for 0.5 hours) and set 5 with 7 nm silicon particle processed at 900° C. for 1 hour, respectively, after BOE treatment and stain-etching. Comparison of FIGS. 43 and 44 with the right panel of FIG. 41 reveals that while the sample from set 2 (7 nm silicon particles processed at a 1050° C. for 1 hour) comprised a recrystallized silicon layer from the coalesced silicon particles and a particulate layer, the surface of the samples from sets 4 and 5 comprised a recrystallized silicon layer evidently from coalesced silicon nanoparticles but did not comprise a particulate layer of silicon particles. On the other hand, with respect to sample 1 (7 nm silicon nanoparticles processed at 1050° C. for 12 hour) and 2 (7 nm silicon nanoparticles processed at 1050° C. for 1 hour), comparison of FIG. 33 and the right panel of FIG. 41 reveals that sample prepared with longer furnace times still had a particulate layer, indicating that the silicon nanoparticle layer was still not completely coalesced after prolonged thermal dopant drive-in.

Both process and sample parameters affected the depth of dopant drive-in. In particular, longer furnace times and higher furnace temperatures increased the dopant drive-in depth. As revealed by stain etching of the samples from sets 4 (7 nm silicon nanoparticles processed at 900° C. for 0.5 hours) and 5 (7 nm silicon nanoparticles processed at 900° C. for 1 hour) displayed in FIGS. 43 and 44, respectively, the sample from set 4 had no detectable dopant penetration while the sample from set 5 had dopant penetration to about 50 nm from the sample surface. Furthermore, as shown in FIG. 31, the sample from set 1 (7 nm silicon nanoparticles processed at 1050° C. for 12 hours) had a dopant penetration to approximately 1.5 μm from the sample surface. FIG. 45A is a composite of SEM images of a sample from set 3 (20 μm silicon nanoparticles processed at 1050° C. for 1 hour) obtained after BOE treatment and stain etching. The left panel is an SEM image showing the surface and a partial cross-section of the sample. The right panel is an SEM image showing the surface of the sample that was not coated with dried ink layer. Comparison of the left and right panels of FIG. 45A highlights the nanostructured surface of recrystallized silicon layer. FIG. 45B is a composite showing another SEM image of a sample from set 3 in the left panel and a graph of two dopant profiles for a sample from set 3 obtained by SIMS in the right panel. The SEM image and the dopant profiles displayed in FIG. 45B were obtained after BOE treatment and stain etching. The two dopant profiles were obtained from two different locations on the sample. The left and right panels of FIG. 45B show that the sample from set 3 had a dopant drive-in depth of about 0.5 μm based on a dopant concentration of about $1 \times 10^{19}$ atoms/cm$^3$. Furthermore, the right panel of FIG. 45B shows that the P surface concentration in the sample from set 3 is about $1 \times 10^{19}$ atoms/cm$^3$ at 0.5 μm.

Dopant Profiles

To demonstrate the effects of variations in process and sample parameters on dopant profiles, 6 sample sets were prepared as describe above in this example. The dried ink layers had an average thickness of about 0.5 μm and were formed from inks comprising n++ doped silicon nanoparticles. To facilitate diffusion of dopant from the dried ink layer, each sample set was placed in a furnace and heated at a temperature 1050° C. for either 1 hour or 12 hours in a nitrogen atmosphere.

Subsequent to thermal dopant drive-in, one sample from each set 1-3, and both samples from sets 4-6 were placed in a BOE solution. The sheet resistance of each sample was then measured using a 4PP at a plurality of locations of the surface. Subsequently, dopant profiles for each sample were obtained using SIMS. The thickness of the particulate layer of the non-etch samples was measured from SEM images. TABLE VI displays the details of process and sample parameters for each of the samples, as well as results obtained. As used in TABLE VI and in this sub-example, "processed substrate" refers to the portion of the sample below the particulate layer and includes, for example, any recrystallized and coalesced portion of the silicon nanoparticle layer. Furthermore, the P surface concentration and diffusion depth for the processed substrates of the non-etched samples of sets 1-3 were taken as those of the corresponding etched samples. The depth at which the dopant profile dropped below about $1 \times 10^{19}$ atoms/cm$^3$ was taken as the diffusion depth.

TABLE VI

| | Sample Info | | Furnace Conditions | | P in Processed Substrate | | | P in Particulate Layer | | |
|---|---|---|---|---|---|---|---|---|---|---|
| Sample ID | Average Primary Particle Diameter in Ink (nm) | Substrate Dopant Type | Temp. (° C.) | Furnace Time (hr) | Sheet Resistance (Ω/sq.) | P Surface Concentration (atoms/cm³) | Diffusion Depth (μm) | Sheet Resistance (Ω/sq.) | P concentration (atoms/cm³) | Thk. (μm) |
| 1A | 7 | n-type | 1050 | 12 | No BOE Treatment | $4 \times 10^{19}$ | 2.0 | 17.5 (±1.2) | $2 \times 10^{20}$ | ~0.3 |
| 1B | | | | | 18.2 (±2.6) | | | BOE Time: 7 hours | | |
| 2A | 7 | n-type | 1050 | 1 | No BOE Treatment | $6 \times 10^{19}$ | 0.50 | 35.6 (±2.1) | $1 \times 10^{21}$ | ~0.1 |
| 2B | | | | | 35.9 (±1.1) | | | BOE Time: 1 hour | | |
| 3A | 20 | n-type | 1050 | 1 | No BOE Treatment | $1 \times 10^{20}$ | 0.48 | 27.1 (±1.8) | $4 \times 10^{20}$ | ~0.2 |
| 3B | | | | | 28.1 (±1.8) | | | BOE Time: 1 hour | | |
| 4 | 20 | n-type | 1000 | 1 | 21.3 (±0.5) | $9 \times 10^{19}$ | 0.60 | BOE Time: 1 hour | | |

TABLE VI-continued

| | Sample Info | | Furnace Conditions | | P in Processed Substrate | | | P in Particulate Layer | | |
|---|---|---|---|---|---|---|---|---|---|---|
| Sample ID | Average Primary Particle Diameter in Ink (nm) | Substrate Dopant Type | Temp. (°C.) | Furnace Time (hr) | Sheet Resistance (Ω/sq.) | P Surface Concentration (atoms/cm³) | Diffusion Depth (μm) | Sheet Resistance (Ω/sq.) | P concentration (atoms/cm³) | Thk. (μm) |
| 5 | 20 | n-type | 1050 | 1 | 37.2 (±1.6) | 5 × 10¹⁹ | 0.40 | BOE Time: 1 hour | | |
| 6 | 7 | p-type | 1050 | 1 | 41.1 (±1.2) | 5 × 10¹⁹ | 0.40 | BOE Time: 1 hour | | |

Figure 46A:
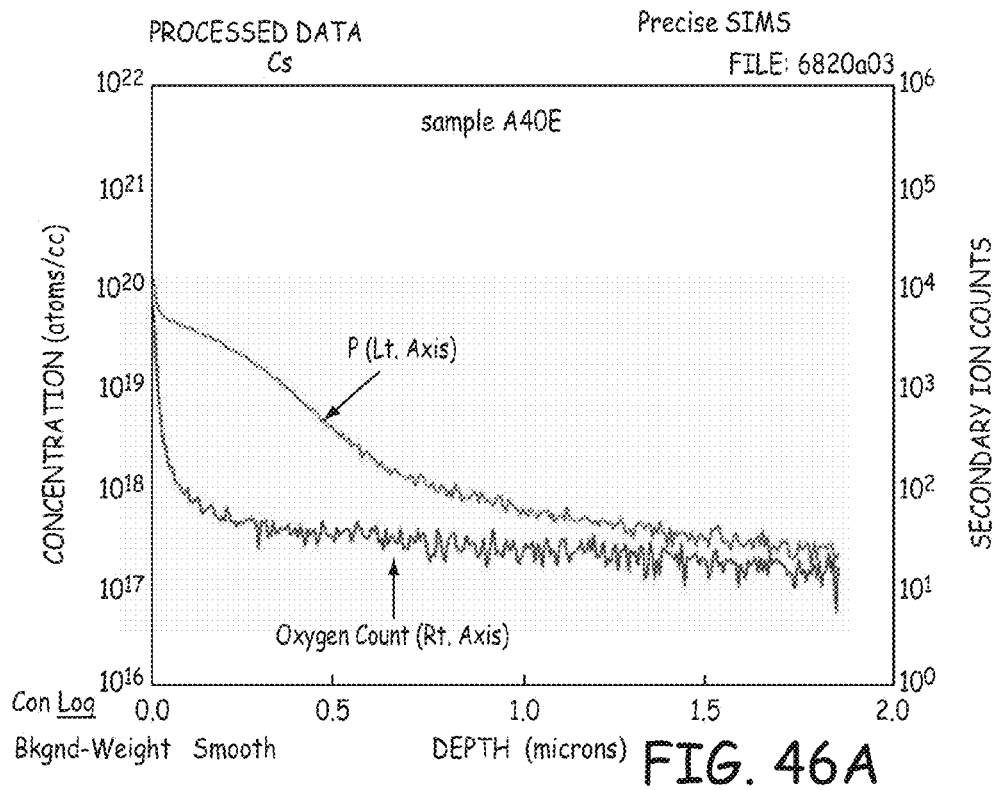
FIG. 46A is graph containing plots of the dopant profile and oxygen count versus wafer depth, both for a silicon wafer sample processed with 20 nm doped silicon particles processed in a stacked configuration at 1050° C. for 1 hour.
Figure 46B:
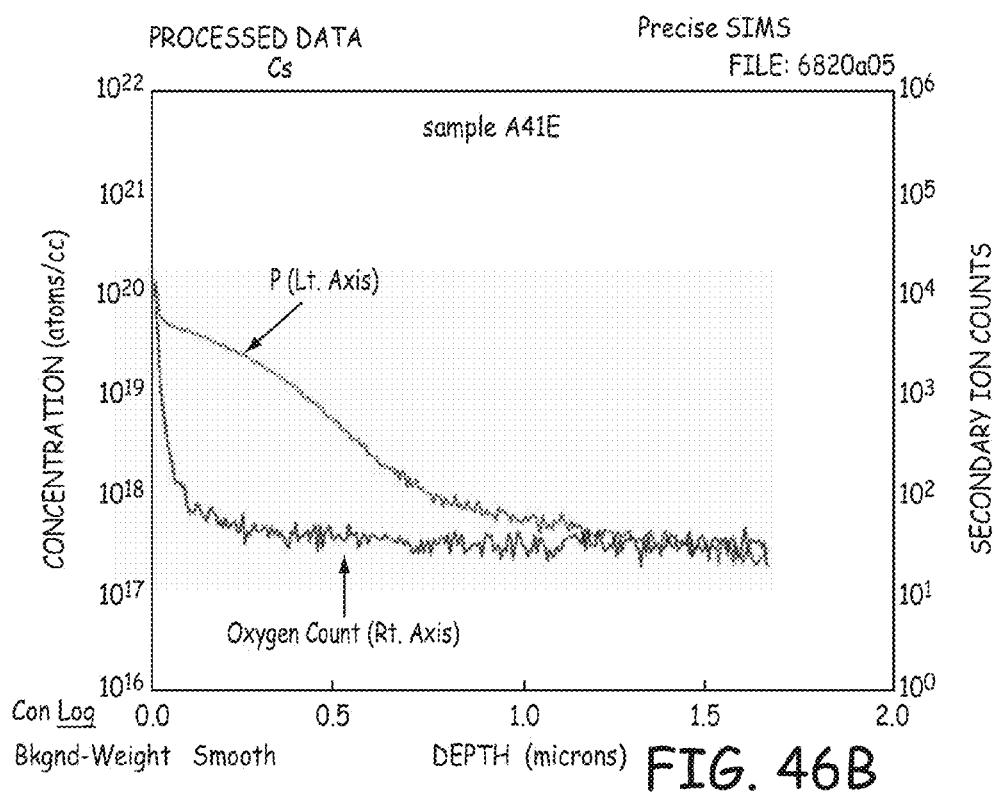
FIG. 46B is a graph containing plots of the dopant profile and oxygen count versus wafer depth, both for a silicon wafer sample processed with 7 nm doped silicon particles in a stacked configuration at 1050° C. for 1 hour.

Thermal dopant drive-in from the dried ink layer did not form an electrically inactive P layer. FIG. 46A is a graph containing plots of the dopant profile and oxygen count versus wafer depth for a sample from set 5. FIG. 46B is analogous to FIG. 46A and displays results for a sample from set 6. Comparison of FIGS. 46A and 46B show that the samples from sets 5 and 6 have a P surface concentration of about $5 \times 10^{19}$ atoms/cm³ and a significantly enhanced P concentration, relative to the background to a depth of about 0.4 μm. Furthermore, the results plotted in FIGS. 46A and 46B show that there is essentially no electrically inactive P layer on the surface of either of the substrates. The relatively shallow oxygen count present in the ink coated wafer of both samples is due to oxidation during thermal dopant drive-in.

With respect to sample sets 1-3, the sheet resistance of each non-etched sample was substantially similar to the sheet resistance of the corresponding etched sample from the same set. TABLE VI shows that sheet resistance of samples 1A, 2A, and 3A (all non-etched) were 17.5 Ω/sq., 35.6 Ω/sq., and 27.1 Ω/sq., respectively, while the sheet resistance of samples 1B, 2B, and 3B (all etched) were 18.2 Ω/sq., 35.9 Ω/sq., and 27.1 Ω/sq., respectively.

Samples prepared with longer furnace times had smaller values of sheet resistances and greater dopant drive-in depths, relative to samples prepared at shorter furnace times. TABLE VI shows that the sheet resistances of samples 1A (12 hour furnace time) and 2A (1 hour furnace time) were 17.5 Ω/sq. and 35.6 Ω/sq., respectively, and the sheet resistances of samples 1B (1 hour furnace time) and 2B (12 hour furnace time) were 18.2 Ω/sq. and 35.9 Ω/sq., respectively. Furthermore, TABLE VI also shows that although the P surface concentration in the processed substrate of sample 1A ($4 \times 10^{19}$ atoms/cm³) was less than that of sample 2A ($6 \times 10^{19}$ atoms/cm³), the processed substrate of sample 1A had an elevated P concentration over about 3 μm while the sub-sample of sample 2A had an elevated P concentration over about 0.8 μm. Moreover, samples prepared with longer furnace times also had thicker particulate layers. TABLE VI reveals that while the P concentration in the particulate layer of sample 1A ($2 \times 10^{20}$ atoms/cm³) was less than that in sample 2A ($1 \times 10^{21}$ atoms/cm), the particulate layer of sample 1A (0.3 μm) was thicker than that of sample 2A (0.1 μm).

Samples prepared from doped silicon inks comprising larger nanoparticles resulted in smaller sheet resistances and larger dopant surface concentrations. With respect to the processed substrates of samples 2A (7 nm average silicon primary particle diameter) and 3A (20 nm average silicon primary particle diameter), TABLE VI shows that sample 2A had a sheet resistance of about 35.6 Ω/sq. while sample 3A had a sheet resistance of about 27.1 Ω/sq. Furthermore, TABLE VI also shows that the P surface concentration in the processed substrates of samples 2A and 3A was about $4 \times 10^{19}$ atoms/cm³ and about $4 \times 10^{19}$ atoms/cm³, respectively, and that the processed substrate of both samples had a significantly elevated P concentration over background to a depth of about 0.8 μm. With respect to the particulate layers of samples 2A and 3A, TABLE VI reveals that the P concentration in the dried ink layers after thermal dopant drive-in was about $1 \times 10^{21}$ atoms/cm³ and about $4 \times 10^{20}$ atoms/cm³, respectively, while the thickness of layers of coalesced silicon particle after thermal dopant drive-in was about 0.1 μm and about 0.2 μm, respectively. Samples fabricated from substrates obtained from different commercial sources had varying doping characteristics. Referring to TABLE VI samples from sets 4 and 5 were substantially similar. However, the n-type substrate of samples 4 and 5 were obtained from two different commercial sources. TABLE VI shows that sample 4 had a sheet resistance of about 21.3 Ω/sq. while sample 5 had a sheet resistance of about 37.2 Ω/sq. Furthermore, TABLE VI also shows that the P surface concentration in the processed substrates of samples 4 and 5 was about $9 \times 10^{19}$ atoms/cm³ and about $5 \times 10^{19}$ atoms/cm³, respectively, and that the substrates of samples 4 and 5 had a depth of dopant drive-in of about 0.7 μm and about 0.5 μm, respectively.

Substrate dopant type also affected doping characteristics. Referring to TABLE VI, the processed substrates of sample 2B (n-type substrate) and sample 6 (p-type substrate) had surface resistances of about 35.9 Ω/sq. and 41.1 Ω/sq., respectively. Furthermore, TABLE VI also shows that the P surface concentration in the processed substrates of samples 2B and 6 were about $6 \times 10^{19}$ atoms/cm³ and about $5 \times 10^{19}$ atoms/cm³, respectively, and that the processed substrates of samples 2B and 6 had a dopant drive-in depth of about 0.8 μm and about 0.5 μm, respectively.

Temperature Ramping During Thermal Dopant Drive-In

To demonstrate the effect of variation of furnace type on thermal dopant drive-in, 5 sample sets were prepared as described above. The dried ink layer of each ink coated wafer had an average thickness of about 0.5 μm and was formed from ink comprising n++ doped silicon nanoparticles. To facilitate thermal dopant drive-in from the annealed ink layer, samples 1 and 2 were heated in a Neytech™ furnace [Qex, Degussa-Ney Dental, Inc.] ("NTB"). Samples 1 and 2 were placed in the furnace at room temperature and the furnace temperature was then brought to 1050° C. at a ramping rate of 200° C./min. Samples 3-5 were heated in a MTI furnace (GSL-1100×8, MTI Corporation) ("MTI"). Samples 3-5 were placed in the furnace at room temperature and the furnace temperature was then brought to 1050° C. at a ramping rate of 10° C./min. Samples 1-5 were heated at 1050° C. for 1 hour to complete dopant drive-in. While samples from sets 1-4 were heated in a stacked configuration, as described above in this example, the samples from set 5 were heated in a single wafer configuration, the dried ink layers of each sample placed face down on a quartz plate. Subsequent to dopant drive-in, the 4PP resistance was measured at a plurality of locations on the surface of each sample. The samples were then placed in a BOE for 1 hour. The 4PP resistance was then again measured at a plurality of locations on the surface of each sample. Table VII displays specific sample and process parameters for each sample.

TABLE VII

| | Sample Set | | | | |
|---|---|---|---|---|---|
| | 1 | 2 | 3 | 4 | 5 |
| Substrate Dopant Type | n | p | n | n | n |
| Average Primary Particle diameter in Ink (nm) | 20 | 7 | 20 | 7 | 20 |
| Furnace Type | NTB | NTB | MTI | MTI | MTI |
| 4PP Avg., STDEV (before BOE) (ohm) | 6.61, 0.31 | 7.71, 0.15 | 3.01, 0.15 | 3.27, 0.18 | 4.74, 0.09 |
| 4PP Avg., STDEV (after BOE) (ohm) | 8.49, 0.36 | 9.41, 0.27 | | | 4.85, 0.11 |

With respect to thermal dopant drive-in in the NTB furnace, the 4PP resistance of the samples was only slightly affected by variations in nanoparticle size and substrate dopant type. TABLE IV shows that the average 4PP resistance of samples from sets 1 (20 nm average primary particle diameter and n-type substrate) and 2 (7 mm average primary particle diameter and p-type substrate) before BOE treatment was about 6.61Ω and about 7.71Ω, respectively. Furthermore, TABLE VII also shows that average 4PP resistance of samples from sets 1 and 2 after BOE treatment was 8.49Ω and 9.41Ω, respectively, indicating only slightly improved conductivity of the ink coated wafer prior to BOE treatment.

Similarly, with respect to thermal dopant drive-in in the MTI furnace, the 4PP resistance of the samples was only slightly affected by variations in nanoparticle size and substrate dopant type. TABLE VII shows that prior to BOE treatment, samples 3-5 had an average 4PP resistance of about 3.01Ω, 3.27Ω, and 4.74Ω, respectively. TABLE IV also shows that after BOE treatment, sample 5 had an average 4PP resistance of about 4.8Ω, similar to their pre-BOE treatment average 4PP resistance. Furthermore, comparison of samples from set 3 and 5 reveals that samples furnace treated in a stacked configuration (sample set 3) had a smaller average 4PP resistance than samples furnace treated in a single wafer configuration (sample set 5).

Samples prepared in the MTI furnace had lower sheet resistances relative to the analogous samples prepared in the NTB furnace, consistent with the observation that, due to the slower ramping rate used, the effective dopant drive-in time was substantially longer for samples 3-6, relative to samples 1 and 2.

Sheet Resistance: Phosphorus Diffusion from Si Nanoparticles to Wafer Substrates To demonstrate the sheet resistances obtained from thermal dopant drive-in from n++ doped inks, 4 sample sets were prepared as described above. The dried ink layer of each sample was formed from ink comprising n++ doped silicon nanoparticles and substrate of each sample comprised an n-type silicon wafer. The samples sets were heated in a stacked configuration for 1 hour at 1050° C. Subsequent to heating, the 4PP resistance was measured at plurality of locations on the surface of each sample. Each sample was then placed in a BOE treatment for 1 hour. The 4PP resistance was then again measured at a plurality of locations on the surface of each sample. TABLE VIII displays the 4PP resistances and parameters of each sample. Data presented in the row labeled "Sample Parameters" of TABLE VIII displays, in order, average primary particle diameter of silicon nanoparticles in ink used to form the dried ink layer and the thickness of the dried ink layer.

TABLE VIII

| | Sample Set | | | |
|---|---|---|---|---|
| | A | B | C | D |
| | Sample Parameters | | | |
| | 7 nm/0.5 μm | 20 nm/0.5 μm | 20 nm/1 μm | Smpl. 1: 7 nm/0.5 μm Smpl. 2: 20 nm/0.5 μm |
| | Etching State | | | |
| | Before BOE | After BOE | Before BOE | After BOE | Before BOE | After BOE | Before BOE |
| 4PP Resistance of Sample 1 (ohm) | 7.48 8.70 7.58 7.99 7.94 | 7.77 8.46 8.15 8.31 8.11 | 6.39 6.88 6.32 6.54 5.81 | 5.88 6.44 6.05 6.70 6.81 | 5.64 6.90 6.74 6.61 6.47 | 6.61 7.17 6.98 7.54 6.83 | 2.92 3.66 3.17 3.15 3.38 |
| 4PP Resistance of Sample 2 (ohm) | 7.37 7.93 9.97 7.95 7.96 | | 5.18 6.17 6.13 6.64 5.64 | | 5.80 6.12 6.55 6.21 6.34 | | 3.11 3.92 3.48 3.48 3.17 |
| Avg. (ohm) | 8.09 | 8.16 | 6.17 | 6.38 | 6.34 | 7.03 | Smpl. 1: 3.26 Smpl. 2: 3.43 |
| STDEV | 0.48 | 0.26 | 0.39 | 0.40 | 0.49 | 0.35 | Smpl. 1: 0.28 Smpl. 2: 0.32 |

Samples formed from doped silicon inks comprising larger silicon nanoparticles had lower 4PP resistances. Prior to BOE treatment, TABLE VIII shows that the samples set A (7 nm average primary particle diameter) had an average 4PP resistance of about 8.09Ω while samples from set B (20 nm average primary particle diameter) had an average 4PP resistance of about 6.17Ω. On the other hand, the thickness of the annealed ink layer did not appreciably affect the average 4PP resistance after thermal dopant drive-in. As shown in TABLE VIII, the average 4PP resistance of the samples from sets B (0.5 μm average dried ink layer thickness) and C (1.0 μm average dried ink layer thickness) prior to BOE were 6.16Ω and 6.34Ω, respectively. With respect to any given sample from sets A-C, the substantial similarity between the average 4PP resistance before and after BOE treatment indicated that the dried ink layer became conductive after thermal dopant drive-in. For example, the samples from set B had an average 4PP resistance of about 6.17Ω and 6.38Ω before and after BOE treatment, respectively.

Samples from set D had substantially similar average 4PP resistances, which were significantly lower than samples from sets A-C. With respect to set D, TABLE VIII shows that sample 1 (20 nm average primary particle diameter) had an average 4PP resistance of about 3.26Ω and sample 2 (7 nm average primary particle diameter) had an average 4PP resistance of about 3.43Ω, substantially similar to that of sample 1. Furthermore, TABLE VIII also shows that the average 4PP resistances of samples from set D were significantly lower than the average 4PP resistances of the samples from sets A-C. The lower average 4PP resistances of the samples from set D may have been due to variations in sample processing during thermal dopant Sheet Resistance: Boron Diffusion from Si Nanoparticles to Wafer Substrates To demonstrate the sheet resistances obtained from thermal dopant drive-in from p++ doped inks, 4 sample sets were prepared as described above. Three sample sets, each comprising 2 ink coated wafers, were prepared as described above in this example, and the ink layers comprised p++ doped silicon nanoparticles. A fourth sample set comprised an ink coated wafer and a bare wafer. The ink coated wafer was prepared as described in Example 1. The dried ink layer of the ink coated wafer had an average thickness of about 1 μm and was formed from ink comprising p++ doped silicon nanoparticles with an average primary particle diameter of about 7 nm. The substrate of the ink coated wafer comprised an n-type silicon wafer. The bare wafer was substantially identical to the wafer substrate of the ink coated wafer.

The sample sets were furnace heated in a stacked configuration for 1 hour, 2 hours, or 4 hours at a temperature of 1050° C. With respect to sample set 4, the stacked configuration was formed by first placing the bare wafer on a first quartz plate. The ink coated wafer was then placed on the bare wafer, the dried ink layer of the ink coated wafer contacting the top surface of the bare wafer, and a second quartz plate was placed on the top bare surface of the ink coated wafer.

After furnace heating, the 4PP resistance was measured at a plurality of locations on the surface of each sample. The samples were then place in a BOE solution for 1 hour and, subsequently, the 4PP resistance was again measured at a plurality of locations on the surface of each sample. The parameters and 4PP resistances of each sample are displayed in TABLE IX, below. Data presented in the row labeled "Sample Parameters" displays, in order, the average primary particle diameter of the silicon particles in the ink used to form the dried ink layer and the average thickness of the dried ink layer. As used in TABLE IX, "S1" denotes sample 1 and "S2" denotes sample 2.

TABLE IX

| | Sample Set | | | |
|---|---|---|---|---|
| | 1 | 2 | 3 | 4 |
| | | Sample Parameters | | |
| | 20 nm/1.0 μm | 7 nm/1.0 μm | 20 nm/0.5 μm | S1: 20 nm/0.5 μm<br>S2: Bare Wafer |
| | | Furnace Time | | |
| | 1 hour | 2 hours | 4 hours | 4 hours |
| | | Etching State | | |
| | Before BOE | After BOE | Before BOE | After BOE | Before BOE | After BOE | Before BOE | After BOE |
|---|---|---|---|---|---|---|---|---|
| 4PP Resistance of Sample 1 (ohm) | 285.00<br>35.60<br>28.50<br>203.00<br>24.60 | 298.00<br>51.30<br>38.70<br>58.10<br>49.10 | 30.30<br>23.10<br>13.16<br>24.00<br>28.40 | 28.04<br>8.85<br>31.90<br>26.00<br>14.80 | 9.53<br>9.19<br>9.27<br>9.00<br>10.14 | 9.83<br>8.75<br>9.62<br>9.14<br>10.11 | 8.43<br>8.36<br>8.66<br>8.52<br>7.87 | 8.17<br>7.85<br>8.36<br>8.48<br>8.49 |
| 4PP Resistance of Sample 2 (ohm) | 284.00<br>29.40<br>51.60<br>217.00<br>27.30 | | 30.50<br>9.34<br>25.28<br>10.40<br>14.39 | | 9.89<br>9.66<br>9.35<br>9.05<br>10.20 | | 9.68<br>9.43<br>9.55<br>9.44<br>9.32 | 9.31<br>9.41<br>9.37<br>9.68<br>9.42 |
| Avg. (ohm) | 118.60 | 99.04 | 20.89 | 21.92 | 9.53 | 9.49 | S1: 8.37<br>S2: 9.48 | S1: 8.27<br>S2: 9.43 |
| STDEV | 113.76 | 111.44 | 8.28 | 9.69 | 0.43 | 0.54 | S1: 0.30<br>S2: 0.14 | S1: 0.27<br>S2: 0.14 |

Generally, samples formed from inks comprising smaller silicon particle sizes and prepared with longer furnace times had lower 4PP resistances. TABLE IX shows that, prior to BOE treatment, the samples from set 1 (20 nm average primary particle diameter and 1 hour heating time) had an average 4PP resistance of about 118.60Ω while the samples from set 2 (7 nm average primary particle diameter and 2 hour heating time) had a 4PP resistance of about 20.89Ω. Average 4PP resistances of samples from sets 1 and 2 after BOE treatment were similar to the corresponding average 4PP resistances measured prior to BOE treatment. Similarly, samples formed from thinner dried ink layers and with longer furnaces times also had lower 4PP resistances. TABLE IX shows that, prior to BOE treatment, the samples from set 2 (1 μm average dried ink layer thickness and 1 hour heating time) had an average 4PP resistance of about 20.89Ω while samples from set 3 (0.5 μm average dried ink layer thickness and 2 hour heating time) had an average 4PP resistance of about 9.53Ω. Average 4PP resistance of samples from sets 1 and 2 after BOE treatment were similar to the corresponding average 4PP resistances measured prior to BOE treatment.

With respect to sample set 4, the 4PP resistance of the ink coated wafer was marginally lower than that of the initially bare wafer along the surface contacting the ink coated wafer. With respect to sample set 4, TABLE IX shows that prior to BOE treatment the average 4PP resistances of the ink coated wafer and the initially bare wafer were 8.37Ω and 9.48Ω, respectively. Average 4PP resistances of samples 1 and 2 of set 4 measured after BOE treatment were substantially the same as the corresponding average 4PP resistances measured prior to BOE treatment. Furthermore, comparison of average 4PP resistances of the samples of sets 3 and 4 indicate that although the total average thickness of the dried ink layer between wafers during thermal dopant drive-in was substantially identical (1 μm), the ink coated wafer in sample set 4 had a slightly lower sheet resistance than the ink coated wafers if sample set 3. TABLE IX shows that prior to BOE, the average 4PP resistance of the samples of set 3 was 9.53Ω while the average 4PP resistance of the ink coated wafer of set 4 was about 8.37Ω. Similar results were seen for the average 4PP resistance of the samples of set 3 and the ink coated wafer of set 4 measured after BOE treatment. TABLE IX also shows that prior to and after BOE treatment, the average 4PP resistance of the initially bare wafer of sample 4 was substantially the same as the corresponding 4PP resistances of the samples of set 3.

Example 4

Barrier Layer

This example demonstrates the effectiveness of using a spin-on glass barrier layer to facilitated dopant drive-in. To demonstrate the effects of variations in process and sample parameters during thermal dopant drive-in on ink coated wafers comprising a barrier layer, several samples were prepared. Ink coated wafers with barrier layers were prepared as described in Example 1. Prior to annealing, the dried ink layer of each sample had an average thickness of about 0.5 μm and was formed from ink comprising n++ or p++ doped silicon nanoparticles with an average primary particle diameter of about 7 nm or about 20 nm. The substrate of each sample comprised an n-type or p-type silicon wafer.

To complete formation of the samples, and to facilitate diffusion of dopant from the dried ink layer, the barrier coated ink coated wafers were placed in a furnace and heated under a nitrogen atmosphere at 1050° C. for 1 hour. The samples were then cooled to 150° C. in the furnace prior to removal.

Effect of Barrier Layer

To demonstrate the effect of the barrier layer on thermal dopant drive-in, two samples were prepared. Sample 1 comprised an ink coated wafer with a barrier layer, and sample 2 comprised an ink coated wafer without a barrier layer. Samples 1 and 2 were formed from ink comprising n++ doped silicon nanoparticles with an average primary particle diameter of about 20 nm. The substrate of each sample comprised an n-type silicon wafer. Subsequent to thermal dopant drive-in, the samples were placed into a BOE solution for about 30 min. The 4PP resistance was then measured at a plurality of locations on the surface of each sample.

Figure 47:
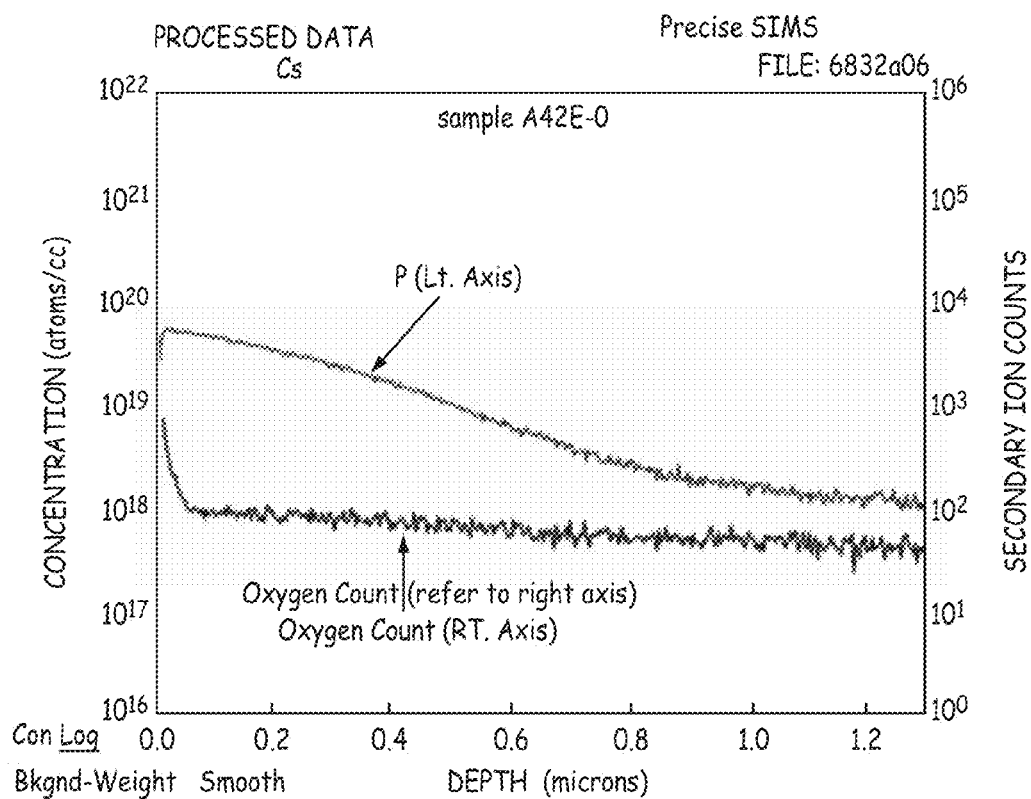
FIG. 47 is a graph containing plots of the dopant profile and oxygen count versus wafer depth, both for a sample processed with 20 nm doped silicon particles and a barrier layer.

The sample comprising a barrier layer had a significantly lower 4PP resistance relative the sample without a barrier layer. The average 4PP resistances of samples 1 (with barrier layer) and 2 (without barrier layer) was about 10.03Ω±1.38Ω and 40.02Ω±2.78Ω, respectively. These results are consistent with dopant evaporation from the annealed ink layer of sample 2 during thermal dopant drive-in. Furthermore, the dopant profile of sample 1 reveals substantial dopant drive-in into the silicon substrate. FIG. 47 is a graph containing plots of the P dopant profile and oxygen count versus sample depth for sample 1. FIG. 47 reveals a P surface concentration of about $6 \times 10^{19}$ atoms/cm$^3$ at the surface of sample 1 and an elevated P concentration, relative to the background P concentration, for a depth of about 0.6 μm. The relatively shallow oxygen profile is due to oxidation of the sample during thermal dopant drive-in.

Sheet Resistance: Single-Sided Diffusion

To demonstrate the effects of variations in process and sample parameters on thermal diffusion from an ink coated wafer with a barrier layer, 3 samples were prepared as described above in this example. The samples were formed from inks comprising n++ doped silicon nanoparticles with an average primary particle diameter of about 7 nm (sample 1) or 20 nm (samples 2 and 3). The substrate of each sample comprised an n-type silicon wafer. The barrier layers had an average thickness of about 0.1 μm (sample 1) and 0.2 μm (samples 2 and 3). Subsequent to thermal dopant drive-in, the samples were placed into a BOE solution for about 1 hour. The 4PP resistance was then measured at a plurality of locations on the surface of each sample.

Generally, samples formed from inks comprising smaller silicon nanoparticles had smaller average 4PP resistances. The average 4PP resistances of samples 1 (7 nm average primary particle diameter) and 2 (20 nm average primary particle diameter) were about 3.44Ω±1.33Ω and 6.73Ω±0.28Ω, respectively. The observed difference in the average 4PP resistances may be due to the fact that the furnace treated annealed ink layers of the samples prepared from inks comprising smaller silicon nanoparticles were more uniform relative to samples prepared from inks comprising larger silicon nanoparticles, as evidenced from SEM images (not shown). Furthermore, the average 4PP resistance of sample 3 (20 nm average primary particle diameter) was about 8.67Ω±0.24Ω. Although samples 2 and 3 were substantially identical, the small variation in the observed average 4PP resistance between the two samples may have been due to variations in sample processing.

Furthermore, comparison of these results with TABLE VI reveals that an opposite trend was observed in comparison with results obtained when wafers were heated in a stacked configuration. In particular, comparison of the sheet resistances of samples 2B and 3B in TABLE VI reveals that when heated in a stacked configuration, the sheet resistance of sample 2B (7 nm average primary particle diameter) had a larger sheet resistance that sample 3B (20 nm average primary particle diameter).

Sheet Resistances: Double-Sided Diffusion

To demonstrate the effects of variations in process and sample parameters on thermal diffusion from a double-sided ink coated wafer with corresponding barrier layers, 4 substantially identical samples were prepared. Each sample comprised a first layer on a front surface of a substrate and a first barrier layer on the first annealed ink layer. Each sample further comprised a second annealed ink layer on a back surface of the substrate and a second barrier layer on the second annealed ink layer. As describe in Example 1, the annealed ink layers were formed from inks comprising n++ (first annealed ink layer) and p++ (second annealed ink layer) doped silicon nanoparticles with an average primary particle diameter of about 7 nm and the substrate comprised a lightly doped p-type silicon wafer.

To form each double-sided ink coated wafer, an annealed ink layer was formed on the front surface and back surface of a substrate. A first ink layer was formed by spin-coating a first ink onto the front surface of a substrate, as described in Example 1. The substrate with the first ink layer was then heated on a hotplate at 85° C. to dry the first ink layer. A second link layer was formed by spin-coating a second ink onto the back surface of the substrate with first dried ink layer, as describe in Example 1. The substrate with the second ink layer was then heated on a hotplate at 85° C. to dry the second ink layer. The dried ink layer had an average thickness of about 0.5 μm, measured as described about in Example 1. The substrate with the dried ink layers on the front surface and the back surface was then placed in a furnace and heated at 600° C. for 30 min. under a nitrogen atmosphere to anneal the dried ink layers.

To form a double-sided ink coated wafer with barrier layers, a barrier oxide was formed on the front surface and back surface of a double-sided ink coated wafer. A barrier layer was formed by spin-coating a barrier oxide onto the front surface of a double-sided ink coated wafer, as described in Example 1. The deposited barrier layer was then dried by heating the double-sided ink coated wafer with the deposited barrier layer on a hotplate at 90° C. for 5 min. The dried barrier layer was subsequently cured by heating the double-sided ink coated wafer with the dried barrier layer in a furnace at 450° C. for 30 minutes under a nitrogen atmosphere. The process of depositing a barrier layer, drying the deposited barrier layer, and curing the dried barrier layer was then repeated on the back surface of the double-sided ink coated wafer. After curing the dried barrier layer on the back surface of the double-sided ink coated wafer, the temperature in the furnace was ramped up to 1050° C. and the double-sided ink coated wafer with the cured barrier layers was further heated at 1050° C. for 1 hour to facilitate thermal dopant drive-in. The average thickness of the barrier layer was about 0.2 μm, measured as described in Example 1, above. After thermal dopant drive-in, each sample was placed in a BOE solution for 2.5 hr. and the 4PP resistance of each sample was measured as a plurality of location on the front surface and on the back surface of each sample. Measured 4PP resistances for each sample are displayed in TABLE X.

TABLE X

| Sample No. | | | | | | | |
|---|---|---|---|---|---|---|---|
| 1 | | 2 | | 3 | | 4 | |
| Front | Back | Front | Back | Front | Back | Front | Back |
| 1.72 | 9.83 | 1.22 | 6.26 | 1.67 | Open | 1.25 | 14.50 |
| 1.24 | 8.75 | 1.23 | 6.38 | 2.00 | Open | 1.53 | 13.63 |
| 1.05 | 9.62 | 1.03 | 6.74 | 1.78 | Open | 1.35 | 13.10 |
| 1.25 | 9.14 | 1.30 | 7.07 | 2.01 | Open | 1.50 | 12.91 |
| 1.45 | 10.11 | 1.05 | 6.95 | 1.85 | Open | 1.36 | 12.55 |
| 1.34 | 9.49 | 1.17 | 6.68 | 1.86 | | 1.40 | 13.34 |
| 0.25 | 0.54 | 0.12 | 0.35 | 0.15 | | 0.12 | 0.76 |

Generally, front surface of each sample had a lower 4PP resistance than the back surface of each sample. As shown in TABLE X, the front surface (processed with an annealed ink layer formed from an ink comprising n++ doped silicon nanoparticles) of samples 1-4 had an average 4PP resistance of 1.34Ω, 1.17Ω, 1.8Ω, and 1.40Ω, respectively. On the other hand, back surface (processed with an annealed ink layer formed from an ink comprising p++ doped silicon nanoparticles) of samples 1, 2, and 4 had an average 4PP resistance of 9.49Ω, 6.68Ω, and 13.34Ω, significantly higher than the average 4PP resistance of the corresponding front surfaces. 4PP resistances for the back surface of sample 3 are listed as "open" in TABLE X, indicating that resistances were too high to measure. The "open" resistances measured on the back surface of sample 3 may have been due to contamination during sample processing.

Figure 48:
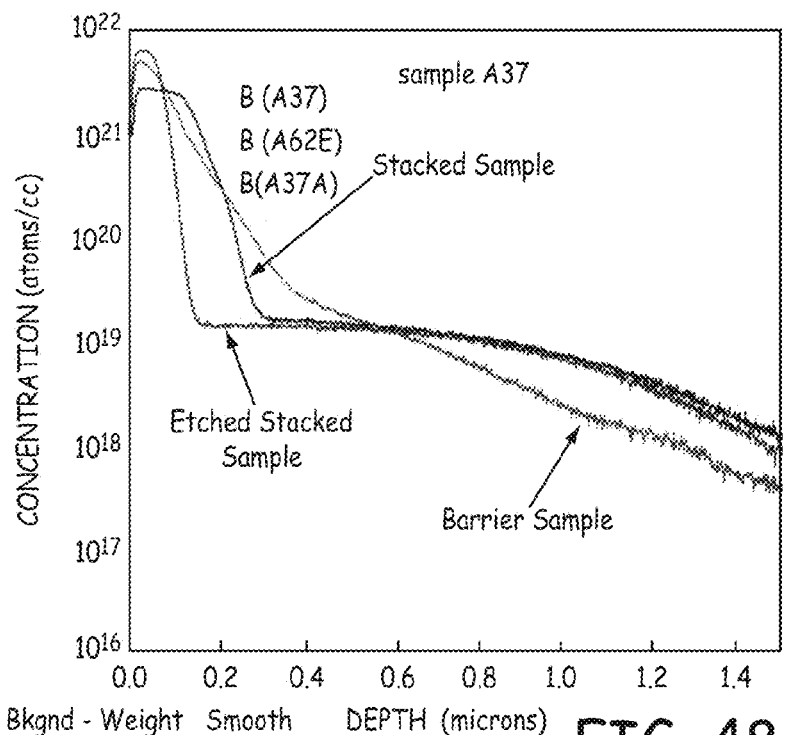
FIG. 48 is a graph containing plots of the dopant profiles for a silicon wafer sample processed with a barrier layer and for a sample processed in a stacked configuration.

Relative to samples furnace treated in a stacked sample configuration, samples furnace treated with barrier layers had qualitatively different dopant profiles. FIG. 48 is a graph of dopant profiles, obtained by SIMS, for a sample that was furnace treated with a barrier layer and for a sample that was furnace treated in a stacked configuration as described in Example 3 above. Dopant profiles were obtained by SIMS. In particular, FIG. 48 shows the dopant profile for sample 2 of the double coated samples taken after BOE treatment. FIG. 48 also shows the dopant profiles for a sample from set 3 of Example 3, displayed in TABLE IX, taken prior to ("stacked sample") and subsequent to ("etched stacked sample") BOE treatment. FIG. 48 reveals that the barrier sample had a B surface concentration of about $1.5 \times 10^{21}$ atoms/cm$^3$ while the staked and etched stacked samples had a surface concentration of about $3 \times 10^{21}$ and $7 \times 10^{21}$, respectively. Furthermore, although the barrier and stacked samples had dopant drive-in depths to greater than 1 μm from the sample surface (e.g. relative to the background dopant concentration of the substrate), the dopant profiles for the barrier and stacked samples were qualitatively different. For example, FIG. 48 reveals that over about the first 0.07 μm, the barrier sample had a B concentration less than that of the stacked sample but greater than that of the etched stacked sample. Furthermore, from about 0.07 μm to about 0.6 μm, the barrier sample had a greater B concentration relative to the stacked sample, and a smaller B concentration relative to the stacked sample thereafter, as seen in FIG. 48.

Surface Characterization

To demonstrate the effects of variations in process and sample parameters on thermal diffusion from an ink coated wafer with a barrier layer, three samples were prepared as described above in this example. The samples were formed from ink comprising n++ doped silicon nanoparticles. The barrier layers had an average thickness of about 0.1 μm or about 0.2 μm. Subsequent to thermal dopant drive-in, SEM images of each sample were obtained. The samples were then briefly dipped in a BOE solution for about 30 seconds to about 60 seconds to remove the barrier layer, and, following, further SEM images of each sample were obtained. Three samples were then returned to the BOE solution for 0.5 hours, 1 hour, or 2.5 hours and, following, SEM images of each sample were again obtained. Sample and process parameters for each sample are listed in TABLE XI.

TABLE XI

| Sample No. | Average Primary Particle diameter in Ink (nm) | Average Barrier Layer Thickness (μm) | Substrate Type | BOE Treatment Time (Hours) | Average 4PP Resistance (Ω) |
|---|---|---|---|---|---|
| 1 | 7 | 0.1 | n-type | 1 | 3.44 |
| 2 | 20 | 0.1 | n-type | 1 | 10.03 |
| 3 | 7 | 0.2 | p-type | 2.5 | 1.17 |

Figure 49A:
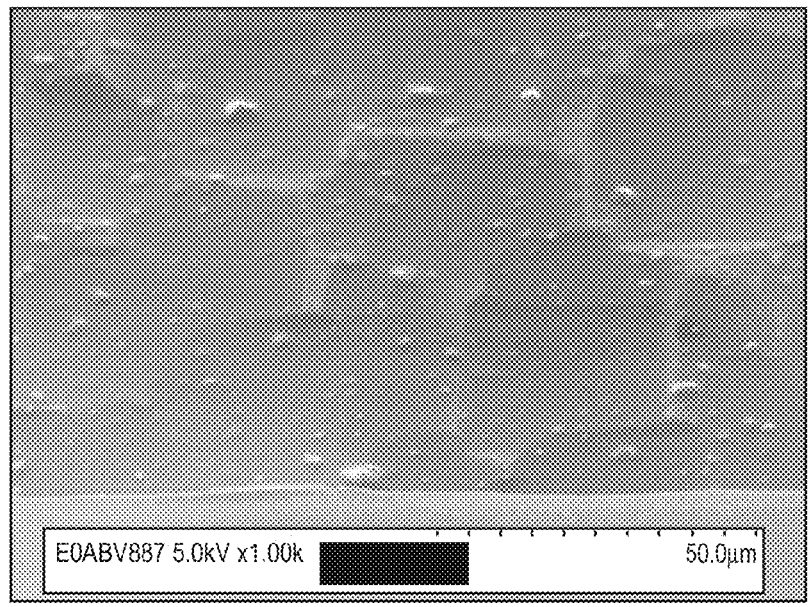
FIG. 49A is a SEM image of the surface of a silicon wafer sample processed with 7 nm doped silicon particles capped with a barrier layer.
Figure 49B:
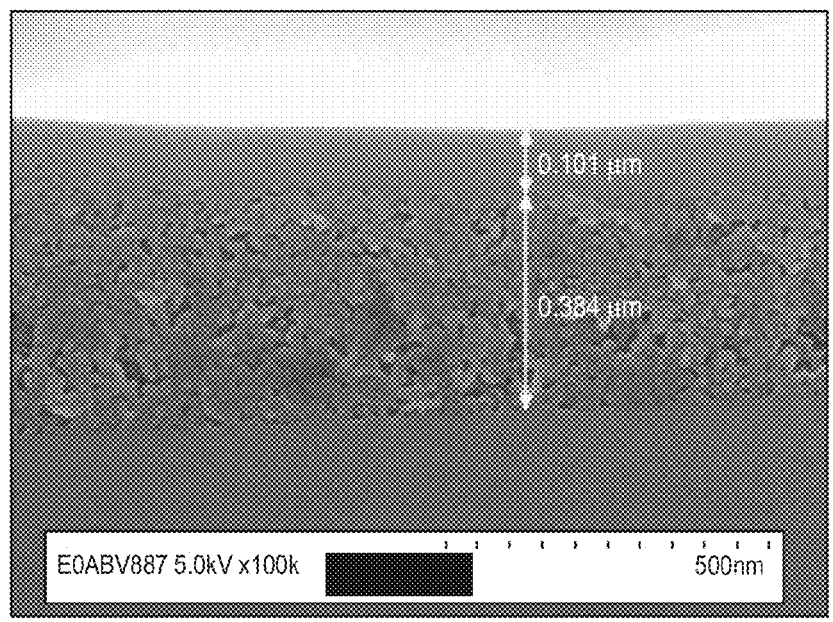
FIG. 49B is a SEM image of a cross-section of a silicon wafer sample processed with 7 nm doped silicon particles capped with a barrier layer.
Figure 50A:
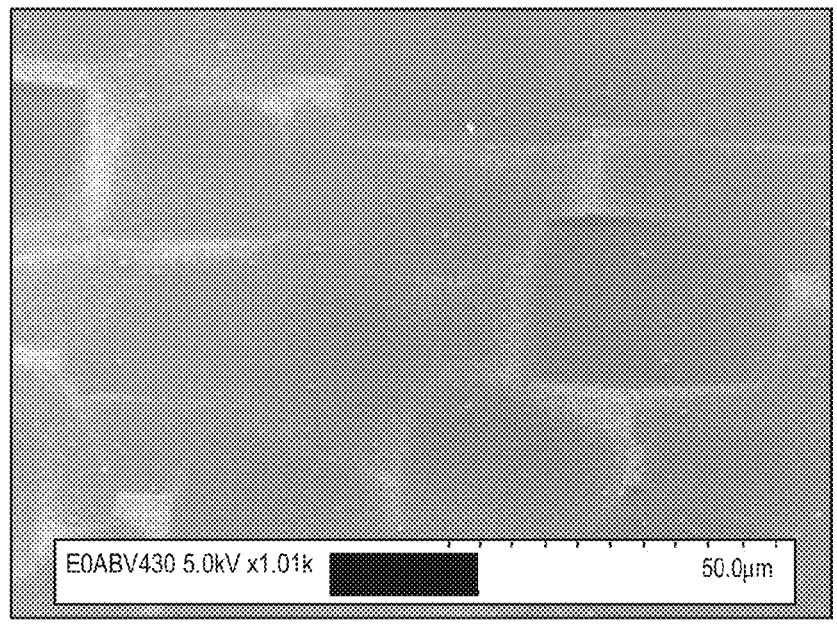
FIG. 50A is a SEM image of the surface of a silicon wafer sample processed with 20 nm doped silicon particles capped with a barrier layer.
Figure 50B:
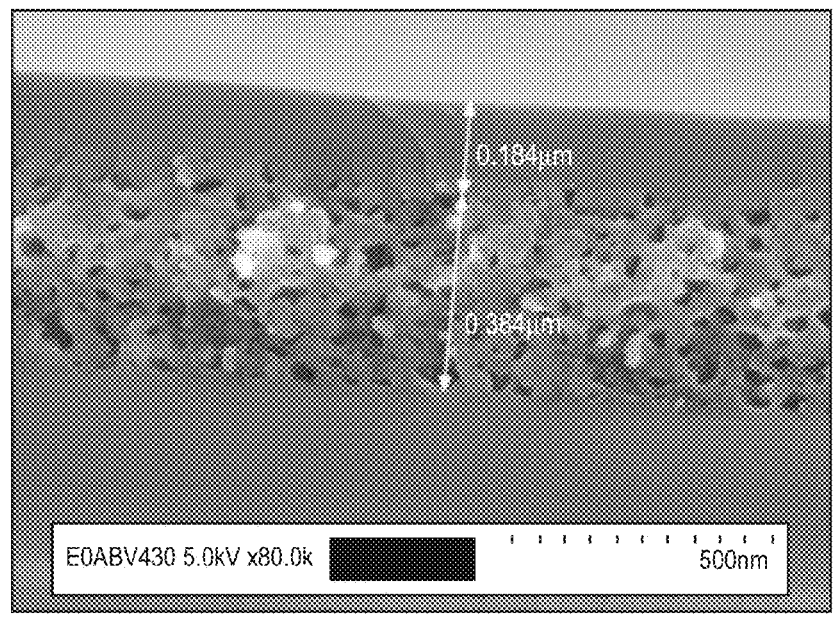
FIG. 50B is a SEM image of a cross-section of a silicon wafer sample processed with 20 nm doped silicon particles capped with a barrier layer.
Figure 51:
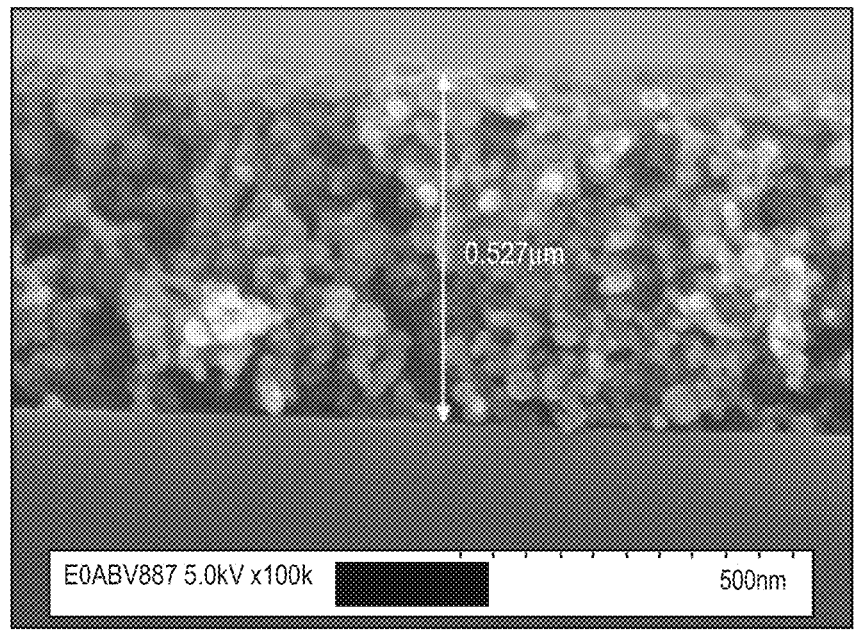
FIG. 51 is a SEM image of a cross-section of a silicon wafer sample processed with 20 nm doped silicon particles capped with a barrier layer, in which the SEM image was taken after BOE treatment.

Furnace treated samples prepared from inks comprising smaller silicon nanoparticles had more uniform barrier layers and more dense annealed ink layers. FIGS. 49A and 49B are SEM images of sample 1 (7 nm average primary particle diameter) as furnace treated. FIGS. 49A and 49B are SEM images of the top surface and of a cross-section, respectively, of sample 1. FIGS. 50A and 50B are analogous to FIGS. 49A and 49B, respectively, but are SEM images of sample 2 (20 nm average primary particle diameter). Comparison of FIGS. 49A and 50A reveals that the barrier layer of sample 1 was more uniform than the barrier layer of sample 2 after thermal dopant drive-in. FIGS. 49B and 50B reveals that the particulate silicon layers of samples 1 and 2 comprise a silicon nanoparticle/oxide composite due to infiltration of spin-on glass from the barrier layer. FIG. 51 is an SEM image of a cross section of sample 2 taken after the BOE dip and reveals the underlying nanoparticle structure present in FIG. 50B. Comparison of FIGS. 49B and 50B also reveals that the particulate silicon layer after heat treatment of sample 1 is more dense than the corresponding particulate silicon layer of sample 2, which suggests that the silicon nanoparticles with the smaller diameter densify more during the heat treatment with the barrier layer relative to the particles with a larger primary particle diameter.

Figure 52:
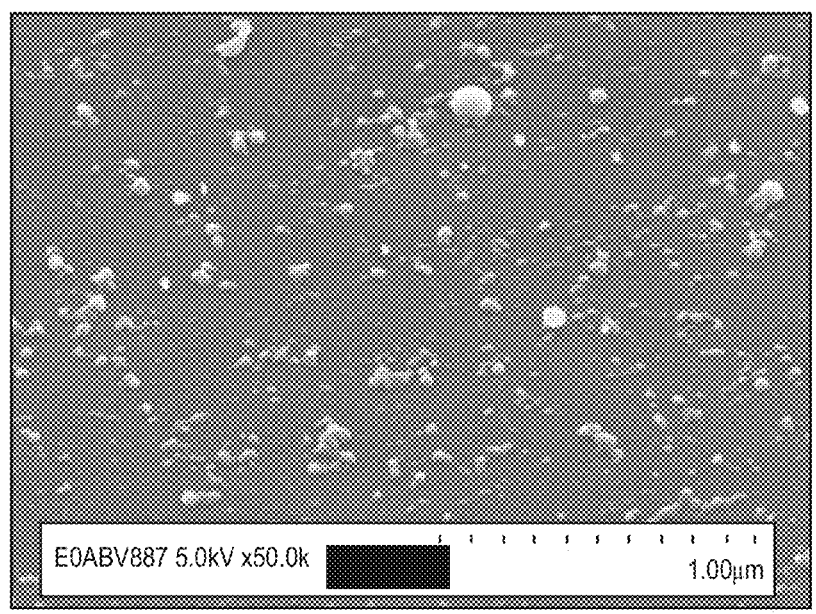
FIG. 52 is a SEM image of the surface of a silicon wafer sample processed with 7 nm particles capped with a barrier layer, in which the SEM image was taken after BOE treatment for 0.5 hours.
Figure 53:
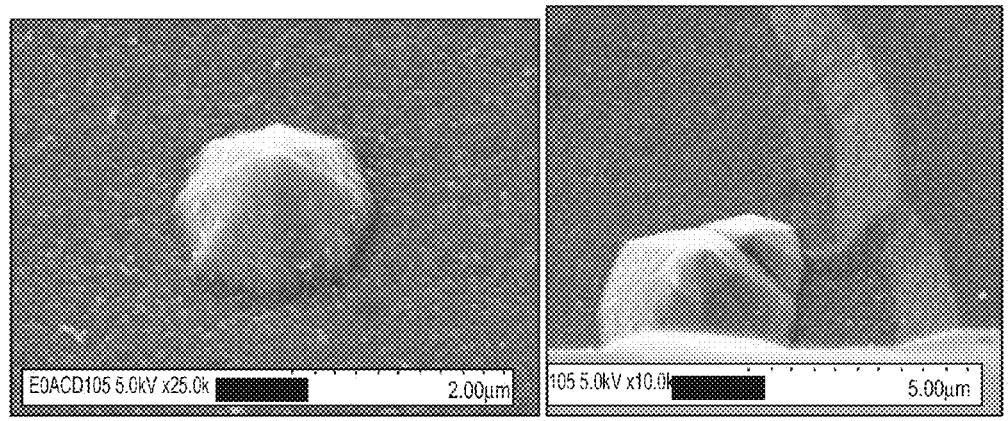
FIG. 53 is a composite of SEM images of the surface of a silicon wafer sample with 7 nm doped silicon particles capped with a barrier layer, in which the image was taken after BOE treatment. The left and right panels were obtained under different magnifications.

Subsequent to BOE treatment, the samples comprised clusters of particles atop a nanostructured surface. FIG. 52 is an SEM image of the surface of sample 2 after BOE treatment. FIG. 52 shows coalesced silicon particles atop a nanostructured surface. FIG. 53 is a composite of SEM images of the surface of sample 3 after BOE treatment for 2.5 hours. The left panel shows a first section of the surface at a first magnification and the right panel shows a second section of the surface at a second magnification. The left panel of FIG. 53 shows a complete layer of coalesced silicon particles atop a nanostructured surface. The right panel of FIG. 53 shows uniform coverage of coalesced silicon particles on a section of sample 3 with a relatively uneven surface. Furthermore, both panels of FIG. 53 show a relatively large deposit of recrystallized silicon from coalesced particles along the surface.

Figure 54:
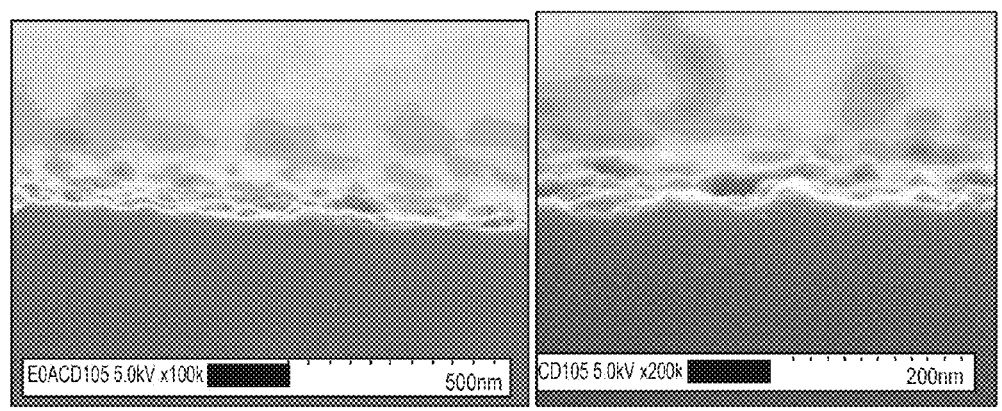
FIG. 54 is a composite of SEM images of a cross-section of a silicon wafer sample processed with 7 nm doped silicon particles capped with a barrier layer, in which the left and right panels were obtained under different magnification.
Figure 55:
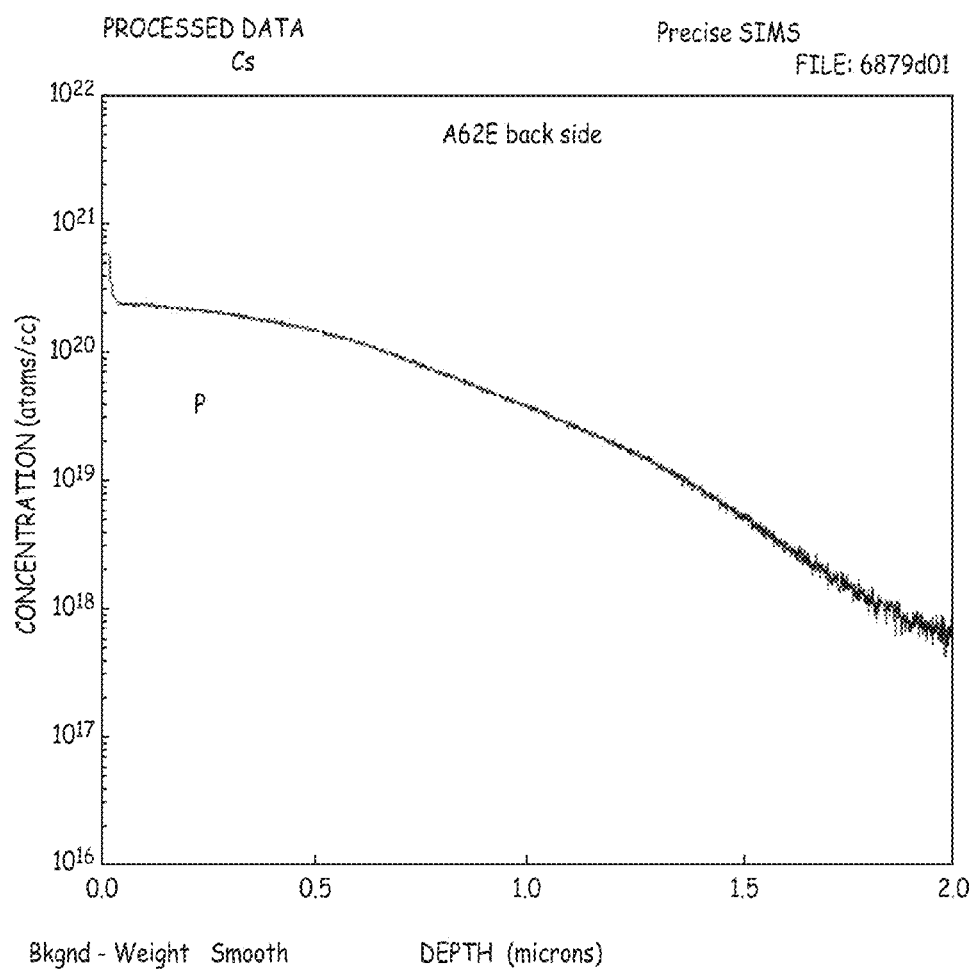
FIG. 55 is a plot of the dopant profile of a silicon wafer sample processed with 7 nm doped silicon particles capped with a barrier layer.
Figure 56:
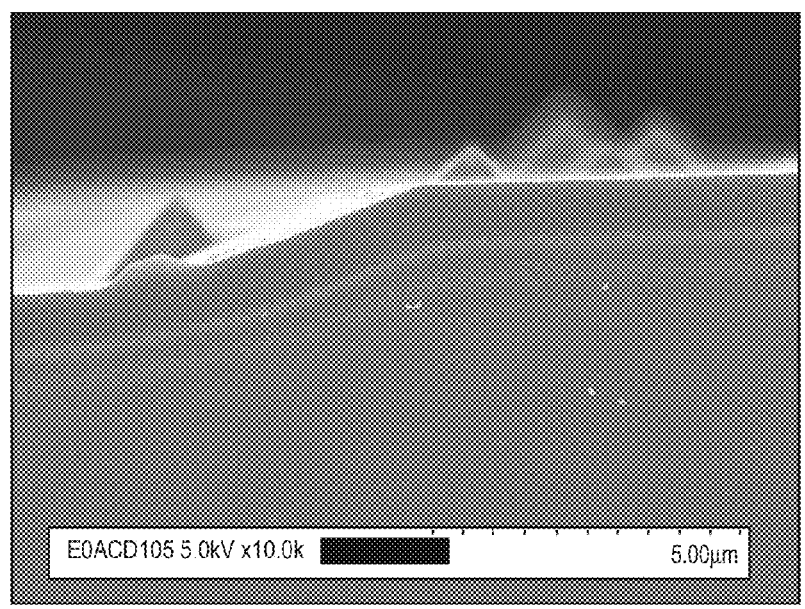
FIG. 56 is an SEM image of a cross-section of the silicon wafer sample processed with 7 nm doped silicon particles capped with a barrier layer and subjected to stain-etching.

The nanostructured surface comprised deposits of coalesced silicon nanoparticles along the substrate surface. FIG. 54 is a composite of SEM images of cross-sections of sample 3 taken after BOE treatment. The image displayed in the left panel was taken at a lower magnification than the image displayed in the right panel. FIG. 54 confirms a nanostructured surface consistent with recrystallized coalesced silicon layer but does not show a visible boundary between the coalesced silicon layer from the silicon nanoparticle and the substrate. FIG. 55, however, is a dopant profile of sample 3 obtained with SIMS and is consistent with the presence of a layer of coalesced silicon particles, and a preliminary analysis suggests that the layer of coalesced silicon particles is not epitaxial with respect to the substrate crystal structure. In particular, FIG. 55 reveals a surface layer comprising a layer from coalesced silicon nanoparticles with a thickness of about 15 nm and a P concentration of about $5.8 \times 10^{20}$ atoms/cm$^3$. Furthermore, FIG. 55 also reveals an under layer, disposed between the substrate and the surface layer, with a thickness of about 100 nm and a P concentration of about of about $2.6 \times 10^{20}$ atoms/cm$^3$. While the underlayer may comprise a composite of coalesced silicon nanoparticles and silicon substrate material, the exact composition is not known. Moreover, FIG. 55 also reveals dopant depth from the drive-in of about 2 µm from the surface of sample 3. FIG. 56 is an SEM image of a cross-section of sample 3 taken after BOE treatment and stain etching. FIG. 56 reveals a surface layer consistent with coalesced silicon nanoparticles and confirms dopant depth from the drive-in of about 2 µm from the surface of the sample.

The specific embodiments above are intended to be illustrative and not limiting. Additional embodiments are within the broad concepts described herein. In addition, although the present invention has been described with reference to particular embodiments, those skilled in the art will recognize that changes can be made in form and detail without departing from the spirit and scope of the invention. Any incorporation by reference of documents above is limited such that no subject matter is incorporated that is contrary to the explicit disclosure herein.

What is claimed is:

1. A method for doping a silicon substrate, the method comprising:
   depositing a dopant ink comprising doped silicon-based nanoparticles onto the silicon substrate to form a doped deposit, wherein the doped silicon based nanoparticles comprise doped silicon nanoparticles and/or doped silica nanoparticles;
   depositing a non-doped inorganic capping layer over the doped deposit on the silicon substrate; and
   heating the silicon substrate having the doped deposit with the capping layer to drive dopant atoms into the silicon substrate, the heating forming a structure having the capping layer disposed over the doped deposit, wherein the doped deposit having a capping layer on the silicon substrate has a sheet resistance of no more than about 60 ohms per square after the heating.

2. The method of claim 1 wherein the ink is deposited by ink jet printing.

3. The method of claim 1 wherein the ink is deposited by screen printing.

4. The method of claim 1 wherein the depositing of the inorganic capping layer comprises depositing a spin-on glass and heating the spin-on glass sufficiently to cure the spin-on glass.

5. The method of claim 1 wherein the depositing of the inorganic capping layer comprises the deposition of a sol-gel precursor composition.

6. The method of claim 1 wherein a plurality of doped deposits are patterned over the silicon substrate and wherein the inorganic capping layer is patterned to cover the doped deposits without forming a continuous layer over the silicon substrate.

7. The method of claim 1 wherein the heating to drive-in dopant atoms into the silicon substrate is performed at a temperature from about 650° C. to about 1300° C.

8. The method of claim 1 wherein the doped deposit covers only a portion of the substrate.

9. The method of claim 1 wherein the capping layer has a thickness of from 100 nanometers to about 50 microns.

10. The method of claim 1 wherein, after the heating, the dopant concentration is from about $2 \times 10^{19}$ atoms per cubic centimeter to about $5 \times 10^{21}$ atoms per cubic centimeter at a depth of about 100 nanometers from the substrate surface at a location beneath the doped deposit.

11. The method of claim 1 wherein the capping layer covers the entire surface of substrate.

12. The method of claim 1 further comprising performing a preliminary heating prior to depositing the capping layer to remove organic compositions from the deposited dopant ink.

13. The method of claim 1 wherein the doped silicon-based nanoparticles comprise doped silicon nanoparticles, wherein the heating sinters the doped silicon nanoparticles and further comprising forming a current collector in contact with the sintered doped nanoparticles.

14. The method of claim 1 comprising using rapid thermal processing comprising directing radiation from a heat lamp to the deposit of doped silicon based nanoparticles to sinter the doped silicon-based nanoparticles.

15. A method for doping a silicon substrate, the method comprising:
   heating a silicon substrate having a capped deposit of phosphorous-doped silicon nanoparticles to drive phosphorous dopant into the silicon substrate to an average depth of at least about 0.4 microns at a dopant concentration of at least about a factor of 100 over baseline bulk concentration, wherein the capping layer is undoped; and
   forming a doped contact with a sheet resistance of no more than about 15 ohms/sq.

16. The method of claim 15 wherein the capped deposit comprises an inorganic structure placed on top of the silicon nanoparticles.

17. The method of claim 15 wherein the capped deposit comprises a cover that effectively caps the silicon nanoparticles.

18. The method of claim 15 wherein the capped deposit comprises an inorganic capping layer placed over the silicon nanoparticles.

19. The method of claim 15 wherein the heating is performed in a substantially oxygen free atmosphere.

20. The method of claim 15 comprising using rapid thermal processing comprising directing radiation from a heat lamp to the deposit of doped silicon based nanoparticles to sinter the doped silicon-based nanoparticles.

* * * * *